US005497500A

United States Patent [19]

Rogers et al.

[11] Patent Number: 5,497,500
[45] Date of Patent: Mar. 5, 1996

[54] METHOD AND APPARATUS FOR MORE EFFICIENT FUNCTION SYNCHRONIZATION IN A DATA FLOW PROGRAM

[75] Inventors: Steven W. Rogers; Jeffrey L. Kodosky; Dean A. Luick, all of Travis County, Tex.

[73] Assignee: National Instruments Corporation, Austin, Tex.

[21] Appl. No.: 471,247

[22] Filed: Jun. 6, 1995

Related U.S. Application Data

[63] Continuation of Ser. No. 125,642, Sep. 22, 1993, which is a continuation-in-part of Ser. No. 979,416, Nov. 19, 1992, Pat. No. 5,291,587, which is a continuation of Ser. No. 376,257, Jul. 6, 1989, abandoned, which is a continuation of Ser. No. 851,569, Apr. 14, 1986, Pat. No. 4,901,221.

[51] Int. Cl.$^6$ ............................. G06F 9/06; G06F 9/40
[52] U.S. Cl. ............... 395/800; 395/650; 364/DIG. 1; 364/286; 364/286.3; 364/281.3
[58] Field of Search ................... 395/800, 650, 395/155, 159, 163, 161, 153

[56] References Cited

U.S. PATENT DOCUMENTS

| | | | |
|---|---|---|---|
| 4,849,880 | 7/1989 | Bhaskar et al. | 395/161 |
| 5,088,033 | 2/1992 | Binkley et al. | 395/500 |
| 5,168,441 | 12/1992 | Onarheim et al. | 364/146 |
| 5,193,186 | 3/1993 | Tamaki et al. | 395/650 |
| 5,291,599 | 3/1994 | Cohen et al. | 395/700 |
| 5,377,318 | 12/1994 | Wolber | 395/159 |

OTHER PUBLICATIONS

Bruce F. Webster, "The Next Book", Addison–Wesley Publishing Co. Inc., Jul. 1989, pp. 118–138.
Jeffrey Freedman et al, "The Three–Dimensional Event–Driven Graphics Environment", NTC-92 National Telesystems Conference IEEE N.Y. N.Y. (Cat. No. 92 CH3120-3), 19–20 May 1992.
Maddox, M., "Instrument Interfacing in the Client–Server World", IEE, London, UK, Conferance Paper, (Digest No. 011) pp. 611–625 Feb. 21, 1993.

Primary Examiner—Mehmet Geckil
Attorney, Agent, or Firm—Jeffrey C. Hood

[57] ABSTRACT

An occurrence capability which allows a first function to "go to sleep" while waiting for a second function to produce a result. In this manner, the first function does not consume any CPU time while waiting for the second function. Three icons are provided with associated control software which implement the occurrence function. A Wait on Occurrence function icon is associated with the first function that is waiting on the result from the second function. A Set Occurrence function icon is typically associated with the second function icon and triggers an occurrence when the second function produces the desired result. A Generate Occurrence function icon is used to pass identifier values linking multiple sources and destinations having Set Occurrence and Wait on Occurrence function icons, respectively.

13 Claims, 75 Drawing Sheets

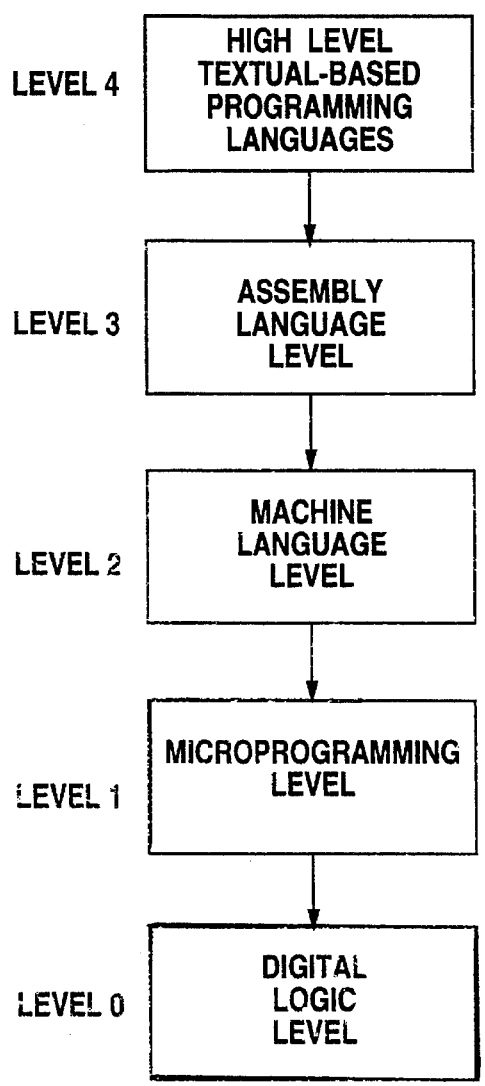
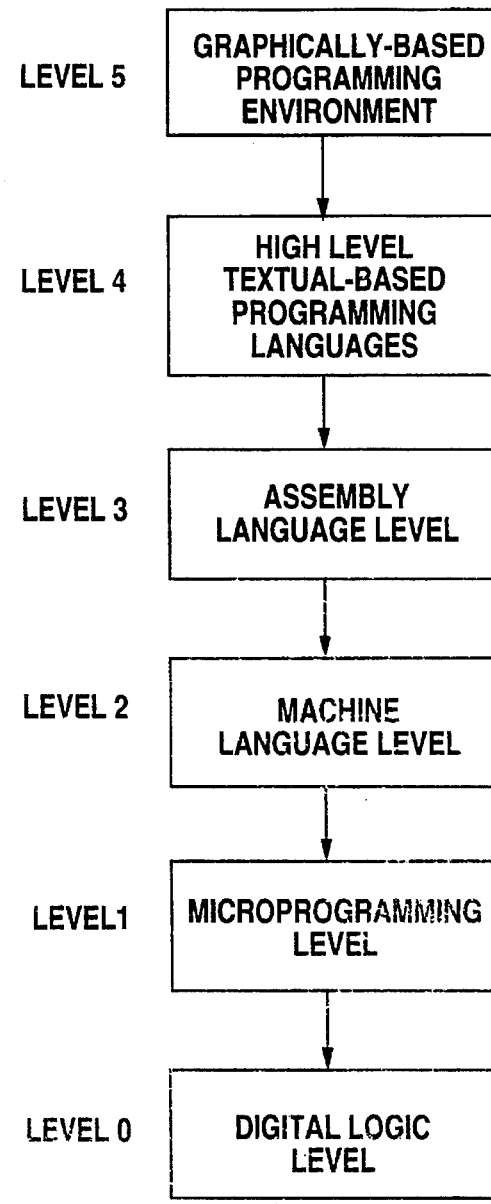
Fig. 1
Fig. 1A

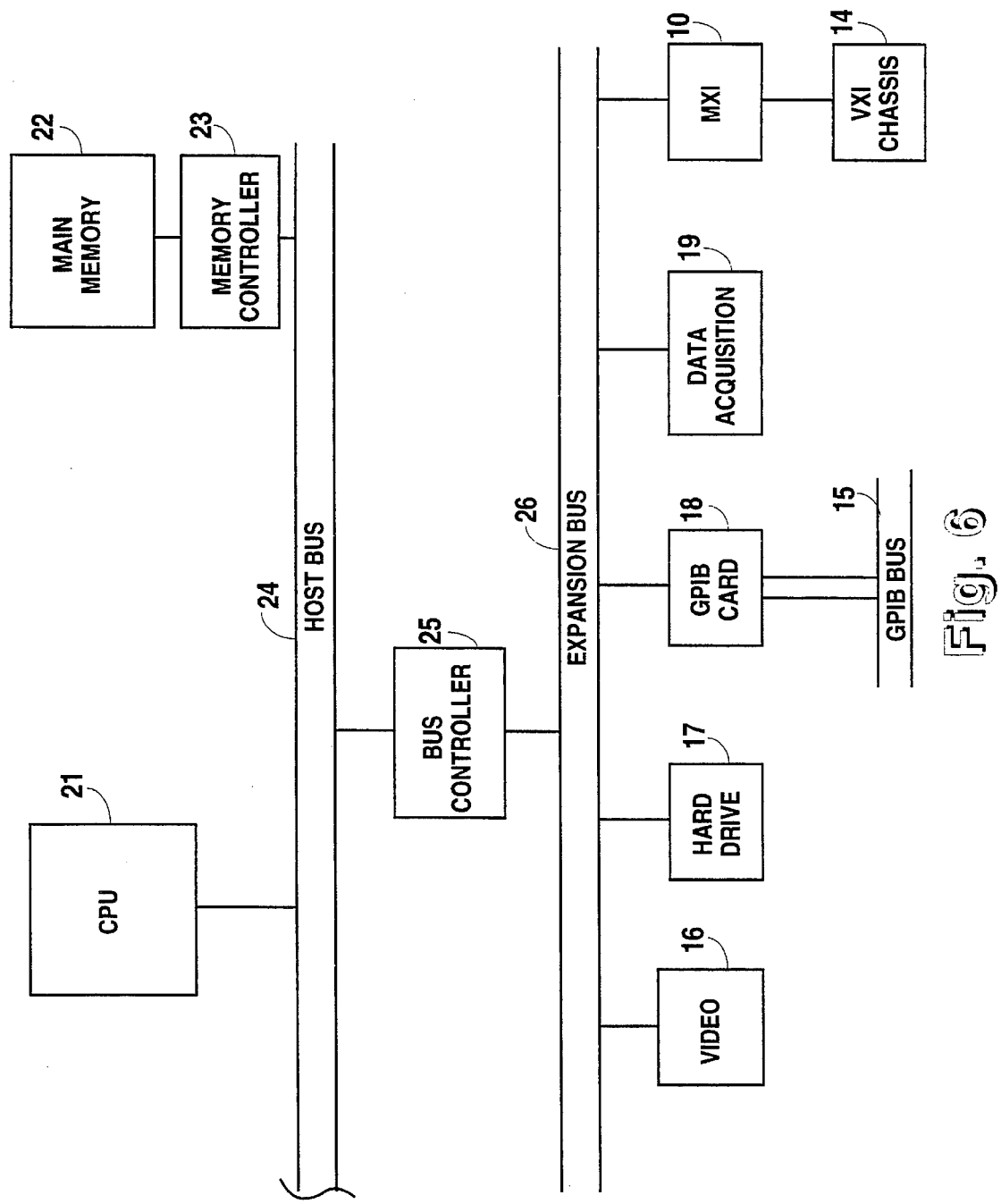

LEGEND:

SYSTEM OBJECT ▢

SYSTEM CLASS ▨

ONE-TO-MANY ──────▶
(SOURCE CONTAINS ZERO OR MORE DESTINATION OBJECTS)

ONE-TO-ONE ─ ─ ─ ─ ─▶
(SOURCE REFERENCES ZERO OR ONE DESTINATION OBJECTS)

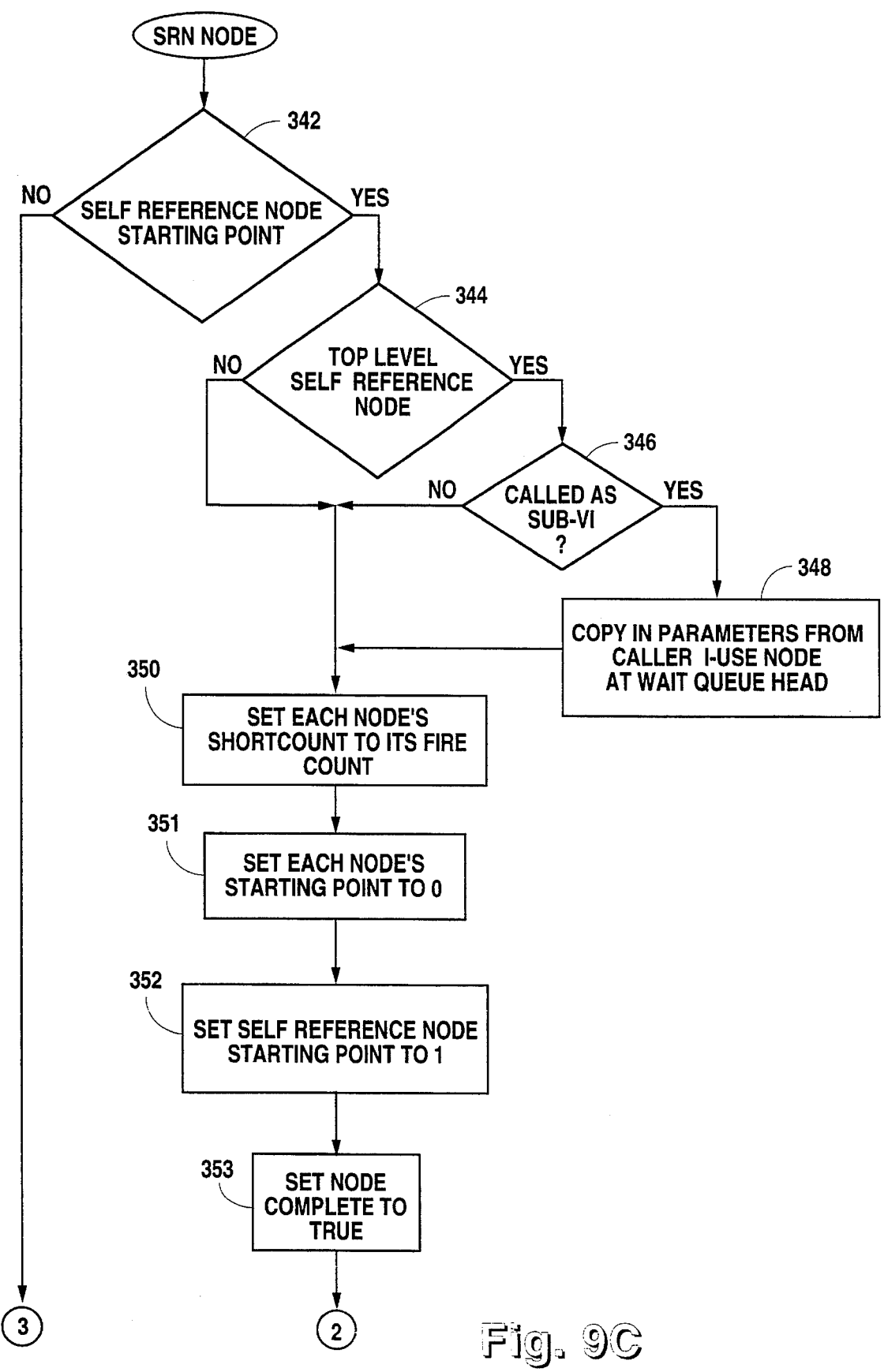

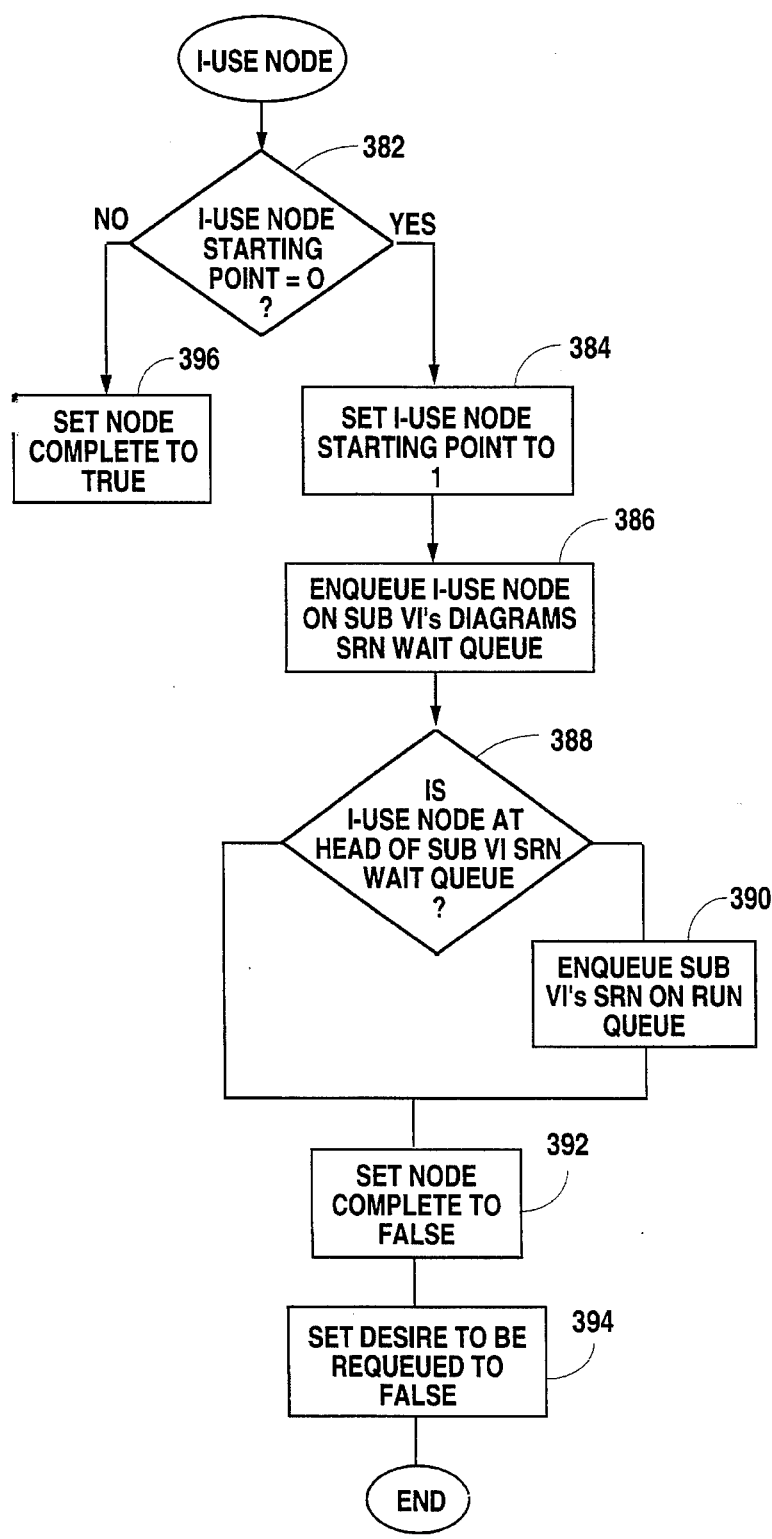

type descriptors struct { int, string, char, float }

| 22 | 50 | 4 | 4 | 3 | 4 | 30 | 4 | 1 | 4 | 10 |
|----|----|---|---|---|---|----|----|----|----|----|
| size | cluster code | # of elements | size of first element | code for first element | | | | | | |

Fig. 18

VI virtual instrument data structure
DIAG diagram data structure
SRN self reference node data structure
T terminal data structure
I USE instrument usage node data structure

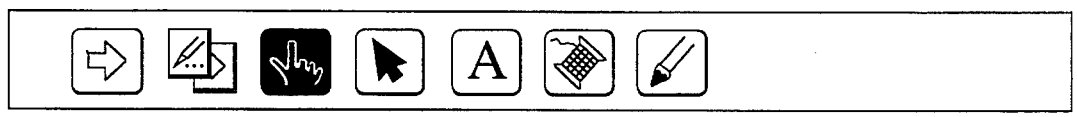
Fig. 57
Fig. 58A
Fig. 58B
Fig. 59A
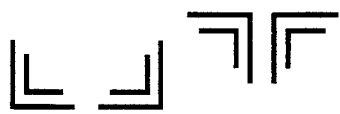
Fig. 59B
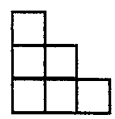 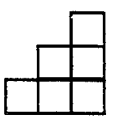 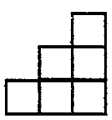 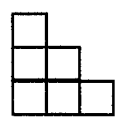
Fig. 59C
Fig. 60A
Fig. 60B
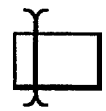
Fig. 60C
Fig. 61
Fig. 62A
Fig. 62B

| FILE | EDIT | OPERATE | CONTROLS | WINDOWS | TEXT |

Fig. 63

| FILE |
|---|
| NEW |
| OPEN... |
| CLOSE |
| SAVE |
| SAVE AS... |
| SAVE A COPY AS... |
| SAVE WITH OPTIONS... |
| REVERT... |
| PAGE SETUP... |
| PAGE LAYOUT... |
| PRINT PREVIEW... |
| PRINT... |
| DATA LOGGING ▶ |
| GET INFO... |
| EDIT VI LIBRARY... |
| MASS COMPLILE... |
| IMPORT PICTURE... |
| BUILD APPLICATION... |
| QUIT OR EXIT |

Fig. 64

| EDIT |
|---|
| UNDO |
| CUT |
| COPY |
| PASTE |
| CLEAR |
| REMOVE BAD WIRES |
| PANEL ORDER... |
| EDIT CONTROL... |
| ALIGNMENT |
| ALIGN |
| DISTRIBUTION |
| DISTRIBUTE |
| MOVE FORWARD |
| MOVE BACKWORD |
| MOVE TO FRONT |
| MOVE TO BACK |
| PREFERENCES... |

Fig. 65

| OPERATE |
|---|
| RUN |
| STOP |
| CHANGE TO RUN MODE |
| MAKE CURRENT VALUES DEFAULT |
| REINITIALIZE ALL TO DEFAULT |

Fig. 66

| CONTROLS | |
|---|---|
| NUMERIC | ▶ |
| BOOLEAN | ▶ |
| STRING | ▶ |
| ARRAY & CLUSTER | ▶ |
| GRAPH | ▶ |
| PATH & REFNUM | ▶ |
| DECORATIONS | ▶ |
| CONTROL... | |
| PICTURE | ▶ |

Fig. 67

| | SCALAR | 1 D ARRAY | 2 D ARRAY | COLOR |
|---|---|---|---|---|
| NUMBER | ——— | ═══ | ══════ | ORANGE (floating point), BLUE (integer) |
| BOOLEAN | ------- | ------- | ::::::::: | GREEN |
| STRING | ∿∿∿ | ∿∿∿ | ≈≈≈ | PURPLE |
Fig. 76
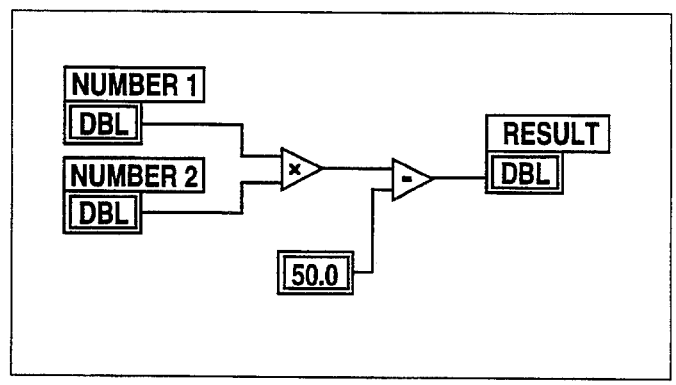
Fig. 77
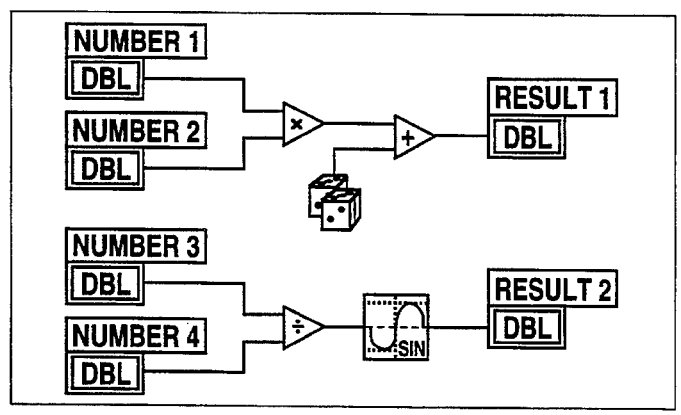
Fig. 78

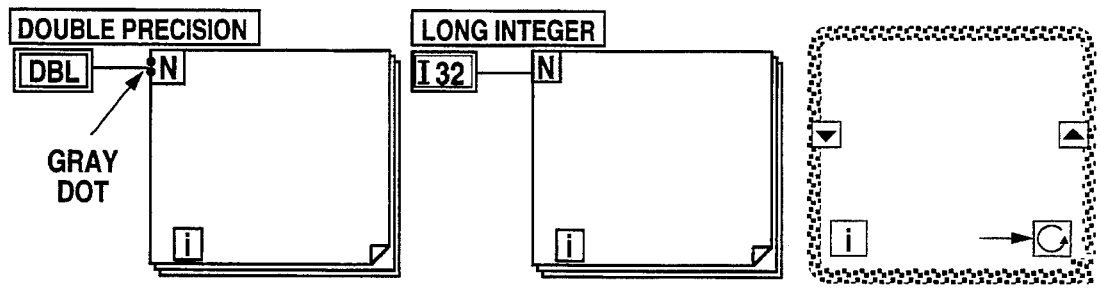
Fig. 96A    Fig. 96B    Fig. 97
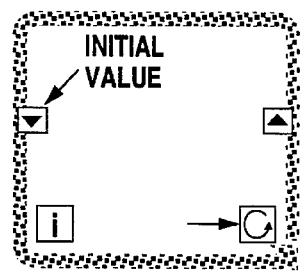    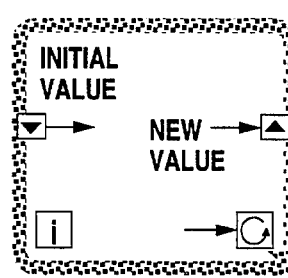
Fig. 98A    Fig. 98B
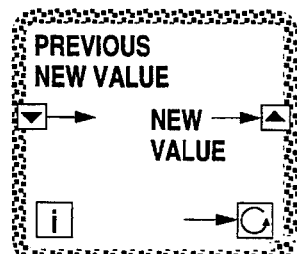    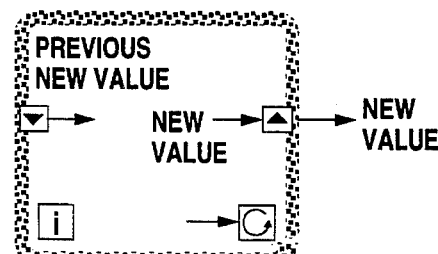
Fig. 98C    Fig. 98D
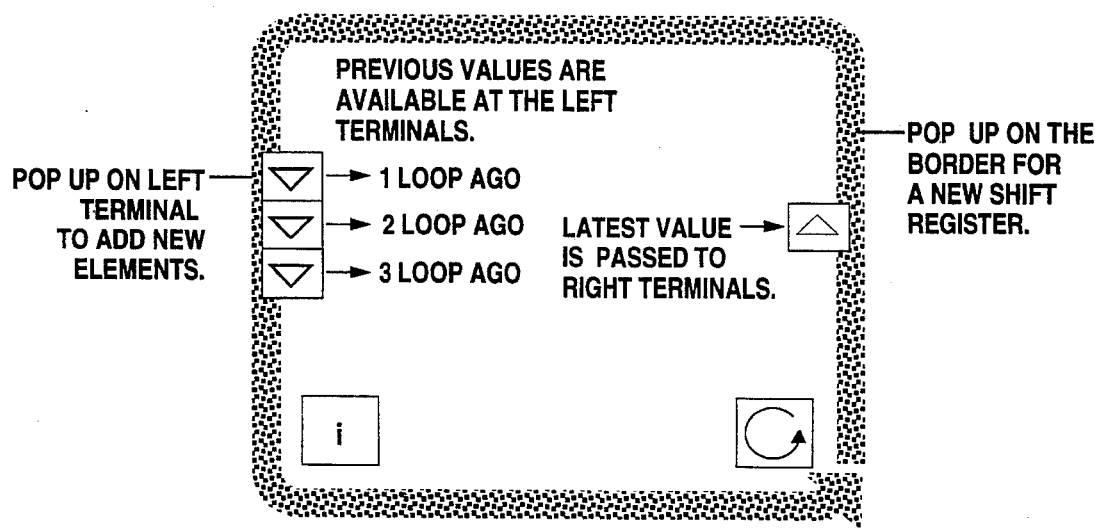
Fig. 99

NUMERICAL CASE STRUCTURE

BOOLEAN CASE STRUCTURE

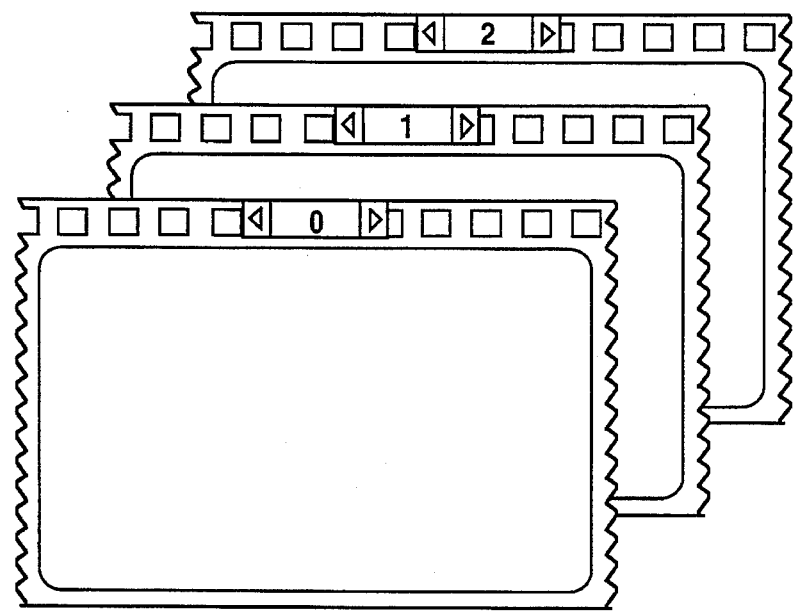
Fig. 106
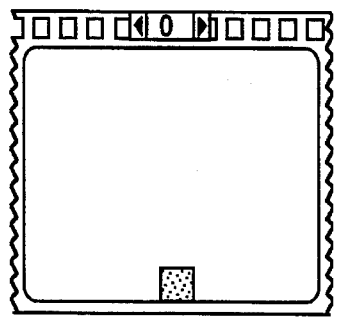 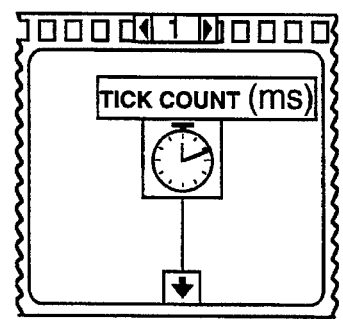 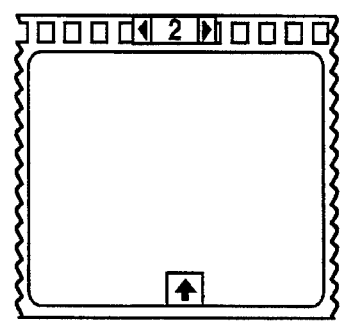
Fig. 107A  Fig. 107B  Fig. 107C

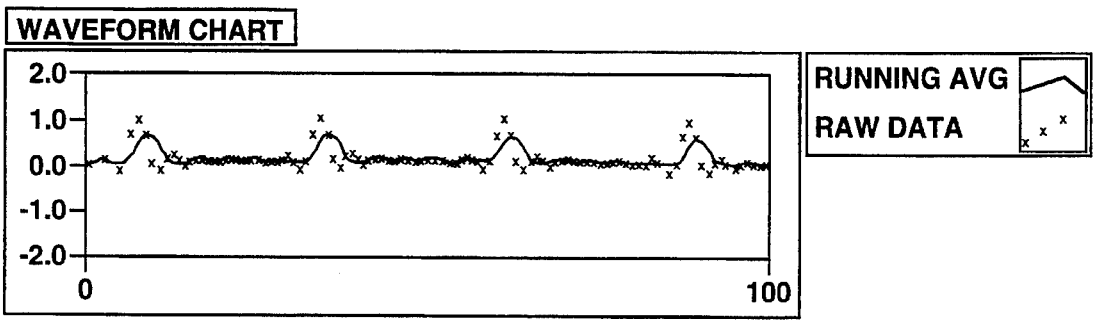
Fig. 111
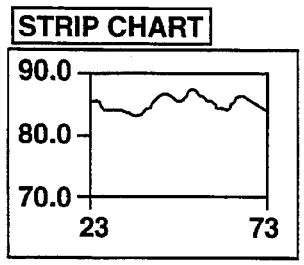  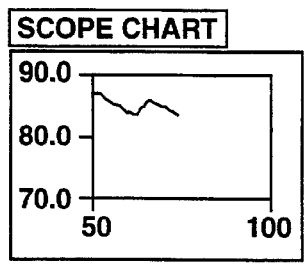  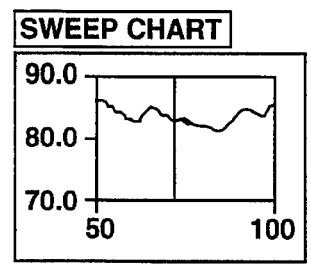
Fig. 112A    Fig. 112B    Fig. 112C
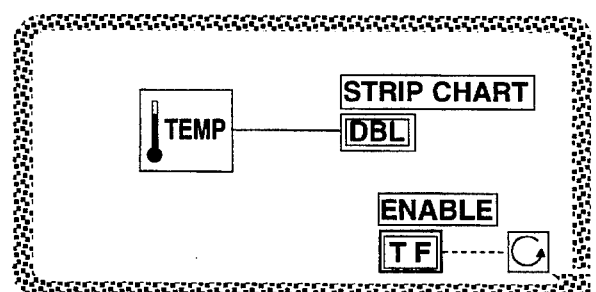
Fig. 113
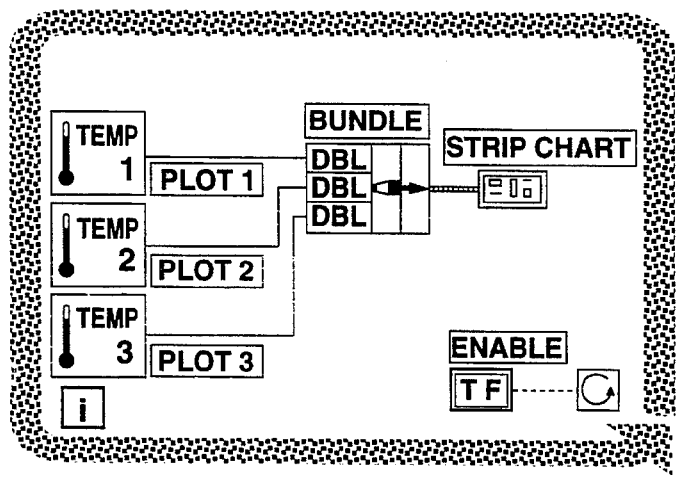
Fig. 114

METHOD AND APPARATUS FOR MORE EFFICIENT FUNCTION SYNCHRONIZATION IN A DATA FLOW PROGRAM

This is a Continuation of application Ser. No. 08/125,642 filed Sep. 22, 1993, which is a continuation-in-part of application Ser. No. 07/979,416 now U.S. Pat. No. 5,291,587 filed Nov. 19, 1992 for "Graphical System for Executing a Process and for Programming a Computer to Execute a Process Including Graphical/Variable Inputs and Variable Outputs" and assigned to National Instruments, which is a continuation of Ser. No. 07/376,257 filed Jul. 6, 1989, now abandoned, which was a continuation of Ser. No. 06/851,569 filed Apr. 14, 1986 which is now U.S. Pat. No. 4,901,221.

RESERVATION OF COPYRIGHT

A portion of the disclosure of this patent document contains material to which a claim of copyright protection is made. The copyright owner has no objection to the facsimile reproduction by anyone of the patent document or the patent disclosure as it appears in the Patent and Trademark Office patent file or records, but reserves all other rights whatsoever.

BACKGROUND OF THE INVENTION

1. Field of the Invention

The present invention relates to graphical systems for creating and executing data flow programs, and more particularly to a method and apparatus which notifies a first function when a second function has produced a result so that the first function does not consume any CPU resources during this time.

2. Description of the Related Art

A computer system can be envisioned as having a number of levels of complexity. Referring now to FIG. 1, the lowest level of a computer system may be referred to as the digital logic level. The digital logic level comprises the computer's true hardware, primarily consisting of gates which are integrated together to form various integrated circuits. Other hardware devices include printed circuit boards, the power supply, memory, and the various input/output devices, among others. Gates are digital elements having one or more digital inputs, signals representing 0 or 1 states, and which compute an output based on these inputs according to a simple function. Common examples of gates are AND gates, OR gates, etc. It is also noted that there is yet another level below level 0 which can be referred to as the device level. This level deals with the individual transistors and semiconductor physics necessary to construct the gates comprising the digital logic level.

The next level, referred to as level 1, is referred to as the microprogramming level. The microprogramming level is essentially a hybrid between computer hardware and software. The microprogramming level is typically implemented by software instructions stored in ROM (read only memory), these instructions being referred to as microcode. The microprogramming level can be thought of as including various interpreters comprised of sequences of microcode which carry out instructions available at the machine language level, which is at level 2. For example, when an instruction such as an arithmetic or shift function appears at the machine language level, this instruction is carried out one step at a time by an interpreter at the microprogramming level. Because the architecture of the microprogramming level is defined by hardware, it is a very difficult level in which to program. Timing considerations are frequently very important in programming at this level and thus usually only very skilled, experienced microprogrammers operate at this level.

As mentioned above, the level above the microprogramming level is referred to as the machine language level. The machine language level comprises the 1's and 0's that a program uses to execute instructions and manipulate data. The next level above the machine language level is referred to as the assembly language level. This level includes the instruction set of the computer system, i.e. the various op codes, instruction formats, etc. that cause the computer to execute instructions. In assembly language each instruction produces exactly one machine language instruction. Thus, there is a one to one correspondence between assembly language instructions and machine language instructions. The primary difference is that assembly language uses very symbolic human-readable names and addresses instead of binary ones to allow easier programming. For example, where a machine language instruction might include the sequence "101101," the assembly language equivalent might be "ADD." Therefore, assembly language is typically the lowest level language used by programmers, and assembly language programming requires a skilled and experienced programmer.

The next level includes high level text-based programming languages which are typically used by programmers in writing applications programs. Many different high level programming languages exist, including BASIC, C, FORTRAN, Pascal, COBOL, ADA, APL, etc. Programs written in these high level languages are translated to the machine language level by translators known as compilers. The high level programming languages in this level, as well as the assembly language level, are referred to in this disclosure as text-based programming environments.

Increasingly computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. For example, text-based programming environments have traditionally used a number of programs to accomplish a given task. Each program in turn often comprises one or more subroutines. Software systems typically coordinate activity between multiple programs, and each program typically coordinates activity between multiple subroutines. However, in a text-based environment, techniques for coordinating multiple programs generally differ from techniques for coordinating multiple subroutines. Furthermore, since programs ordinarily can stand alone while subroutines usually cannot in a text-based environment, techniques for linking programs to a software system generally differ from techniques for linking subroutines to a program. Complexities such as these often make it difficult for a user who is not a specialist in computer programming to efficiently program a computer system in a text-based environment.

The task of programming a computer system to model a process often is further complicated by the fact that a sequence of mathematical formulas, mathematical steps or other procedures customarily used to conceptually model a process often does not closely correspond to the traditional text-based programming techniques used to program a computer system to model such a process. For example, a computer programmer typically develops a conceptual model for a physical system which can be partitioned into functional blocks, each of which corresponds to actual systems or subsystems. Computer systems, however, ordinarily do not actually compute in accordance with such conceptualized functional blocks. Instead, they often utilize calls to various subroutines and the retrieval of data from different memory storage locations to implement a procedure which could be conceptualized by a user in terms of a functional block. In other words, the requirement that a user program in a text-based programming environment places a level of abstraction between the user's conceptualization of the solution and the implementation of a method that accomplishes this solution in a computer program. Thus, a user often must substantially master different skills in order to both conceptually model a system and then to program a computer to model that system. Since a user often is not fully proficient in techniques for programming a computer system in a text-based environment to implement his model, the efficiency with which the computer system can be utilized to perform such modeling often is reduced.

One particular field in which computer systems are employed to model physical systems is the field of instrumentation. An instrument is a device which collects information from an environment and displays this information to a user. Examples of various types of instruments include oscilloscopes, digital multimeters, pressure sensors, etc. Types of information which might be collected by respective instruments include: voltage, resistance, distance, velocity, pressure, frequency of oscillation, humidity or temperature, among others. An instrumentation system ordinarily controls its constituent instruments from which it acquires data which it analyzes, stores and presents to a user of the system. Computer control of instrumentation has become increasingly desirable in view of the increasing complexity and variety of instruments available for use.

In the past, many instrumentation systems comprised individual instruments physically interconnected. Each instrument typically included a physical front panel with its own peculiar combination of indicators, knobs, or switches. A user generally had to understand and manipulate individual controls for each instrument and record readings from an array of indicators. Acquisition and analysis of data in such instrumentation systems was tedious and error prone. An incremental improvement in the manner in which a user interfaced with various instruments was made with the introduction of centralized control panels. In these improved systems, individual instruments were wired to a control panel, and the individual knobs, indicators or switches of each front panel were either preset or were selected to be presented on a common front panel.

A significant advance occurred with the introduction of computers to provide more flexible means for interfacing instruments with a user. In such computerized instrumentation systems the user interacted with a software program executing on the computer system through the video monitor rather than through a manually operated front panel. These earlier improved instrumentation systems provided significant performance efficiencies over earlier systems for linking and controlling test instruments.

However, these improved instrumentation systems had significant drawbacks. For example, due to the wide variety of possible testing situations and environments, and also the wide array of instruments available, it was often necessary for a user to develop a program to control the new instrumentation system desired. As discussed above, computer programs used to control such improved instrumentation systems had to be written in conventional text-based programming languages such as, for example, assembly language, C, FORTRAN, BASIC, or Pascal. Traditional users of instrumentation systems, however, often were not highly trained in programming techniques and, in addition, traditional text-based programming languages were not sufficiently intuitive to allow users to use these languages without training. Therefore, implementation of such systems frequently required the involvement of a programmer to write software for control and analysis of instrumentation data. Thus, development and maintenance of the software elements in these instrumentation systems often proved to be difficult.

U.S. Pat. No. 4,901,221 to Kodosky et al discloses a graphical system and method for modeling a process, i.e. a graphical programming environment which enables a user to easily and intuitively model a process. The graphical programming environment disclosed in Kodosky et al can be considered the highest and most intuitive way in which to interact with a computer. Referring now to FIG. 1A, a graphically based programming environment can be represented at level 5 above text-based high level programming languages such as C, Pascal, etc. The method disclosed in Kodosky et al allows a user to construct a diagram using a block diagram editor such that the diagram created graphically displays a procedure or method for accomplishing a certain result, such as manipulating one or more input variables to produce one or more output variables. As the user constructs the data flow diagram using the block diagram editor, machine language instructions are automatically constructed which characterize an execution procedure which corresponds to the displayed procedure. Therefore, a user can create a text-based computer program solely by using a graphically based programming environment. This graphically based programming environment may be used for creating virtual instrumentation systems and modeling processes as well as for any type of general programming.

In programming a computer or modelling a process in a text-based environment, it is often necessary for a first sequence of code or routine to wait on a result that is produced by a second routine before the first can begin or continue operation. This is typically implemented by the computer system requiring the first routine to continually poll the second function, continually asking the second routine whether it is done. However, polling has a serious drawback in that precious CPU time is consumed.

In the system and method described in Kodosky et al, it was often necessary or desirable to have a first function waiting on a result from a second function before the first function could begin or proceed. For example, one part of a block diagram may be required to wait until another part finishes its task. This could be performed using global variables, with one function polling the value of the global variable until its value has changed, reflecting that the second function has produced the desired result. However, using global variables for this purpose requires considerable overhead, since the function that is polling is using CPU execution time. In addition, global variables may be undesirable in a data flow diagram. Therefore, a method and apparatus is desired which provides a more efficient mechanism for allowing a first function to be notified when a second function has produced a result.

SUMMARY OF THE INVENTION

The present invention comprises an occurrence capability which allows a first function to "go to sleep" while waiting for a second function to produce a result. In this manner, the first function does not consume any CPU time while waiting for the second function.

Three icons are provided with associated control software which implement the occurrence function according to the present invention. A Wait on Occurrence function icon is associated with the first function that is waiting on the result from the second function. A Set Occurrence function icon is associated with the second function icon and triggers an occurrence when the second function produces the desired result. A Generate Occurrence function icon is used to pass an identifier value linking multiple sources and destinations having Set Occurrence and Wait on Occurrence function icons, respectively.

When a function having a Wait on Occurrence node is first placed in the run queue for execution, that function is "put to sleep" until the desired occurrence is triggered. When a function having a corresponding a Set Occurrence node completes and produces its result, the Set Occurrence node triggers the occurrence. This "wakes up" the first function, causing the first function to be placed back in the run queue and allowing it to proceed. An occurrence may also be triggered in some other manner.

BRIEF DESCRIPTION OF THE DRAWINGS

The purpose and advantages of the present invention will be apparent to those skilled in the art from the following detailed description in conjunction with the appended drawings in which:

FIG. 1 illustrates various levels of complexity in a computer system according to the prior art;

FIG. 1A illustrates the various levels of complexity of a computer system including a graphical programming environment as the highest level;

FIG. 6 block diagram of the computer system of FIGS. 5 and 5A;

FIGS. 9A–L are flowchart diagrams illustrating operation of the execution subsystem of FIGS. 2 and 4;

FIG. 18 illustrates a type descriptor used to describe data structures;

FIG. 57 illustrates the edit mode palette;

FIGS. 58A–B illustrate operating tool icons;

FIGS. 59A–C illustrate positioning tool icons;

FIGS. 60A–C illustrate labeling tool icons;

FIG. 61 illustrates the wiring tool;

FIGS. 62A–B illustrate the coloring tool;

FIG. 63 illustrates the menu bar in its active state;

FIG. 64 illustrates the file menu;

FIG. 65 illustrates the edit menu;

FIG. 66 illustrates the operate menu;

FIG. 67 illustrates the controls menu;

FIG. 76 illustrates examples of wire types;

FIGS. 77 and 78 are examples of VIs;

FIG. 96 illustrates the grey dot created during numeric conversions;

FIG. 97 illustrates a shift register;

FIG. 98 illustrates the operation of a shift register;

FIG. 99 illustrates a shift register with additional terminals to access values from previous iterations;

FIG. 106 illustrates a sequence structure;

FIG. 107 illustrates an example of a three framed sequence structure using sequence locals;

FIG. 111 illustrates a waveform chart;

FIG. 112 illustrates the three update modes of a waveform chart, referred to as strip chart, scope chart, and sweep chart;

FIG. 113 illustrates how a scalar output is directly wired to a waveform chart;

FIG. 114 illustrates how a waveform chart accommodates more than one plot using the bundle function;

DESCRIPTION OF THE PREFERRED EMBODIMENTS

The following U.S. Patents are hereby incorporated by reference.

U.S. Pat. No. 4,901,221 titled "Graphical System for Modeling a Process and Associated Method," issued on Feb. 13, 1990.

U.S. Pat. No. 4,914,568 titled "Graphical System for Modeling a Process and Associated Method," issued on Apr. 3, 1990.

The following U.S. patent applications are hereby incorporated by reference.

U.S. patent application Ser. No. 07/380,329 filed Jul. 12, 1989 titled "Graphical Method for Programming a Virtual Instrument," now U.S. Pat. No. 5,301,336.

U.S. patent application Ser. No. 07/979,416 filed Nov. 19, 1992 titled "Graphical System for Executing a Process and for Programming a Computer to Execute a Process", Including Graphical Variable Inputs and Variable Outputs which is now U.S. Pat. No. 5,291,587.

U.S. patent application Ser. No. 07/647,785 titled "Polymorphic Data Flow Block Diagram System and Method for Programming a Computer" and filed Jan. 30, 1991 which is now U.S. Pat. No. 5,301,301.

Figure 2:
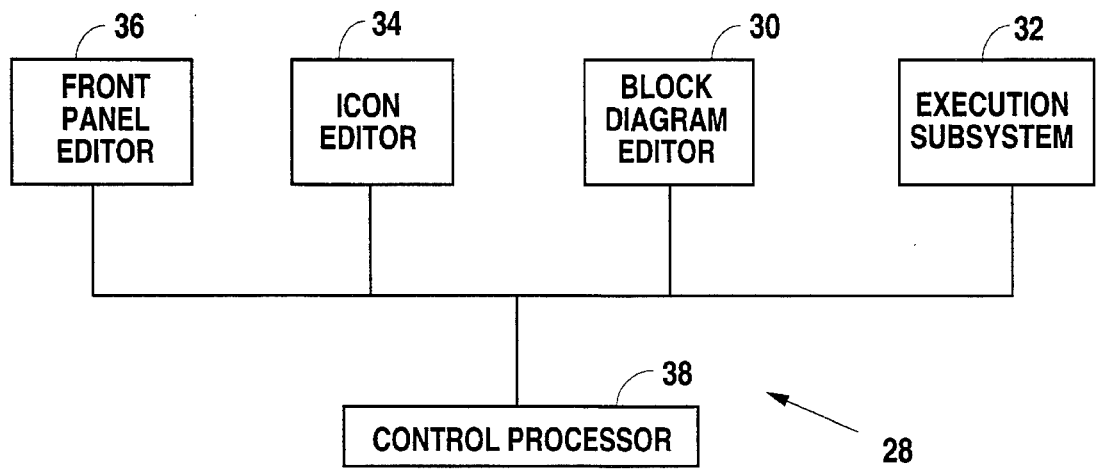
FIG. 2 is a block diagram illustrating a system for modeling a process according to the present invention.

Referring now to FIG. 2, a system 28 for modeling a process or creating a data flow program is shown. The system 28 includes a respective block diagram editor 30, an execution subsystem 32, an icon editor 34, and a front panel editor 36 all interconnected. The system 28 also includes a control processor 38 which connects to each of the front panel editor 36, icon editor 34, block diagram editor 30 and execution subsystem 32. The system 28 can be used for a number of purposes. In the preferred embodiment, the system 28 is shown primarily in creating "virtual instruments" (VIs), which are instruments created in software. However, the system 28 of the present invention has many other applications, including modeling a process or any other type of general programming.

As will be explained more fully below, the block diagram editor 30 is used to construct and display a graphical diagram, referred to as a block diagram, which visually displays a procedure by which a value for a input variable produces a value for one or more output variables. This procedure, together with the input and output variables, comprises a process model. Furthermore, as the user constructs the graphical diagram, the block diagram editor 30 constructs execution instructions which characterize an execution procedure which corresponds to the displayed procedure. In the preferred embodiment, the block diagram editor 30 constructs instructions in the machine language which execute the block diagram created by the user. The execution subsystem 32 assigns at least one value to the input variable and executes the execution instructions to produce a value for the output variable. In the preferred embodiment, the block diagram editor 30 and the execution subsystem 32 are constructed in software. The control processor 38 implements the block diagram editor 30 and the execution subsystem 32 of the preferred embodiment.

Figure 3:
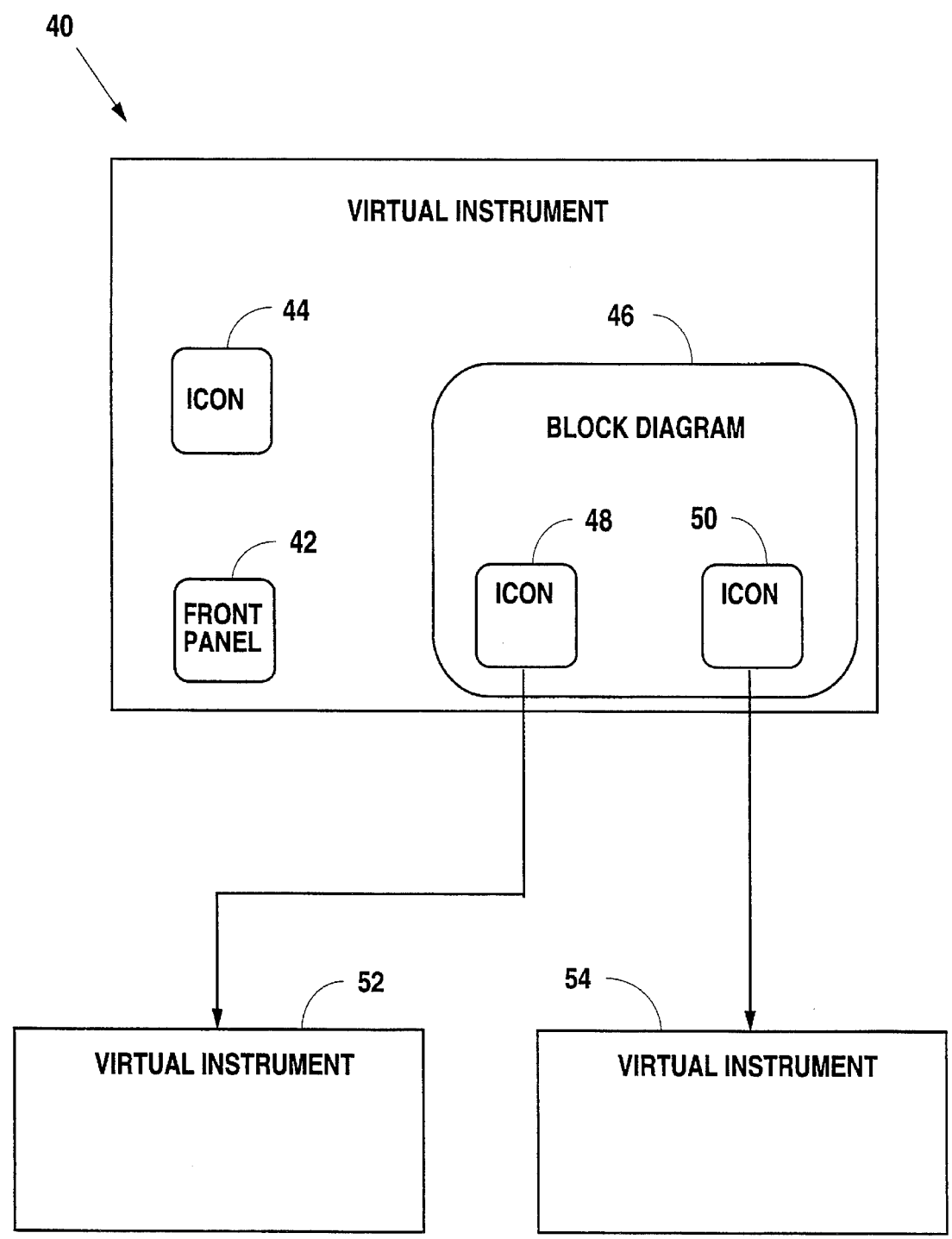
FIG. 3 is an illustrative drawing of a representation of a virtual instrument produced using the system of FIG. 2.

The system 28 permits a user to construct a virtual instrument (also referred to as a VI) 40 such as that represented in generalized form in the illustrative drawings of FIG. 3. The virtual instrument 40 includes a front panel 42 which permits interactive use of the virtual instrument 40 by a user. As will be explained more fully below, the front panel 42 permits graphical representation of input and output variables provided to the virtual instrument 40. The respective graphical representations on the front panel 42 for input and output variables are referred to as controls and indicators, respectively; although in some instances controls and indicators are referred to collectively as controls. The virtual instrument 40 also includes an icon 44 which permits use of the virtual instrument 40 as a subunit in other virtual instruments (not shown). The virtual instrument 40 also includes a block diagram 46 which graphically provides a visual representation of a procedure or method by which a specified value for an input variable displayed in the front panel 42 can produce a corresponding value for an output variable in the front panel 42. In other words, the user uses the block diagram editor 30 to create a graphical program, and the resultant graphical icons appear in the block diagram 46. The virtual instrument 40 itself is a hierarchical construction which may comprise within its block diagram 46 respective icons 48 and 50 referencing other virtual instruments (sub-VIs) indicated generally by respective blocks 52 and 54. The block diagram 46 may also include one or more "primitives" corresponding to simple functions that may be performed. Together sub-VIs, primitives and other types of data processing elements comprised within the block diagram 46 are referred to as function icons. Function icons in the block diagram 46 have associated control means or software which implement the desired functions.

Figure 4:
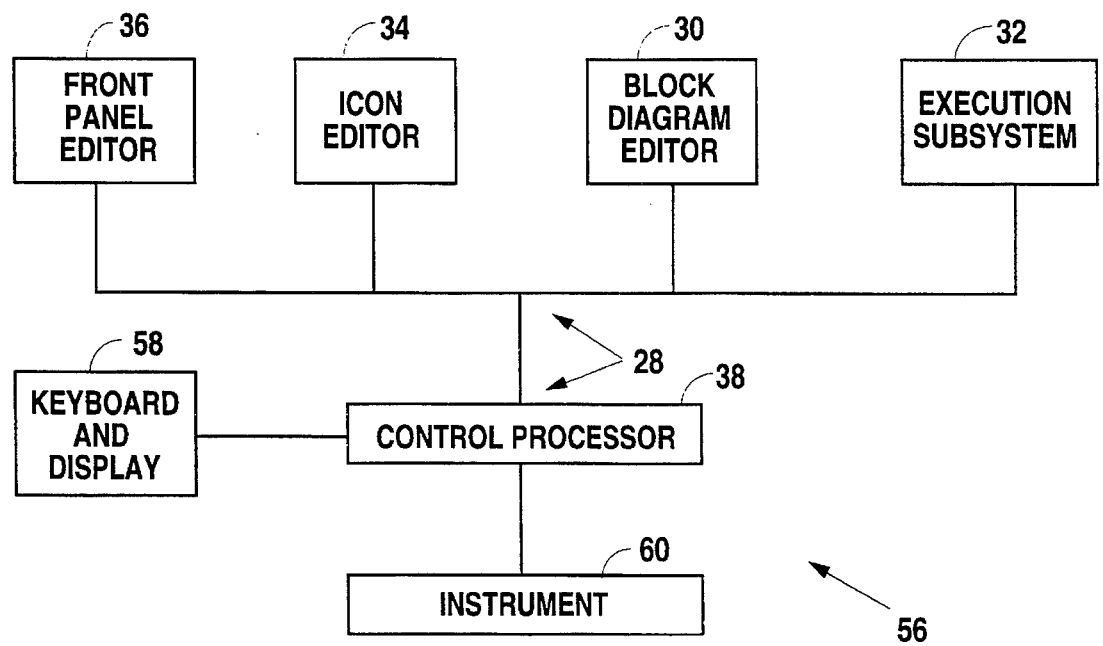
FIG. 4 shows a block diagram of an instrumentation system including the system of FIG. 2.

The generalized block diagram of FIG. 4 shows an instrumentation system 56 incorporating the system 28 shown in FIG. 2. Elements of the instrumentation system 56 which are substantially identical to those of second system 28 are designated with the same reference numerals as those of the system 28 for convenience. The instrumentation system 56 includes a keyboard and display 58 and an instrument 60. In a presently preferred embodiment, the control processor 38 and the keyboard and display 58 may be implemented using any type of general purpose computer.

The instrumentation system 56 is preferably used to control the instrument 60, i.e., acquire data from the instrument 60, analyze that data, store that data, and present that data to the user in a meaningful way. The block diagram editor 30 can also be used to create virtual instruments as desired.

Figure 5:
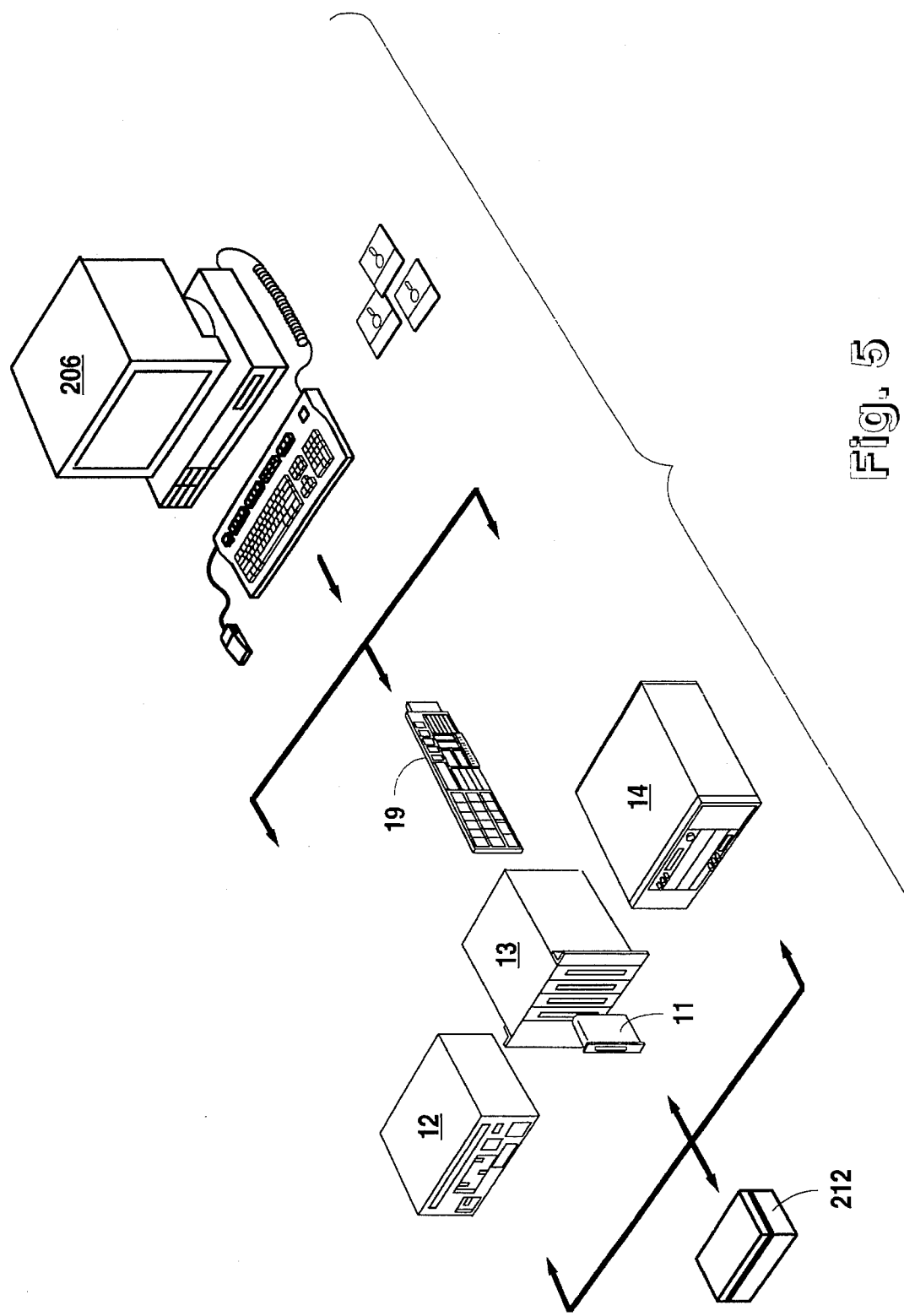
FIG. 5 is a representative drawing of various choices for an illustrative hardware instrumentation system of the preferred embodiment.

FIG. 5 illustrates various design choices available in an instrumentation system 204 in the preferred embodiment. As shown, a computer system 206 programmed according to the present invention can interface with a unit under test 212, i.e., can perform data acquisition and control of the unit under test 212, using a number of methods. These methods include using GPIB instruments 12, plug-in data acquisition boards 19 with associated signal conditioning logic 11, or VXI instruments 14. In addition a serial RS-232 method (not shown) can be used, as desired. It is noted that the computer 206 may be any type of computer including any type of Apple computer, IBM PC-compatible computer, PS/2, Sun workstation, etc.

Figure 5A:
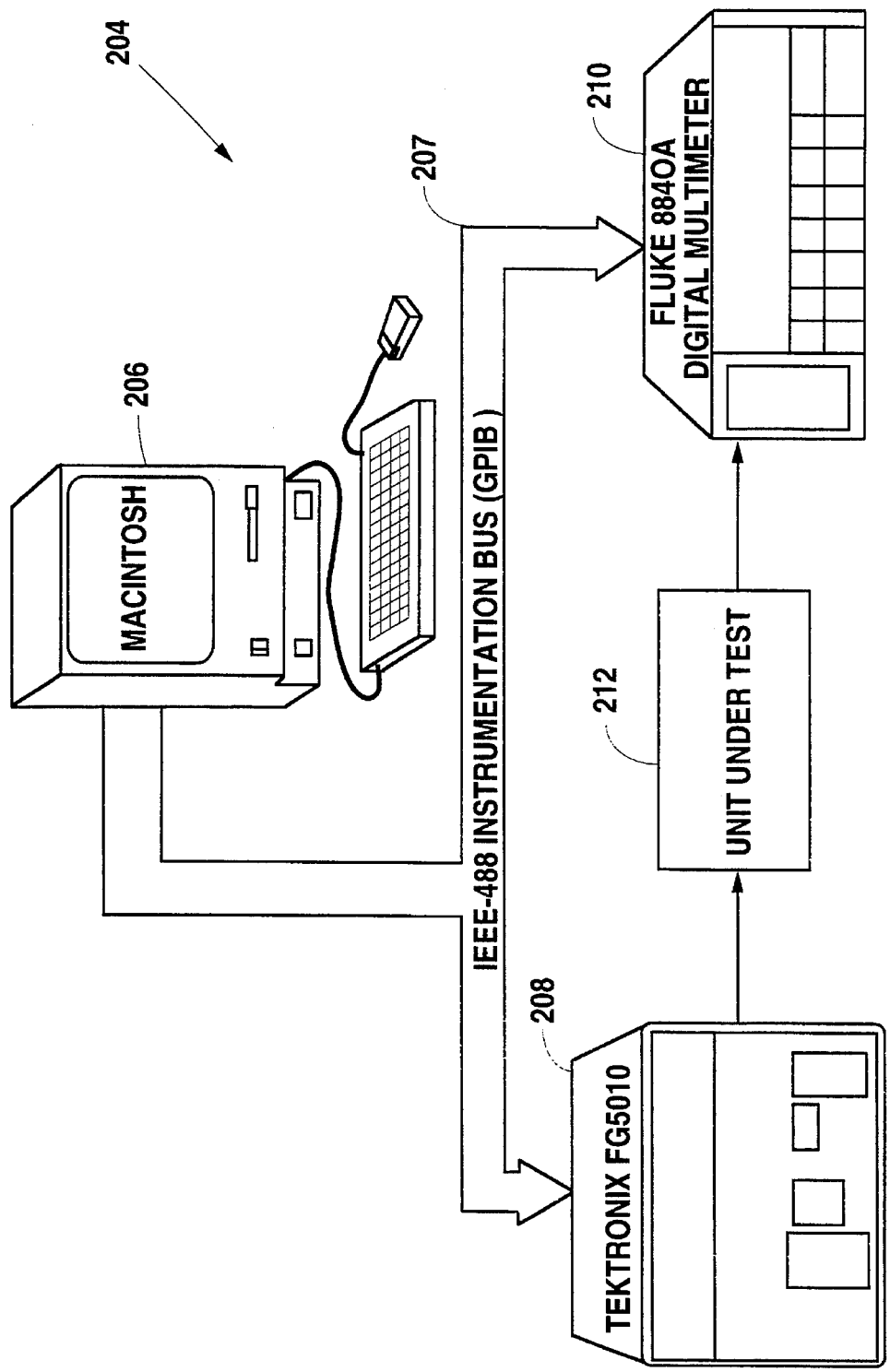
FIG. 5A is an illustrative hardware instrumentation system of the preferred embodiment.

FIG. 5A shows an illustrative hardware configuration of an instrumentation system 204 according to the present invention. The system 204 includes a computer 206 which includes the control processor 38 as well as the front panel editor 36, icon editor 34, block diagram editor 30, and execution subsystem 32. As previously mentioned the elements 30–36 are preferably implemented in software. The computer 206 illustrated in FIG. 5 includes an interface to a GPIB (general purpose instrument bus) 207 which in turn is connected to a Tektronix 5010 Function generator 208 and a Fluke 8840A digital multimeter 210. A unit under test 212 is coupled between the function generator 208 and multimeter 210 as shown.

Figure 22:
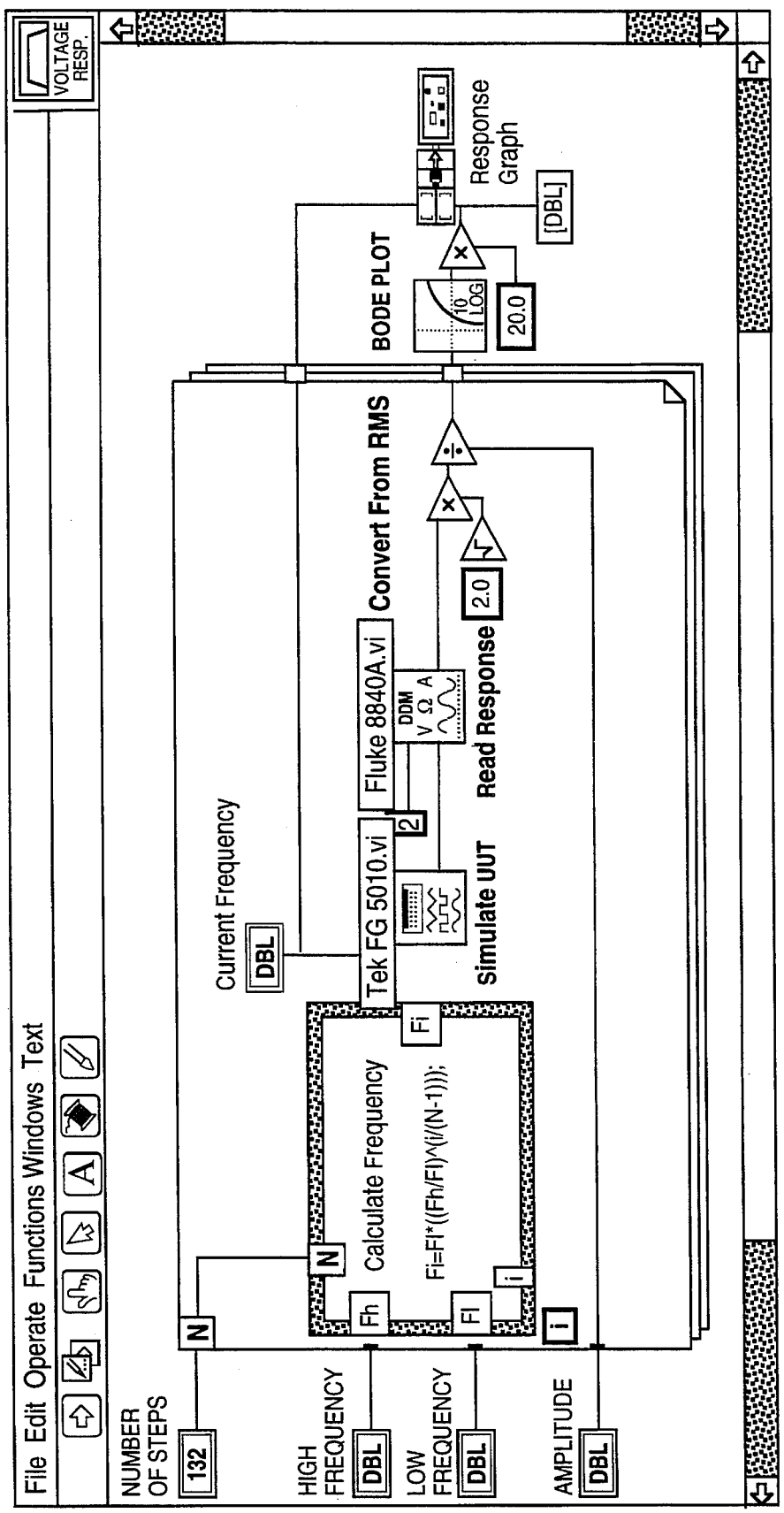
FIG. 22 is a drawing representing a block diagram according to the present invention as displayed on a computer video monitor to model the illustrative hardware system of FIG. 5A.

Referring ahead briefly to FIG. 22, a computer generated display of a completed block diagram for the instrumentation system 204 in FIG. 5A is shown. The block diagram in FIG. 22 is created by a user using the block diagram editor 30 of FIG. 2. As previously mentioned, the block diagram is essentially the graphical program representing the instrumentation system's operation and shows the interconnections between the elements of the instrument, the signal paths, and the relationship to other virtual instruments. Referring again to FIG. 5, a user uses the block diagram editor 30 to create the block diagram 46 in FIG. 22 to control the operation of the instrumentation system 204. Also, as discussed further below, the user uses the front panel editor 36 to create a front panel 42 to control the function or waveform generator 208 and multimeter 210. Once the block diagram 46 and front panel 42 have been created using the block diagram editor 30 and front panel editor 36, the user can then execute the block diagram (FIG. 22) using the execution subsystem 32. As discussed further below, the block diagram 46 can, for example, control the output of the waveform generator 208 to the unit under test 212 and can also be used to receive, analyze and present the output from the unit under test 212 which is provided from the multimeter 210.

It is also noted that other types of configurations for an instrumentation system 204 may be used. As discussed with regard to FIG. 5, instead of using actual instruments 208 and 210, the instrumentation system 204 may include one or more modular instruments on plug-in boards in conjunction with the VXI bus specification. The plug-in board instruments would then assume the function of the function generator 208 and multimeter 210. In addition, instead of requiring instruments 208 and 210 or plug-in modular instruments, the computer 206 can include a data acquisition card including A-D (analog to digital) and D-A (digital to analog) convertors, wherein the D-A convertor generates waveform signals to the unit under test 212 and the output from the unit under test 212 is then provided through an A-D convertor to the computer system 206.

Referring now to FIG. 6, a block diagram of the computer system 206 is shown. The elements of a computer system not necessary to understand the operation of the present invention have been omitted for simplicity. The computer system 206 includes a central processing unit or CPU 21 which is coupled to a processor or host bus 24. The CPU 21 acts as the control processor 38. The CPU may be any of various types, including an Intel x86 processor such as the i486, a CPU from the Motorola family of processors, as well as others. Main memory 22 is coupled to the host bus 24 by means of memory controller 23. The main memory 22 stores the front panel editor 36, icon editor 34, block diagram editor 30 and execution subsystem 32. Host bus 24 is coupled to an expansion or input/output bus 26 by means of a bus controller 25. The expansion bus 26 includes slots for various devices, including video 16 and hard drive 17. In one embodiment where the system and method of the present invention are used in an instrumentation application, a data acquisition card 19 is connected to the expansion bus 26. The data acquisition card 19 receives analog signals from an external sensor or instrument and in turn produces digital data that is provided to the CPU 21 and used by the system and method of the present invention. The computer system 206 also includes a GPIB (General Purpose Interface Bus) card 18 that interfaces to one or more instruments via the GPIB bus 15. The computer system 206 also includes an MXI card 10 that connects to VXI chassis 14.

The following discussion regarding data flow principles and a virtual instrument data structure diagram will assist in understanding the operation of the block diagram editor 30 and the execution subsystem 32 of the system 28 and the instrumentation system 56.

Figure 7:
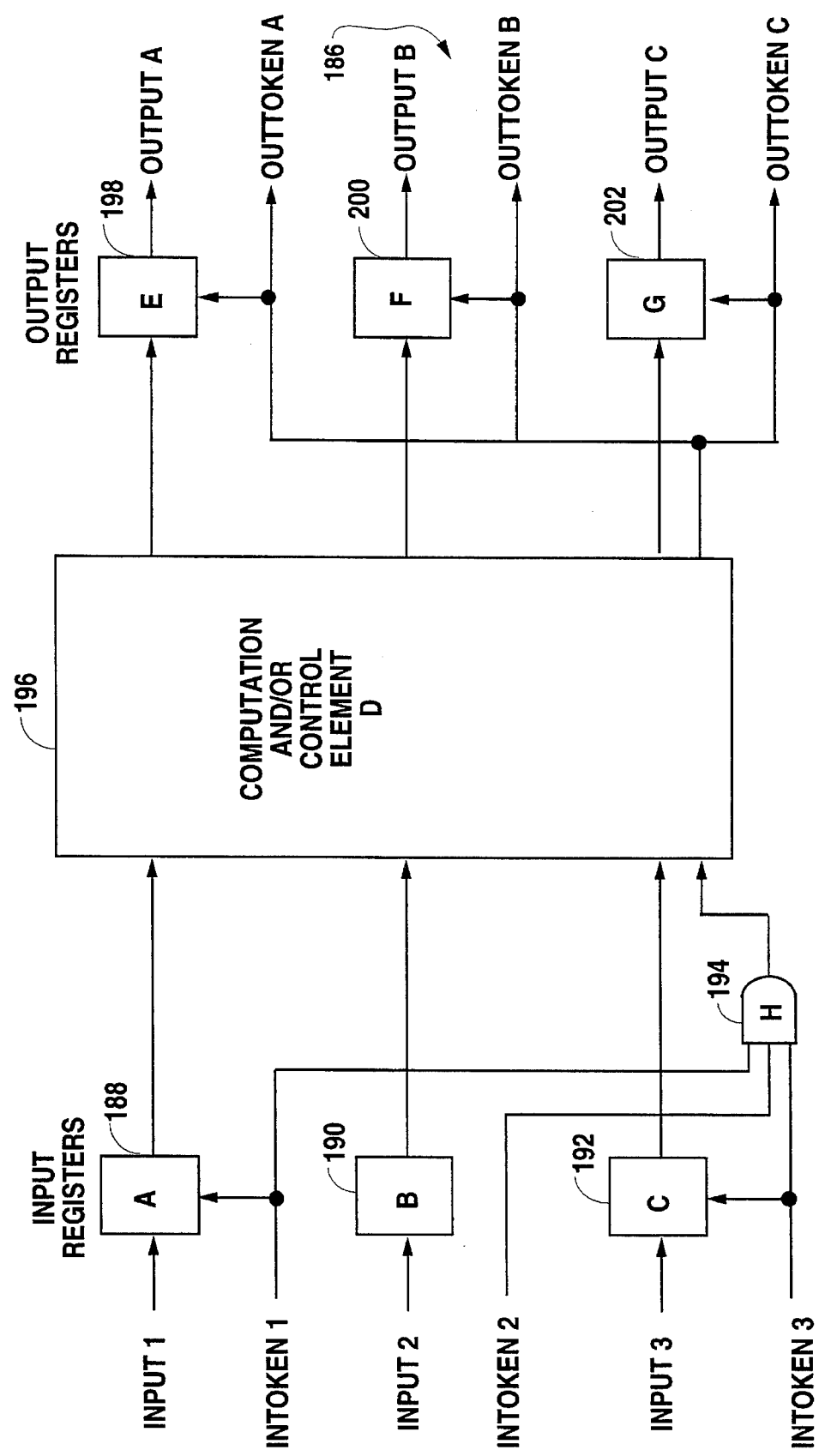
FIG. 7 shows a block diagram representing an exemplary data flow system.

Referring now to FIG. 7, a block diagram 186 of an exemplary data flow system is shown. The block diagram 186 includes three respective input registers 188, 190 and 192 which provide an accumulation of input data. As soon as all input data are present, output of AND gate 194 becomes TRUE, and computation and/or control element 196 will begin computation. The computation element 196 begins generating output data which are stored in respective output registers 198, 200 and 202. When all output data are available, an output token is generated by the computation element 196 indicating that output data are available for transmission to a next system (not shown). It will be appreciated that the computation element 196 can be a combination of more than one subsystem (not shown).

Figures 8A, 8B:
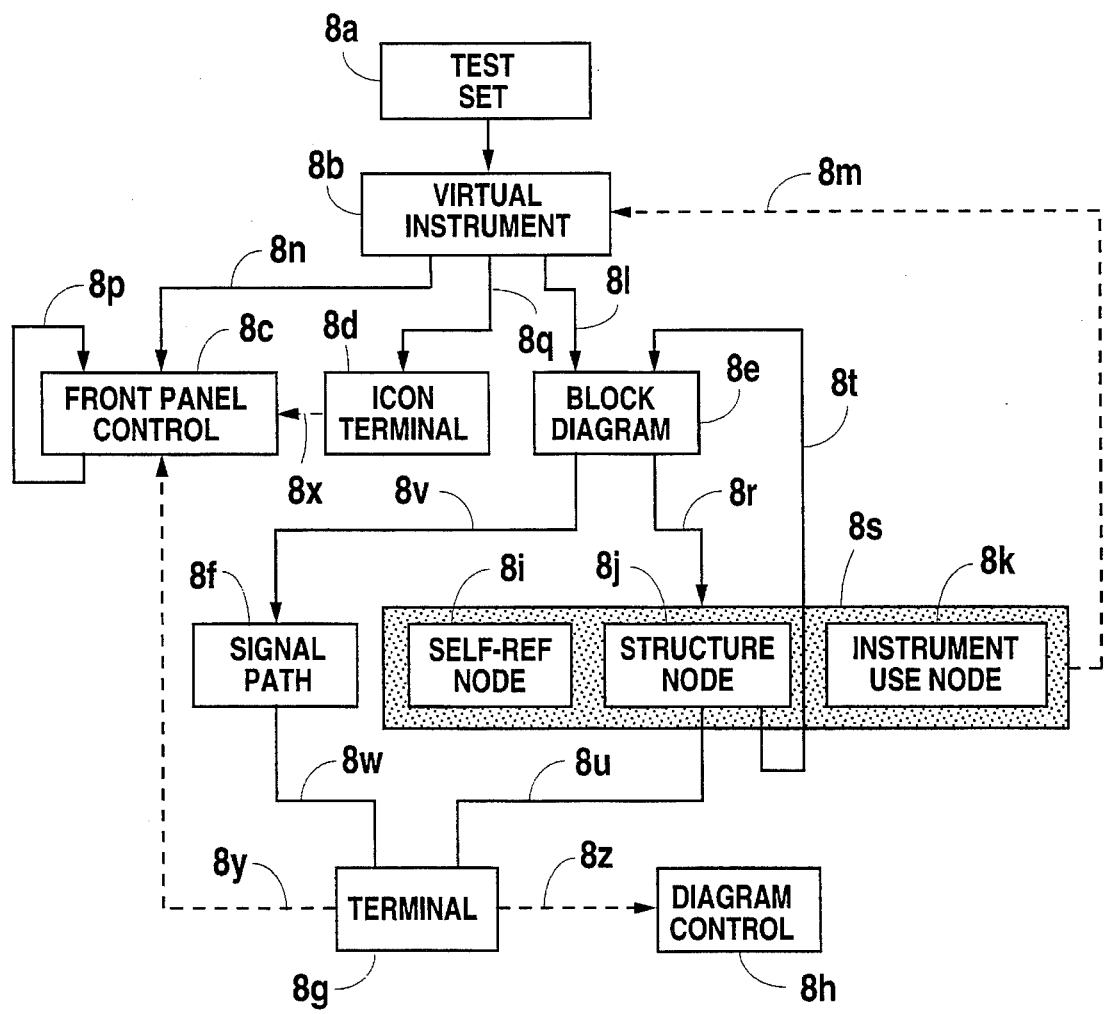
FIG. 8A illustrates a virtual instrument data structure diagram used by the system of FIG. 2 and the instrumentation system of FIG. 4.
FIG. 8B shows a legend applicable to the illustration of FIG. 8A.

FIG. 8A illustrates a virtual instrument data structure diagram. The system 28 of FIG. 2 and the instrumentation system 56 of FIG. 4 each utilize the principles set forth in the data structure diagram of FIG. 8A. It will be appreciated that implementation of a system utilizing a data structure such as that diagrammed in the diagram of FIG. 8A advantageously permits the implementation of an extended data flow system like that illustrated in FIG. 7.

Furthermore, it will be appreciated that implementation of the data structure like that of the diagram of FIG. 8A advantageously permits the implementation of a system in which execution instructions are constructed in a graphical fashion. More particularly, execution instructions are constructed by constructing a visual display or block diagram in which at least one input variable produces at least output variable according to a displayed procedure. Furthermore, the execution instructions are constructed such that, when a value is assigned to a particular input variable, a value for a corresponding output variable is produced according to the procedure illustrated in the visual display. Additionally, the execution instructions are constructed in response to the construction of a block diagram comprising the graphical display. Thus, a user need only construct an appropriate visual display or block diagram in order to construct the execution instructions.

Moreover, implementation of data flow principles by using a data structure such as that shown in the diagram of FIG. 8A advantageously permits the use of parallel processing which increases the speed with which the execution of execution instructions can be accomplished.

More particularly, FIG. 8A shows a system representation of a virtual instrument. Boxes 8a–8k, indicate conceptual objects in the system that have well-defined properties. Objects 8i, 8j, and 8k are grouped into shaded box 8s and share some properties and form a class of objects.

As indicated in FIG. 8B which represents a legend applicable to the illustration of FIG. 8A, a solid line with an arrow is used to indicate a potential one-to-many relationship, i.e., the source object contains zero or more destination objects (e.g., a vehicle containing zero or more wheels). A dashed line with an arrow is used to indicate a potential one-to-one relationship, i.e., the source object may reference zero or one destination object (e.g., a library book may or may not have a borrower).

Line 8n indicates that a virtual instrument 8b contains a front panel with a multiplicity of controls 8c. A control may be of clustered type in which case it contains a multiplicity of subcontrols as indicated by line 8p. Line 8q indicates that a virtual instrument contains an icon with a multiplicity of terminals 8d. Line 8l indicates that virtual instruments also contains a multiplicity of block diagrams 8e.

In the system of the present invention, a virtual instrument either contains one diagram or none. Built in virtual instruments representing primitive computations (primitives) have no diagrams. Line 8r indicates that a block diagram contains a multiplicity of objects of the node class. A block diagram contains exactly one self reference node 8i, and an arbitrary number of structure nodes 8j or instrument use nodes 8k.

Line 8*t* indicates that a structure node contains a multiplicity of subdiagrams.

As discussed below with regard to FIGS. 12A–D, a sequence structure or a conditional structure contains one or more subdiagrams, and an iterative loop structure or indefinite loop structure contains exactly one subdiagram. Line 8*m* indicates that an instrument use node (I-use node) is used to reference another virtual instrument. The instrument use node may reference a virtual instrument in real-time; or it may reference previous data acquired by the virtual instrument. Line 8*u* indicates that each object of the node class contains a multiplicity of terminals 8*g*. Line 8*v* indicates that a block diagram also contains a multiplicity of signal paths 8*f*. Each signal path contains a multiplicity of terminals as indicated by line 8*w*. There is at most one terminal per signal path that is designated as the source of the signal. Each terminal contained in a signal path also is contained in a node. However, there may be terminals in nodes which are not in signal paths. The terminals in a signal path are typically in different nodes. Lines 8*y* and 8*z* indicate that each terminal may reference a front panel control or a block diagram control (e.g., a constant). A terminal references exactly one control, and it is either on the front panel or on the block diagram.

Execution Subsystem

Figure 9A:
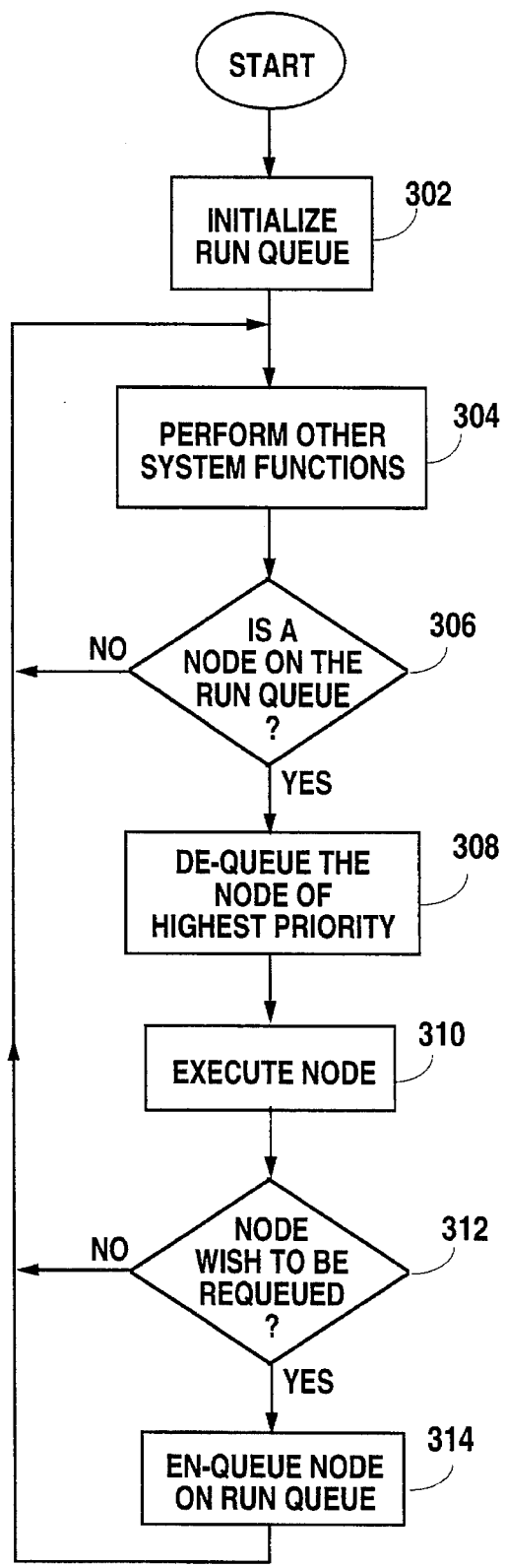

Referring now to FIGS. 9A–L, a flowchart diagram illustrating the operation of the execution subsystem is shown. In FIG. 9A, the main execution loop of the block diagram execution subsystem is shown. At power on, in step 302 the execution subsystem 32 initializes the run queue. The run queue is the main queue in which all nodes are scheduled to be operated on by the execution subsystem 32. As discussed further below, the initial node is scheduled on the run queue by the execution subsystem 32, with all subsequent nodes in the block diagram being scheduled by preceding nodes in the data flow diagram. In step 304 the execution subsystem 32 relinquishes control to allow other graphical environment functions to be performed. For example, other functions include the front panel editor 36 which allows a user to create a front panel, the icon editor 34 which allows a user to create and edit icons, the block diagram editor 30 which allows a user to use the graphical programming environment to create programs, etc. These other functions at some point will invoke the execution subsystem 32. For example, when the user builds a block diagram and then clicks on the run arrow to execute the diagram, the execution subsystem 32 is invoked. When the execution subsystem 32 is invoked, the subsystem 32 checks the run queue to determine if anything has been placed on the queue. If nothing is placed on the run queue in step 306, then the execution subsystem 32 returns to step 304 and allows other systems to perform their functions until something is placed on the queue.

If a node is placed on the run queue in step 306, then the execution subsystem 32 advances to step 308 and de-queues the node having the highest priority. In step 310 the execution subsystem 32 executes the node. The node execution step includes executing all or a portion of a node and is discussed in much greater detail below. Upon completion of step 310, the execution subsystem 32 then advances to step 312 and determines whether the node has indicated a desire to be re-queued on the run queue. In general, if only a portion of the node was executed in step 310, the node will indicate in its return that it wishes to be replaced on the run queue to have its remaining portion executed. If the node has expressed a desire to be re-queued on the run queue in step 312, i.e. if the node has not been fully completed in step 310, then the execution subsystem 32 advances to step 314, re-enqueues the node on the run queue, and then returns back to step 304. If the node has completed in step 310 and thus the node has not indicated a desire to be re-placed on the run queue, the execution subsystem 32 returns from step 312 directly to step 304. In step 304 other parts of the graphical programming environment execute. When control returns to the execution subsystem 32, the execution subsystem 32 performs steps 306–314 as previously described.

Figure 9B:
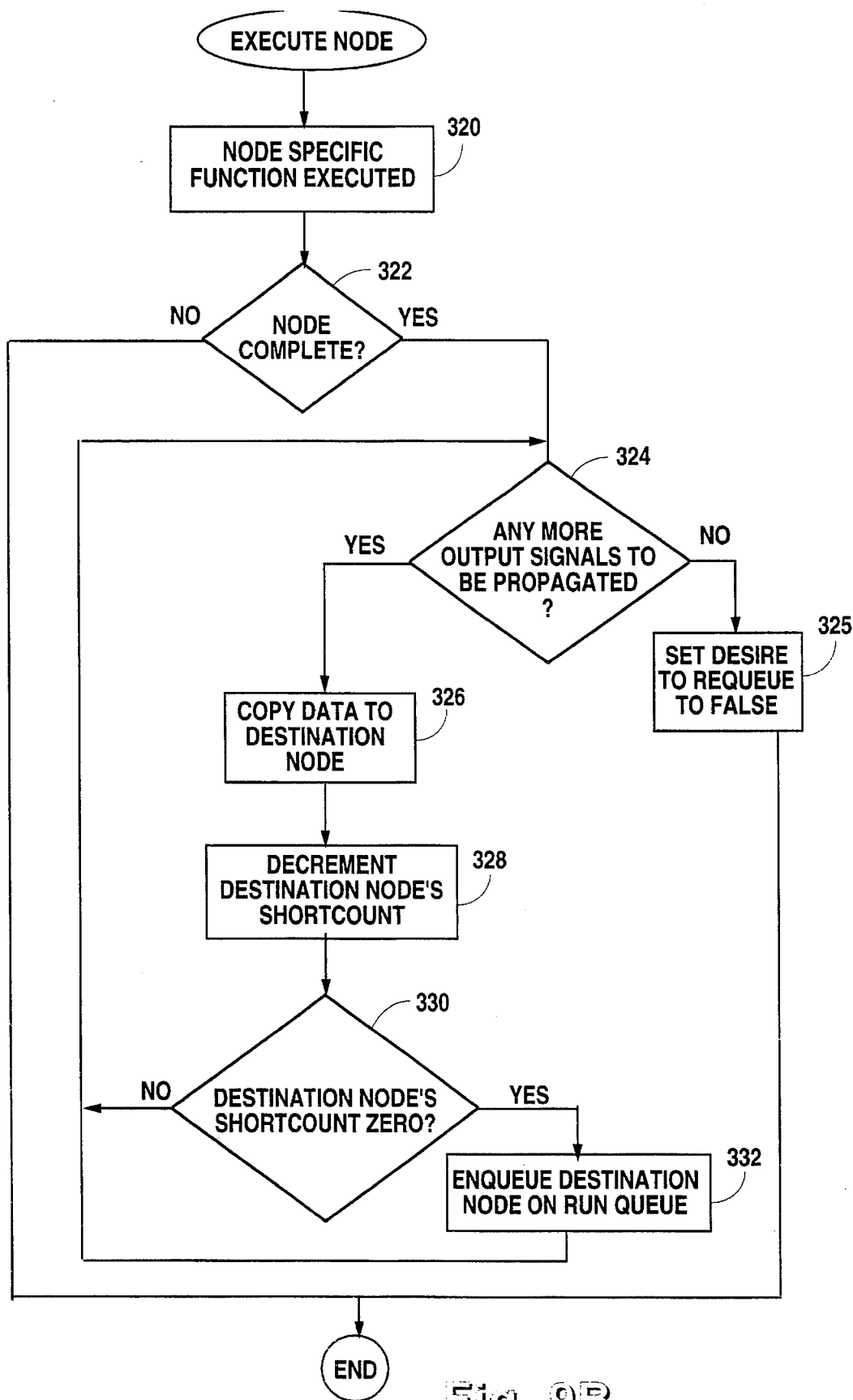

Referring now to FIG. 9B, a flowchart diagram illustrating operation of step 310, the execute node step, in FIG. 9A is shown. In step 320, the execution subsystem performs node specific functions, i.e., specific functions for the particular type or node being executed. As discussed further below, a plurality of different types of nodes can be placed on the run queue, including a self reference node, an instrument use node, a simple node such as a primitive node or code interface node, a loop structure node, a case structure node, a sequence structure node, an asynchronous node, and a long computational node. The specific functions performed by the execution subsystem for respective nodes are discussed further below with regard to FIGS. 9C–9K. When the node-specific functions have been executed in step 320, the execution subsystem 32 determines in step 322 if execution of the node has completed. If not, the subsystem 32 returns to step 312 and determines if the node should be re-queued on the run queue. If the node has completed in step 322, the subsystem 32 advances to step 324. In step 324 the execution subsystem 32 determines if the node being executed has any outputs that need to be propagated. If the node has any outputs then a certain number of those output signals will need to be propagated to subsequent nodes in the data flow diagram. If no more output signals need to be propagated, the execution subsystem 32 sets the desire to be requeued for that respective node to false in step 325 and returns to step 312. Since the node was determined to have completed step 322 and has propagated all of its signals in step 324, the node has completed all operations, and thus its desire to be requeued is set to false.

If the node does include more output signals which need to be propagated, the execution subsystem 32 advances to step 326 and copies the data that was computed in step 320 to destination nodes, i.e., nodes which receive the outputs of the respective node being executed as inputs. The destination nodes are the respective nodes which the outputs of the node being executed are connected to. In step 328 the execution subsystem 32 decrements the destination node's short count, which is described below.

Each node includes two count numbers referred to as a fire count and a short count. Each node's fire count refers to the number of inputs received by that node. Prior to execution of the block diagram, the node's short count is set to the respective node's fire count. For example, if a node has three inputs, the node's fire count would be three, and prior to execution the node's short count would also be set to three. As various output signals are produced which are received as inputs to that respective node, the short count is decremented until all inputs to that node have been received. When the node's short count has reached zero, then all inputs to that node have been received. When this occurs the node is ready for execution and thus can be placed on the run queue. In other words, a node can only be placed on the run queue for execution when all of its inputs have been received, i.e. all nodes having outputs connected to the inputs of the respective node have executed and have propagated their signals to the respective node. Thus, in step 326 when data is copied to a destination node, one of the inputs to that destination node has received its required data and thus the destination node's short count is decremented.

In step 330 the execution subsystem 32 determines if the destination node's short count has reached zero. If that node's destination short count has reached zero, then that destination node is enqueued on the run queue in step 332. The execution subsystem 32 then returns to step 324 to determine if any more output signals need to be propagated. If the respective destination node's short count has not reached zero in step 330, then that destination node is not enqueued on the run queue, but rather the execution subsystem 32 returns to step 324. The subsystem 32 continues to execute steps 324–332 as long as any output signals need to be propagated from the respective node.

Node Specific Function Execution

Referring now to FIGS. 9C–K, the node-specific function executed in step 320 of FIG. 9B depend on the type of node being executed. As previously discussed, there are a plurality of different nodes that can be executed, including a self-reference node, loop structure node, case structure node, etc. Each type of node includes a plurality of different starting points where execution can begin in step 320, these starting points being referred to as 0 for the initial starting point or initial execution of the node and 1 for a later starting point of execution in the node. The exception to this is the long computational node which includes three starting points referred to as 0, 1, and 2.

Self Reference Node Execution

Figure 9D:
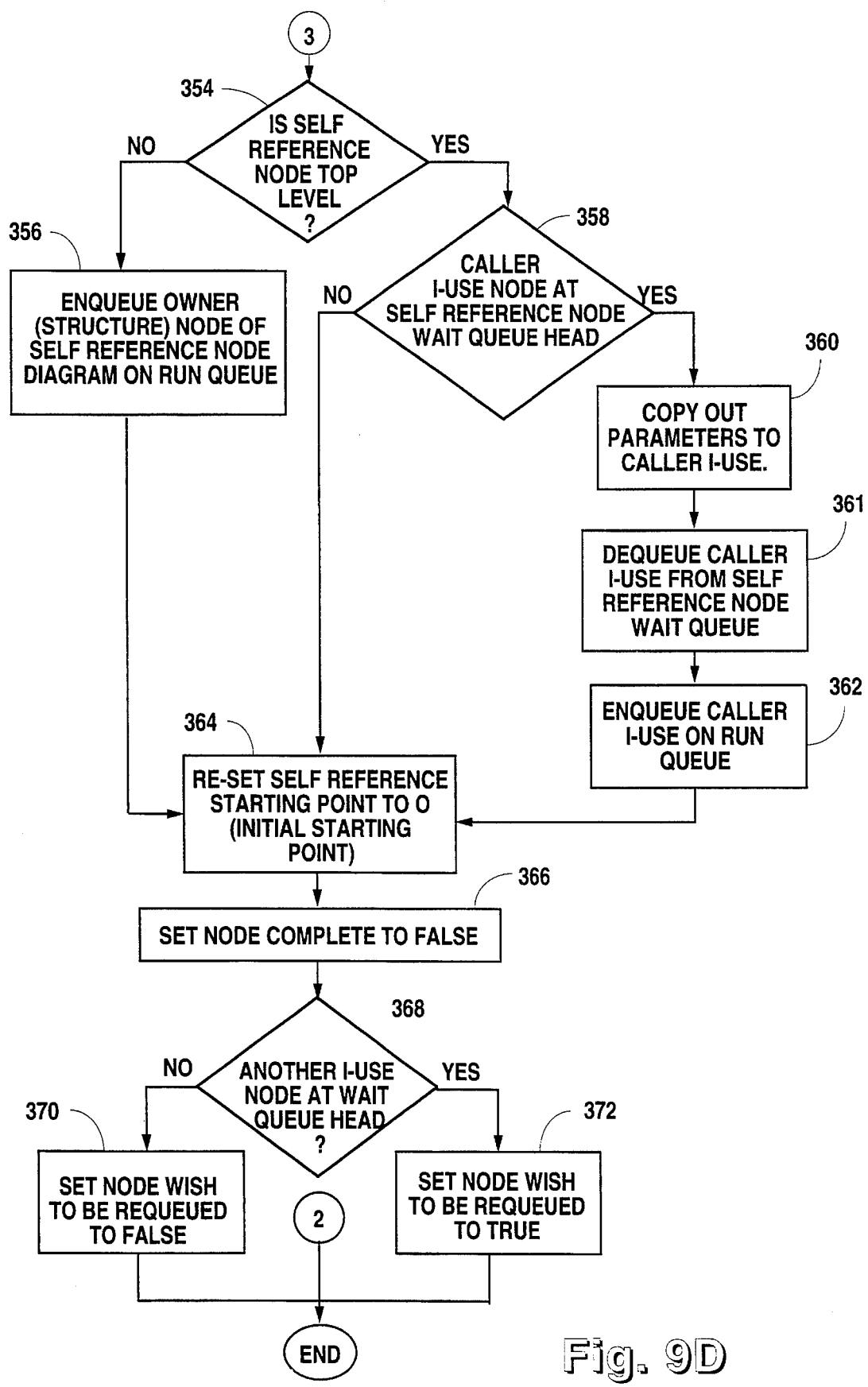

FIGS. 9C and 9D illustrate the steps performed if the node executed in step 320 is a self-reference node. In step 342, the execution subsystem 32 determines if this is the initial call to the 0 starting point of the self-reference node at the beginning of the respective diagram, or a call to the self-reference node at starting point 1 signifying the end of a diagram. Each VI, sub-VI, and loop diagram includes a self-reference node that is referenced when the diagram is entered to initialize the node and propagate signals to the node and also when the diagram is exited to place the node that called the self-reference node back on the run queue. In step 344 the execution subsystem 32 determines if the self-reference node being executed is a top level self-reference node, i.e., a self-reference node corresponding to a main block diagram. If not, the subsystem 32 advances to step 350. If so, the execution subsystem 32 advances to step 346 and determines if the self-reference node being executed was called as a sub-VI. If the self-reference node was determined to have been called as a sub-VI in step 346, then the execution subsystem 32 advances to step 348 and copies in the parameters from the instrument (I-use) node that called the self-reference node, referred to as the caller I-use node, which is at the head of the wait queue. The wait queue is described further below. The execution subsystem 32 then advances to step 350. If the self-reference node was not called as a sub-VI, the subsystem 32 advances directly to step 350.

In step 350 for each node comprised within the self-reference node's diagram, the execution subsystem 32 sets each node's short count to its fire count. In step 351 the execution subsystem 32 sets each node's starting point to its initial starting point, i.e. starting point 0. The subsystem 32 also sets the starting point of itself to its second starting point, starting point 1, in step 352. In step 353 the execution subsystem 32 sets node complete to true and returns to step 322. It is noted here that setting node complete to true where the node was entered at starting point 0 is different from all other nodes. With regard to all other nodes, node complete is set to true only at the last entry into the node. For a self-reference node, node complete is set to true in step 353 at starting point 0 of the node because it is necessary to propagate all signals to the nodes in the diagram associated with the self-reference node at the initial call to the self-reference node. With all other nodes, node complete is set to true after execution of the node, i.e., only after the last starting point of the node has been entered and the node has completed.

If the node-specific function is not an initial call to starting point 0 of the self-reference node in step 342, but rather enters at starting point 1, meaning the self-reference node is at the end of its respective diagram, then in step 354 the execution subsystem 32 again determines if the self-reference node corresponds to the diagram of a top level block diagram. If not, then the self-reference node corresponds to the diagram of a structure node such as a loop structure node, a case structure node, or a sequence structure node. The execution subsystem 32 advances to step 356 and enqueues the owning structure node of the self-reference node diagram on the run queue. The execution subsystem 32 then advances to step 364 and resets the self-reference node starting point to 0.

If the self-reference node does correspond to a top level diagram in step 354, then in step 358, the execution subsystem 32 determines if the caller I-use node is at the self-reference node wait queue head. Each self-reference node includes a wait queue where the I-use node corresponding to a call to the subVI is enqueued. This is for the situation where the self-reference node being executed corresponds to that of a sub-VI when it is called from an I-use node.

The wait queue is for the situation where a higher level VI (also referred to as a caller VI) includes one or more usages of a sub-VI, i.e. one or more instrument usage nodes (referred to as caller I-use nodes) for the same sub-VI. Where two or more usages of a sub-VI are comprised within a caller VI, it is imperative that only one usage of that sub-VI be executing at any one time (parallel or reentrant mode is discussed later). This is because each sub-VI includes its own block diagram having a corresponding self-reference node. Since there is only one self-reference node for the sub-VI (in serial node), only one version of that sub-VI can be running at any one time. Therefore, the execution subsystem must ensure that only one usage of a sub-VI executes from start to finish before another usage of the same sub-VI is initiated. In summary, since each sub-VI includes only one self-reference node in serial mode, only one usage of that sub-VI can execute at any one time, and thus the sub-VI includes a wait queue where calls to that sub-VI are placed to ensure that only one usage of the sub-VI is executing at any one time.

If the caller I-use node is not at the wait queue head in step 358, the execution subsystem 32 advances to step 364. If the caller I-use node is at the wait queue head, then the execution subsystem 32 advances to step 360 and copies out the parameters to the caller I-use node. The execution subsystem 32 then dequeues the caller I-use node from the self-reference node wait queue in step 361 and enqueues the caller I-use on the run queue in step 362. This completes a single usage of this VI as a subVI.

In step 364, the execution subsystem 32 resets the self-reference node starting point to starting point 0, i.e., the initial starting point. Thus, when the self-reference node is again called, it will be as if it were an initial self-reference node call in step 342. Upon completion of step 364, node complete is set to false in step 366, and the execution subsystem 32 determines if another instrument usage node is at the wait queue head in step 368. If not, then in step 370 the execution subsystem 32 sets the node wish to be requeued to false and returns to step 312. If another instrument usage node is determined to be at the wait queue head in step 368, then in step 372 the execution subsystem 32 sets the desire to be requeued to a true value and returns to step 312. In this instance, the diagram corresponding to the self-reference node has again been invoked, and thus the self-reference node needs to be requeued.

Instrument Use Node

An instrument use or usage node (I-use node) is used to call a sub-VI diagram, or more correctly is used to call the self-reference node of a sub-VI diagram. Referring now to FIG. 9E, a flowchart diagram illustrating operation of the instrument use node is shown. In step 382 the execution subsystem 32 determines if the I-use node is at starting point 0, i.e. this is the initial entry into the I-use node. If not, then in step 396 the execution subsystem 32 sets node complete to true. In this instance, this is the second call to the respective I-use node, i.e. the I-use node starting point is at 1. Thus node complete is set equal to true and the node completes. This will happen when the subVI has finished executing on behalf of this Instrument usage node.

If the I-use node is at its 0 starting point in step 382, then in step 384 the execution subsystem 32 sets the I-use node starting point to 1. This is done so that the next entry to this I-use node causes the decision in step 382 to be false. In step 386 the execution subsystem 32 queues the I-use node on the sub-VI diagram's self-reference node wait queue. This is a queue where the calling nodes wait their turn to run a respective sub-VI's top level diagram, i.e. a respective sub-VI. As previously noted, if multiple usages of the respective sub-VI or diagram appear in a caller top level block diagram, only one usage of the sub-VI or diagram can execute at any one time because each contains only self-reference node. Therefore, calling I-use nodes must wait their turn in the wait queue to be able to run a respective sub-VI.

In step 388, the execution subsystem 32 determines if the I-use node is at the head of the sub-VI self-reference node wait queue. If the I-use node is at the head of the self-reference node wait queue in step 388, then in step 390 it enqueues the sub-VI self-reference node on the run queue. The execution subsystem then advances to step 392. If the I-use node is not at the head of the wait queue in step 388, then the execution subsystem 32 advances directly to step 392. ( in this situation the subVI is already executing on behalf of another caller I-use node.)

In step 392, the execution subsystem sets node complete to false. Since this was the 0 starting point of the I-use node and the self-reference node was just placed on the run queue in step 390, node complete is set to false to enable the I-use node to be called again to complete operations at a later time when the subVI finishes executing on it's behalf. In step 394 the execution subsystem sets the desire to be requeued to false. In this situation, the sub-VI self-reference node has been placed on the run queue and is required to run before the instrument use node is again called at the end of the sub-VI self-reference node execution. Therefore, instead of setting the desire to requeue the I-use node to true, the sub-VI self-reference has the task of placing the I-use node on the run queue, which occurs in step 362 at FIG. 9D. The I-use node execution then completes.

Simple Node

Referring now to FIG. 9F, a flowchart diagram illustrating the execution of a simple node is shown. A simple node includes primitive nodes and code interface nodes. In step 398, the execution subsystem 32 performs the function indicated by the node. For example, if the node is a simple add or subtract node or an attribute node, bundle node, etc., the execution subsystem 32 performs the indicated operation. If the node being executed is a code interface node, then in step 398 the execution subsystem 32 invokes a text-based language routine previously created by the user which performs a desired function. In step 399 the execution subsystem 32 sets node complete to true. Thus, when the execution subsystem 32 returns to step 322 in FIG. 9B, the node's output signals will be propagated in steps 324–332.

Loop Structure Node

Figure 9G:
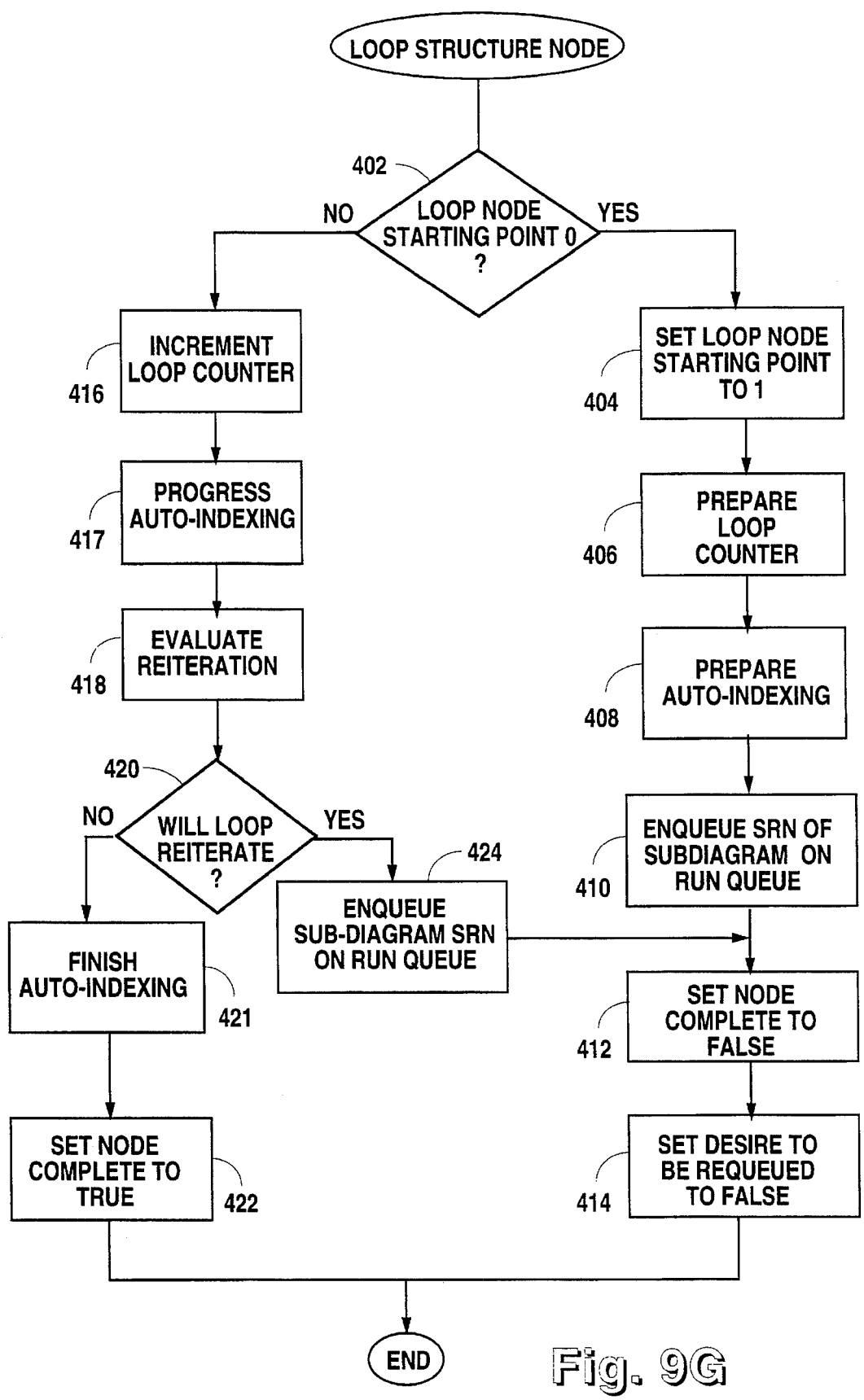

A loop structure node corresponds to an iterative loop structure node or an indefinite loop structure node, which are discussed with reference to FIGS. 12B and 12D. Referring now to FIG. 9G, if the node being executed in step 310 is a loop structure node, then the following node specific functions are executed in step 320. In step 402 the execution subsystem 32 determines if it has begun execution at the loop node's 0 starting point, i.e. the loop node's initial starting point. If so, then in step 404 the execution subsystem 32 sets the loop node starting point to 1. In step 406 the subsystem 32 prepares a loop counter and in step 408 prepares auto-indexing for the loop. Auto-indexing is a feature of loop structure nodes wherein arrays are indexed or accumulated at the loop boundary automatically. In step 410 the execution subsystem 32 enqueues the self-reference node (SRN) of the subdiagram on the run queue. In step 412 the subsystem sets node complete to false and in step 414 sets the node's desire to be requeued to false. The node's desire to be requeued is set to false because the node places itself back on the run queue in step 424, as discussed below.

If execution of the loop begins at starting point 1 and hence this is not the loop's initial starting point in step 402, then in step 416 the subsystem increments the loop counter to index into the loop. The execution subsystem 32 progresses auto-indexing in step 417 and evaluates the reiteration in step 418. In step 420 the subsystem 32 determines if the loop will reiterate. If not, then the loop is done, i.e., the loop has finished iterating, and the subsystem sets node complete to true in step 422 and returns to step 322 (FIG. 9B). It finishes the auto-indexing feature in step 421. Here it is noted that the node complete question in step 322 will be answered in the affirmative and thus the subsystem will advance to step 324 and propagate signals. If the loop has not completed and thus further iterations are determined to be required in step 420, then in step 424 the subsystem 32 enqueues the subdiagram self-reference node on the run queue in step 420 and advances to step 412. In steps 412 and 414, node complete is set to false and the desire to be requeued is also set to false. The execution subsystem then returns to step 322 (FIG. 9B). Here it is noted that the node complete question in step 322 will be answered in the negative, and thus the subsystem will return back to step 312 (FIG. 9A).

Case Structure Node

Figure 9H:
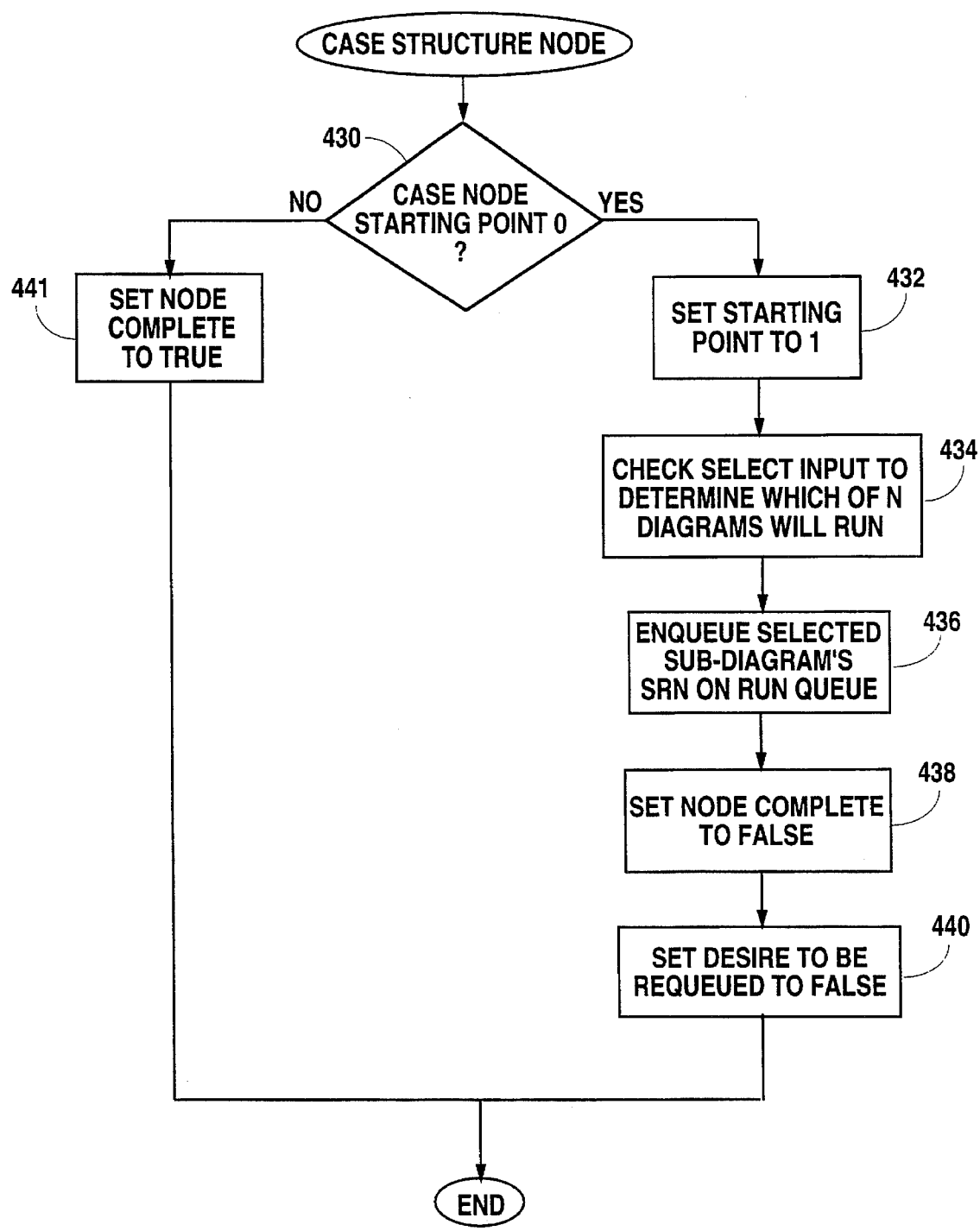
Figure 12A:
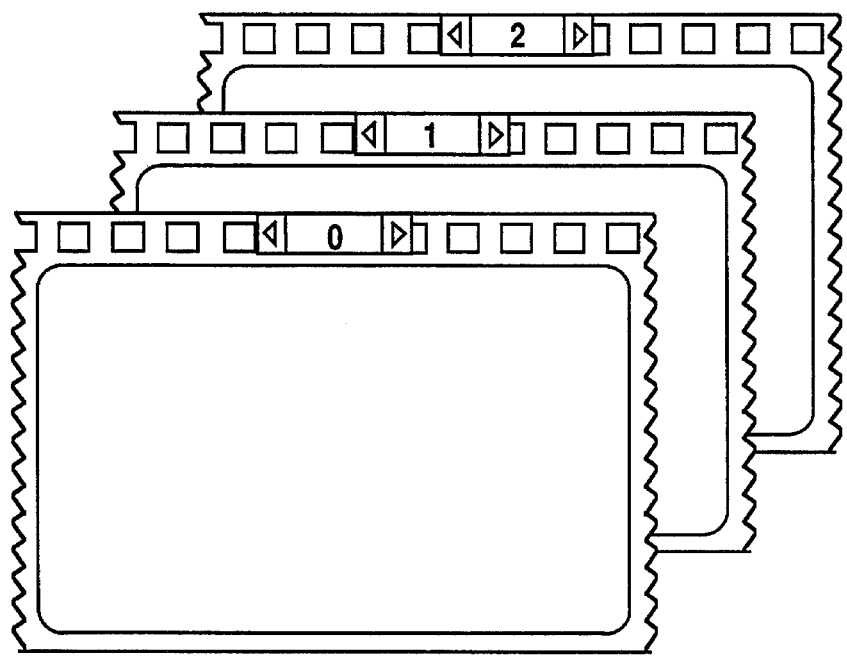
FIG. 12A shows a graphical representation of a sequence structure.
Figure 12B:
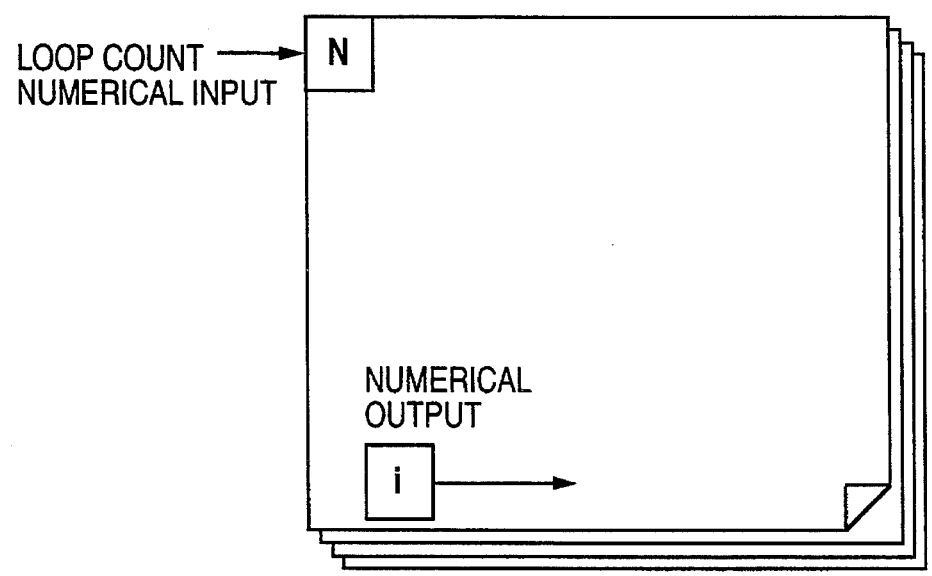
FIG. 12B shows a graphical representation of an iterative loop structure.
Figure 12C:
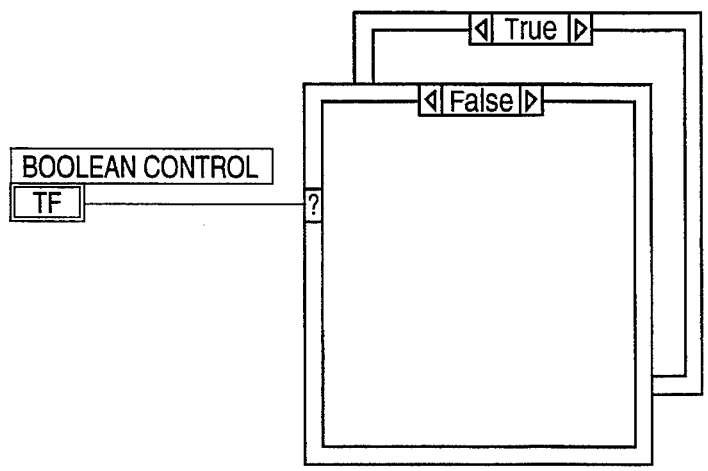
FIG. 12C shows a graphical representation of a conditional structure.

A case structure node corresponds to the conditional structure illustrated in FIG. 12C. Referring now to FIG. 9H, if the node being executed in step 310 is a case structure, then the node specific functions performed in step 320 are as follows. In step 430 the execution subsystem 32 determines if the case node has been entered at its 0 starting point, i.e. if this is the initial entry into execution of the case node. If so, then in step 432 the execution subsystem sets the starting point of the case node to 1. Thus, the next time the case node is entered, the question in step 430 will be answered in the negative. In step 434 the execution subsystem 32 checks the select input to determine which of the N diagrams will run. In other words, since a case statement includes a number of possible cases, one of which will be executed depending upon the select input, the input must be checked to determine which of the N diagrams in the case statement will be executed. In step 436 the subsystem enqueues the selected subdiagram self-reference node on the run queue. In step 438, the execution subsystem sets node complete to false and in step 440 sets the desire to be requeued to false. Execution then completes. If the case node starting point is determined to be 1 in step 430, then in step 441 the execution subsystem sets node complete to true and then completes.

Sequence Structure Node

Figure 9I:
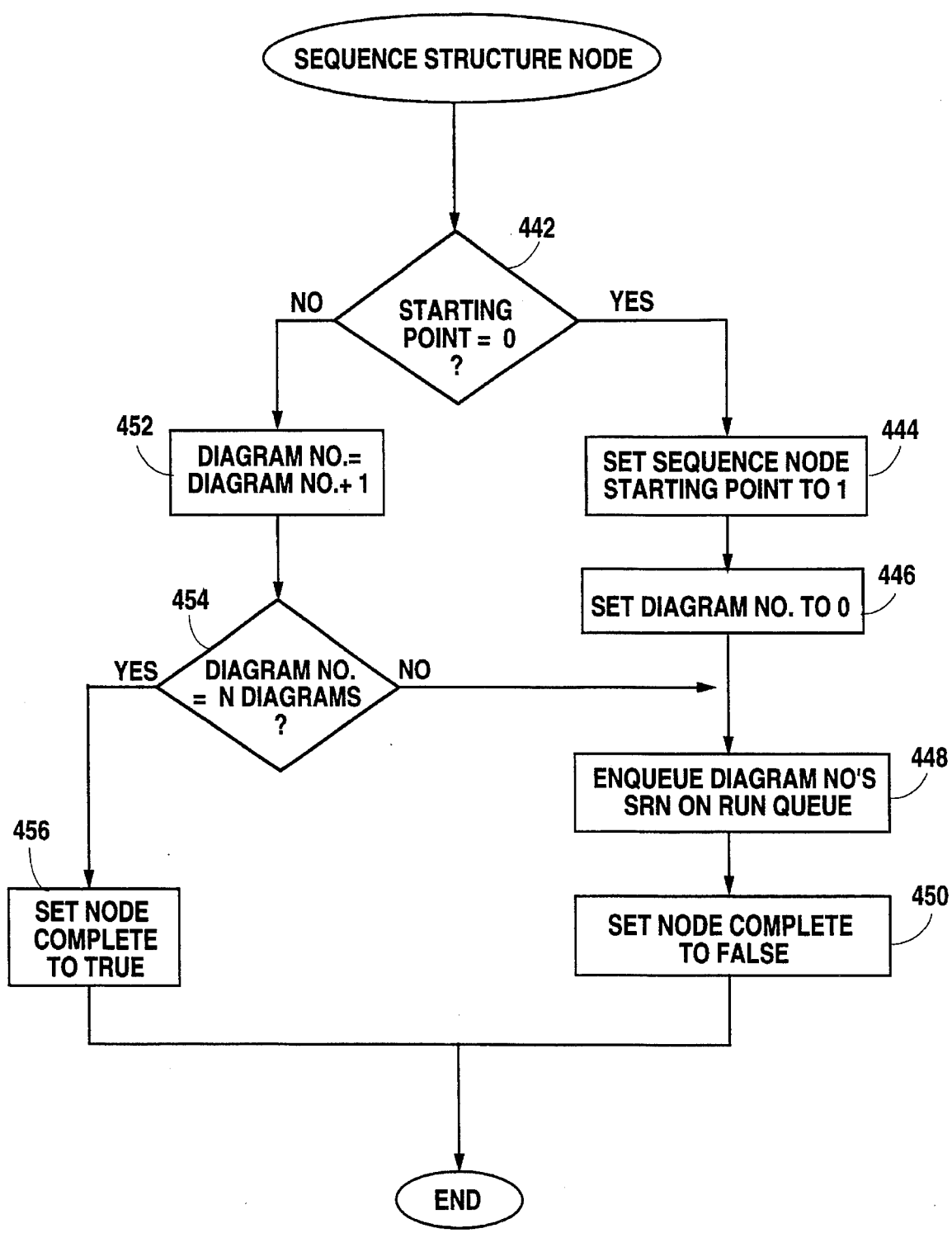

A sequence structure node corresponds to the sequence structure illustrated in FIG. 12A. Referring now to FIG. 9I, if the node executed in step 310 is a sequence structure node, then the following node specific functions are executed in step 320. In step 442, the subsystem determines if this is the initial starting point (starting point 0) for the sequence structure node. If so, then in step 444 the subsystem 32 sets the sequence node starting point to 1. In step 446 the execution subsystem 32 sets a variable referred to as Diagram Number to zero. The variable Diagram Number refers to the particular diagram of the sequence structure, which includes a plurality of diagrams. In step 448 the subsystem 32 enqueues the Diagram Number's self-reference node on the run queue. In step 450 the subsystem 32 sets node complete to false and completes.

If the entry into the sequence structure node is determined not to be the initial entry in step 442, but rather is determined to be entry at starting point 1, then in step 452 the subsystem 32 increments the variable Diagram Number by one. In step 454 the subsystem 32 then determines if Diagram Number is equal to N, i.e. if all the diagrams in the sequence structure node have been executed. If not, the execution subsystem 32 returns to step 448 and enqueues the self-reference node of the next Diagram Number on the run queue and sets node complete to false in step 450. If all the diagrams have been executed in step 454, then the subsystem 32 sets node complete to true and completes. It is noted that the node will be determined to have completed in step 322 (FIG. 9B), and thus the subsystem 32 will then proceed to step 324 to propagate its signals.

Asynchronous Node

Figure 9J:
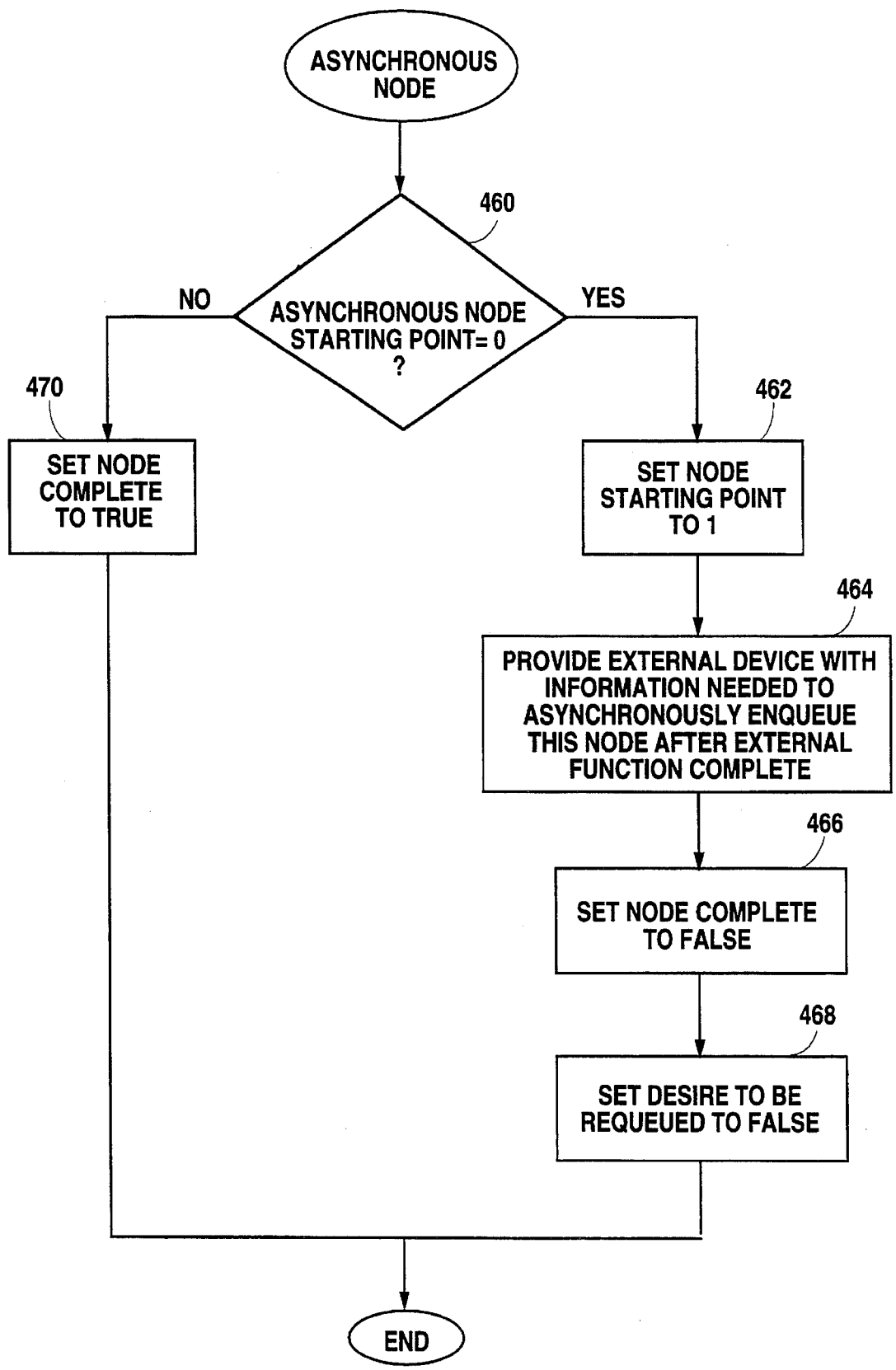

An asynchronous node is a node which is required to wait on external events before executing. Referring now to FIG. 9J, if the node executed in step 310 is an asynchronous node then the following node specific functions are executed in step 320. In step 460 the execution subsystem 32 determines if the asynchronous node has entered execution 32 at staging point 0. If so, then in step 462 the execution subsystem 32 sets the node staging point to 1 so that a subsequent entry into this node will affect a negative choice in step 460. In step 464 the execution subsystem 32 provides the respective external device with information needed to asynchronously enqueue this node after external functions have completed. For example, this external device may be a timer or a device driver or it may be another node if an occurrence has been set. For more information on occurrences, please see the discussion below on Improved Function Synchronization. In step 466 the execution subsystem sets node complete to false and then in step 468 sets the desire to be requeued to false. The node specific function for the asynchronous node then completes. At some later time after the respective external device has completed operations and has enqueued the asynchronous node, the asynchronous node will again be entered in step 460. If an occurrence has been set, the node will be re-entered in step 460 when the occurrence is triggered. For more information on this, please see the above-referenced application. When the node is re-entered, the asynchronous node starting point will be determined to be 1. When this occurs, node complete is set equal to true in step 470 and the node specific operation for the asynchronous node completes.

Long Computational Node

Figure 9K:
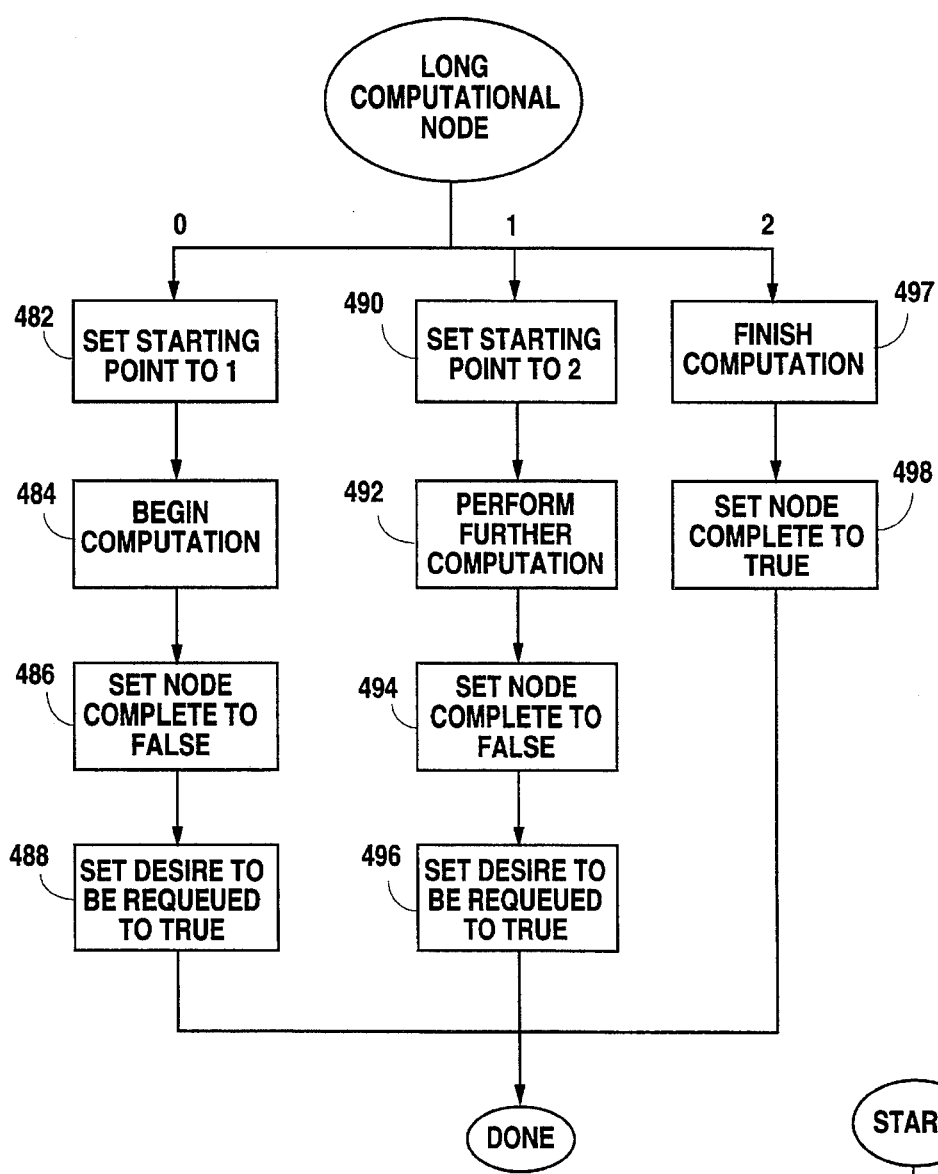

A long computational node can be described as a node which requires a large amount of computation and thus is required to share execution time with other nodes. Unlike other nodes, the long computational node includes any number of different starting points. In the example illustrated in FIG. 9K, the long computational node includes three different starting points referred to as 0, 1, and 2. Referring now to FIG. 9K, when the long computational node is first called, it enters at starting point 0, its initial starting point. In step 482 the execution subsystem 32 sets its starting point to a later point referred to as point 1. In step 484 the execution subsystem 32 begins computation on the long computational node, performing a portion of the computation required. In step 486 the subsystem sets node complete to false and in step 488 sets the desire to be requeued to true. The desire to be requeued is set to true because further computations are required to complete the node.

When the long computational node is again entered, it enters at point 1. As shown in step 492, the execution subsystem 32 sets the starting point to 2. In step 492 the execution subsystem 32 performs further computations on the node. In steps 494 and 496 the subsystem 32 sets node complete to false and sets the desire to be requeued to true, respectively.

When the long computational node is entered for a third time, it enters at starting point 2. In step 497, the subsystem 32 finishes computation on the node and in step 498 sets node complete to true. It is again noted that additional similar stages may be present and a long computational node with 3 stages is shown only as an example.

Starting a Top Level VI

Figure 9L:
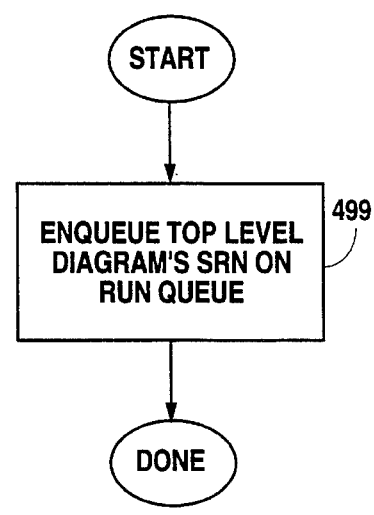

Referring now to FIG. 9L, a flowchart diagram illustrating operation of the routine which kicks off the first self-reference node of a large block diagram is shown. In step 499 the execution subsystem 32 enqueues the top level diagram's self-reference node on the run queue. This flowchart is necessary to place the first self-reference node on the run queue. Subsequent to this, the self-reference node places other nodes within respective self-reference node on the run queue. As data output signals are propagated, other nodes in turn are placed on the run queue and so forth. The operation in FIG. 9L is necessary merely to place the initial self-reference node in the run queue to "kick things off."

Execution Subsystem Operation Overview

The following description summarizes and further describes the operation of the execution subsystem 32 of the system 28 and the instrumentation system 56.

The first step in the execution of a virtual instrument is accomplished by executing its block diagram. The first step in the execution of a block diagram is accomplished by scanning the terminals contained in the diagram's self-reference node. For each terminal which is the source of a signal, the data token is moved from the control reference by the terminal to the terminal itself. The second step in the execution of a diagram is to initialize the token short-count of each node in the diagram to the number of input signals to that node, i.e. its fire count. The third step in the execution of a diagram is to propagate signals from the self-reference node. Propagation of signals from a node is accomplished by scanning all of the node's terminals. For each terminal that is source of a signal the data token on the terminal is copied to each destination terminal of the signal path. Each token placed on a destination terminal causes the short-count of the node containing the terminal to be decremented. If it becomes zero in the process, then that node is scheduled to execute.

The first step in the execution of a node is accomplished by copying the tokens from the node's terminals to the reference controls. The second step depends upon the type of node. For an instrument use node that references a real-time virtual instrument, the next execution step is to copy the tokens from the node's controls to the virtual instrument's controls and to execute the virtual instrument. For an instrument use node that references previously stored data of a virtual instrument, the tokens from the appropriate data record are read in and placed on the node's terminals. For a sequence structure node, the next step is to execute the first subdiagram. For a conditional structure node, the next step is to execute the subdiagram indicated by the value of the token on the selected control. For an iterative or indefinite loop structure node, the next step is to set the value of the token on the iteration number control to zero and to execute the subdiagram. For a self-reference node, the next step is to perform the next step in the execution of the node or the virtual instrument which contains the diagram that contains the self-reference node.

The third step in the execution of a node also depends upon the type of node. For an instrument use node or a conditional structure node the output data tokens are propagated along the signal paths. For a sequence structure node, the next subdiagram is executed, if one exists, and if not, the output tokens are propagated. For a loop structure node, the shift registers are clocked (the data is shifted), the iteration number incremented, and the subdiagram is reexecuted, if appropriate; otherwise the output tokens are propagated.

The second step in the execution of the virtual instrument is to log the tokens on the front panel controls if data logging is enabled. The third step in the execution of the virtual instrument is to copy the tokens from the virtual instrument's indicators to the instrument use node's output terminals and to schedule the instrument use node to execute its next step. The third step of virtual instrument execution is performed only if the virtual instrument was executed in response to an instrument use node request. If the virtual instrument was executed interactively, there is no third step.

Front Panel Generation

Figure 10:
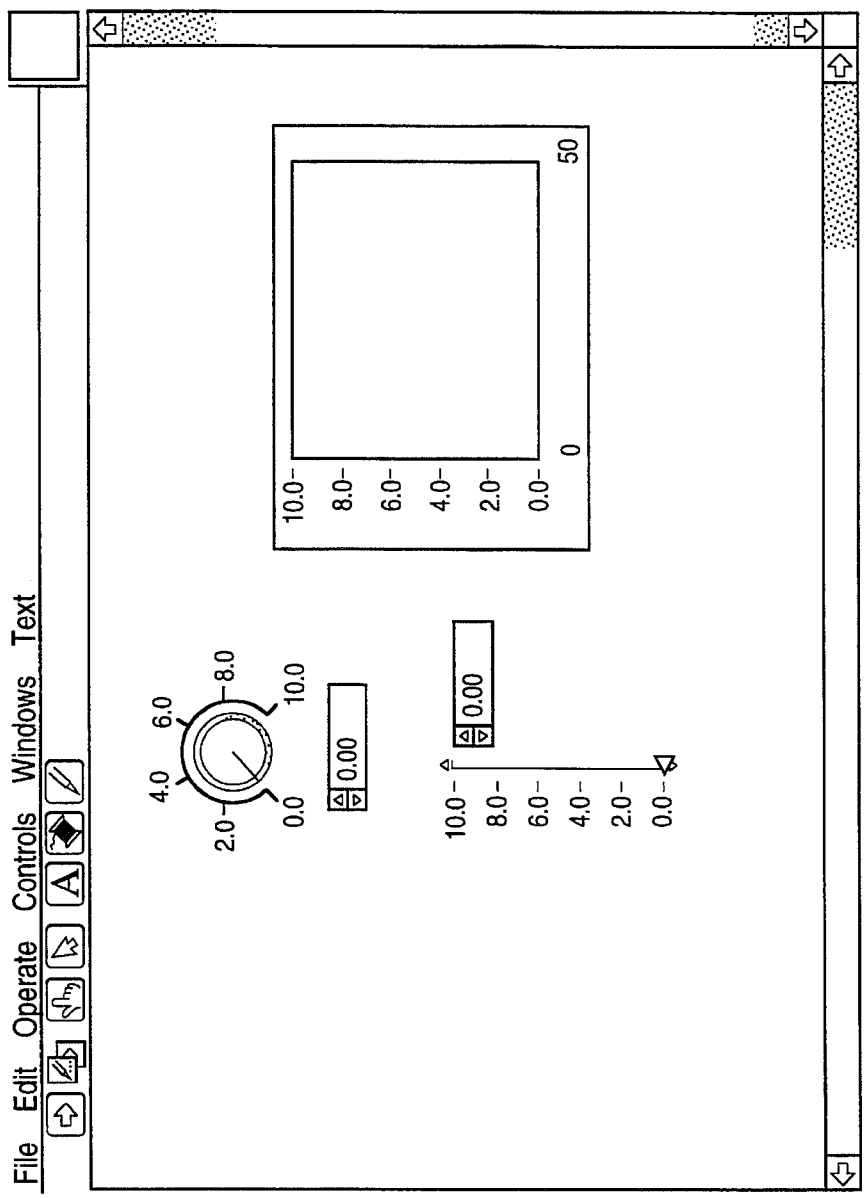
FIG. 10 shows an illustrative front panel produced using the front panel editor of the instrumentation system of FIG. 4.

FIG. 10 shows details of an illustrative front panel 62 which is produced using the front panel editor 36 and which is displayed using the keyboard-and display 58. It will be appreciated that the illustration of FIG. 10 represents an actual graphical computer-generated display of an exemplary front panel for the instrument 60. The graphical representation of FIG. 10 illustrates physical control dials and switches for providing variable input information and illustrates a coordinate plane type indicator for displaying variable output information. More particularly, FIG. 10 shows a circular turn-dial and a slide switch for setting input variable data. The turn-dial and slide switch each correspond to respective rectangular boxes for digitally illustrating variable input data in digital form. The illustrative front panel also includes a display for illustrating variable output data. The graphical representations of input controls and output indicators are stored in a memory library, and a user may select from among a variety of different graphical representations of input controls and output indicators in order to construct a panel display which conforms to a user's intuitive understanding of how the instrument 60 is controlled and how it provides data.

Figure 11:
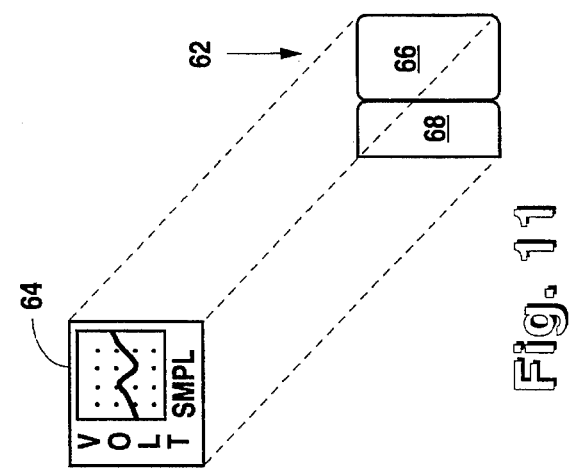
FIG. 11 shows an illustrative icon produced using the icon editor of the instrumentation system of FIG. 4.

FIG. 11 illustrates an icon 64 which can be used to reference a front panel (not shown). A visual representation of the icon 64 can be produced using the icon editor 34. The icon 64 corresponds to a particular front panel (not shown). As will be explained more fully below, the icon 64 can be used as a building-block in a hierarchical system constructed using the block diagram editor 30. The dashed lines of FIG. 11 indicate the one-to-one correspondence between the icon 64 and the respective two-dimensional regions (or hot spots) 66 and 68 which correspond to respective variable input data and variable output data illustrated by controls and displays of the corresponding front panel (not shown). For example, the front panel might include input data in the form a sequence of samples and might provide output data in the form of an indicator showing voltage reading per sample. The icon 64 then might be divided into two-dimensional regions 68 and 66 which respectively correspond to the input sample count and the voltage reading for that sample count.

Structure Nodes

Figure 12D:
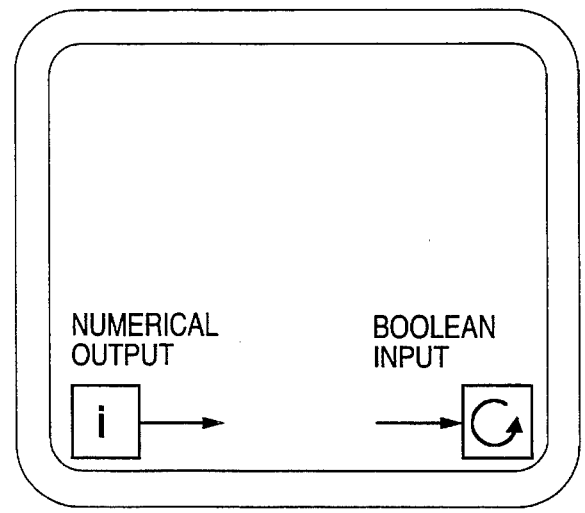
FIG. 12D shows a graphical representation of an indefinite loop structure.
Figure 12E:
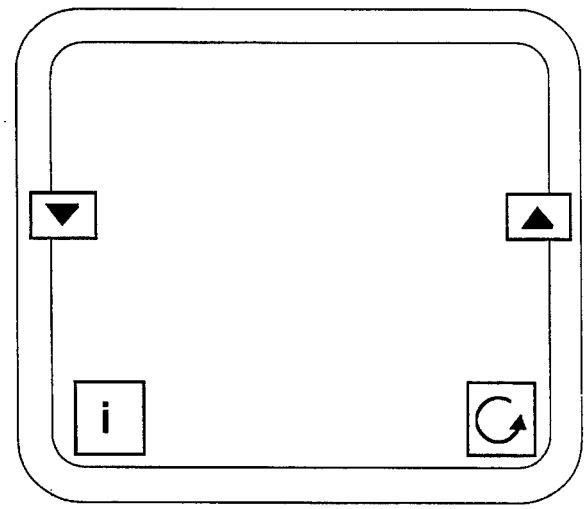
FIG. 12E shows a graphical representation of shift registers on the indefinite loop structure of FIG. 12D.

The drawings of FIGS. 12A–E show the graphical representations of structures utilized in constructing a block diagram as described below using the block diagram editor 30. The structures represented in FIGS. 12A–E substantially facilitate the application of data flow programming techniques which are used in the preferred embodiments of the present invention. FIG. 12A illustrates a sequence structure. FIG. 12B illustrates an iterative loop structure. FIG. 12C illustrates a conditional structure. FIG. 12D illustrates an indefinite loop structure. FIG. 12E illustrates a shift register on an indefinite loop structure.

It will be appreciated that the graphical representations of the structures illustrated in FIGS. 12A–E can be stored in a memory library as can execution instructions corresponding to the respective structures. Thus, a user can call upon a graphical structure library in order to display any one or more of the structures using the display facilities of the control processor 38 and keyboard and display 58 of the instrumentation system of FIG. 4.

Sequence Structure

The sequence structure, which has its graphical representation illustrated in FIG. 12A, serves to divide a data-flow diagram into two subdiagrams, one representing an inside and another representing an outside of the sequence structure borders. The outside diagram behaves exactly as if the sequence structure and its contents were replaced by an icon with a terminal (or hot spot) for each line crossing the sequence structure border. The drawing of FIG. 12A shows a three-diagram sequence. In order to minimize space used on a computer console screen, only one diagram of the sequence structure is visible at a time. Inside the structure border, multiple diagrams (not shown) can be constructed which execute in sequence. The sequence of diagrams are indicated by the respective numbers in the respective sequence diagrams. When the first diagram (indicated by the number 0) in this sequence completes its execution, the next one begins. The process is repeated until all diagrams in the sequence have been executed.

Each diagram in the sequence uses a subset of incoming signal paths and produces a subset of outgoing signal paths (the outgoing subsets must be mutually exclusive, but the incoming subsets are arbitrary). Constants may be used with any of the diagrams without any constraints. Sequence variables indicated by rectangular boxes attached to the inside edge of the sequence structure (not shown in FIG. 12A) can be used multiple times in the diagrams following the diagram where the variable was assigned.

In accordance with data-flow principles used in the preferred embodiments of the present invention, the sequence structure does not begin execution until all incoming signal paths have data available, and none of the outgoing signal paths produce data until all diagrams have completed execution.

Figure 13:
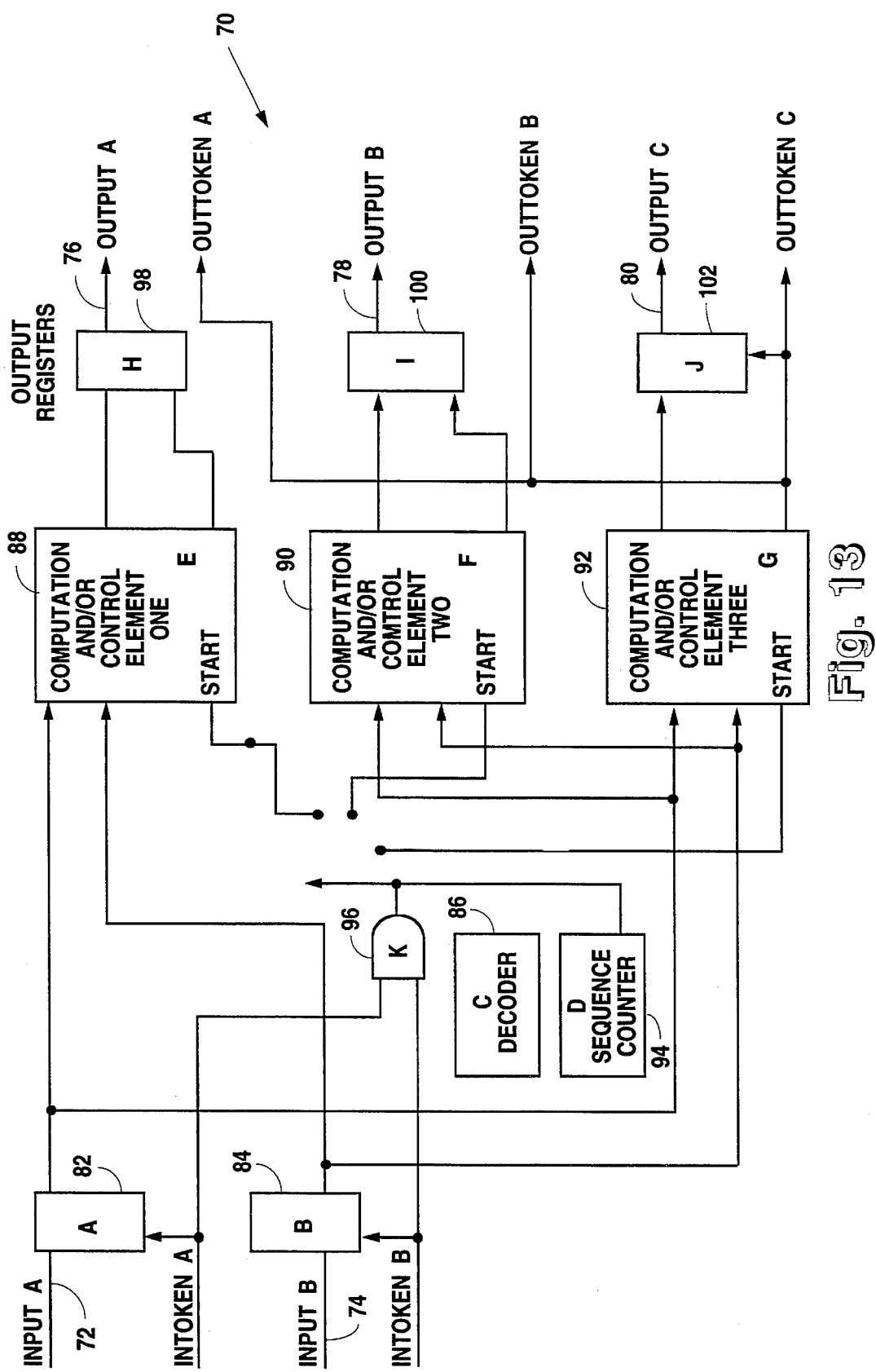
FIG. 13 shows an illustrative block diagram generally corresponding to the graphical representation of a sequence structure shown in FIG. 12A.

FIG. 13 shows an illustrative block diagram 70 of a sequence structure. The sequence structure is coupled to receive input signals on respective lines 72 and 74 and to provide respective output signals on respective lines 76, 78, and 80. Input registers 82 and 84 are provided to collect input data. A decoder 86 is provided to determine which computation and/or control element 88, 90, or 92 to select, and a sequence counter 94 is included to undertake a count for sequencing between respective elements 88, 90, and 92. When all data inputs are present, an output of AND gate 96 becomes TRUE. This starts computation in computation and/or control element 88 (assuming that it is the first element selected). When the control element 88 has completed computation, its output is stored in register 98. When the first element 88 has completed computation, the sequence counter 94 is free to advance by one. The decoder 86 will select the second computation element 90. The output of AND gate 96 will become TRUE again and, computation will begin in the second element 90. the output of the second element 90. The output of the second element 90 will be stored in output register 100. The sequence repeats for the third element 92, and its output is stored in output register 102. After the completion of the computation by the third element 92, the output data from all computations will be available for further computation by other instruments (not shown) of a block diagram system as will be explained more fully below.

Iterative (For) Loop Structure

The iterative loop structure, a graphical representation of which is shown in FIG. 12B is similar to the sequence structure in that the iterative loop structure partitions the data-flow graph into two pans. The interior diagram contains the-body of the loop. Signal paths crossing the border of an iteration loop structure typically have a transformation applied. Incoming data are indexed in the most significant dimension so that the data inside the structure have dimensionality one less than outside. Outgoing data has the inverse transformation performed. The iterative loop structure is similar in operation to a for-next loop in a text-based program.

It is possible to disable the indexing on a signal path, in which case, the data behaves as if it were a constant available to each iteration. If indexing is disabled on an outgoing signal path, the data value is repeatedly overwritten and only the last value propagates out from the iteration structure.

There are two special variables which behave as constants within the body of the iterative loop structure: the number of iterations, N, and the iteration number or index, i. Usually, the number of iterations to be executed is automatically set by the size of the dimension being indexed for an incoming signal path (or the minimum of the indexed dimension sizes of all the incoming signal paths if there are more than one). In the event that there are no incoming signal paths, a scalar value must be specifically connected to the variable to specify the number of iterations. The iteration number, i, is similar to a constant within the diagram except that its value is 0 for the first iteration and increments by 1 at the end of each iteration.

Iteration Structures that have no data dependencies can, in principle, be executed in any order or completely in parallel except in the case where a non-reentrant virtual instrument is used by more than one structure. An example of a non-reentrant virtual instrument is a VI which controls an instrument or data acquisition card. In that case, the iteration structures would be executed strictly sequentially, in accordance with data flow principles. All inputs must be available to start execution of an iteration loop. Furthermore, all outputs are generated after execution completes.

Figure 14:
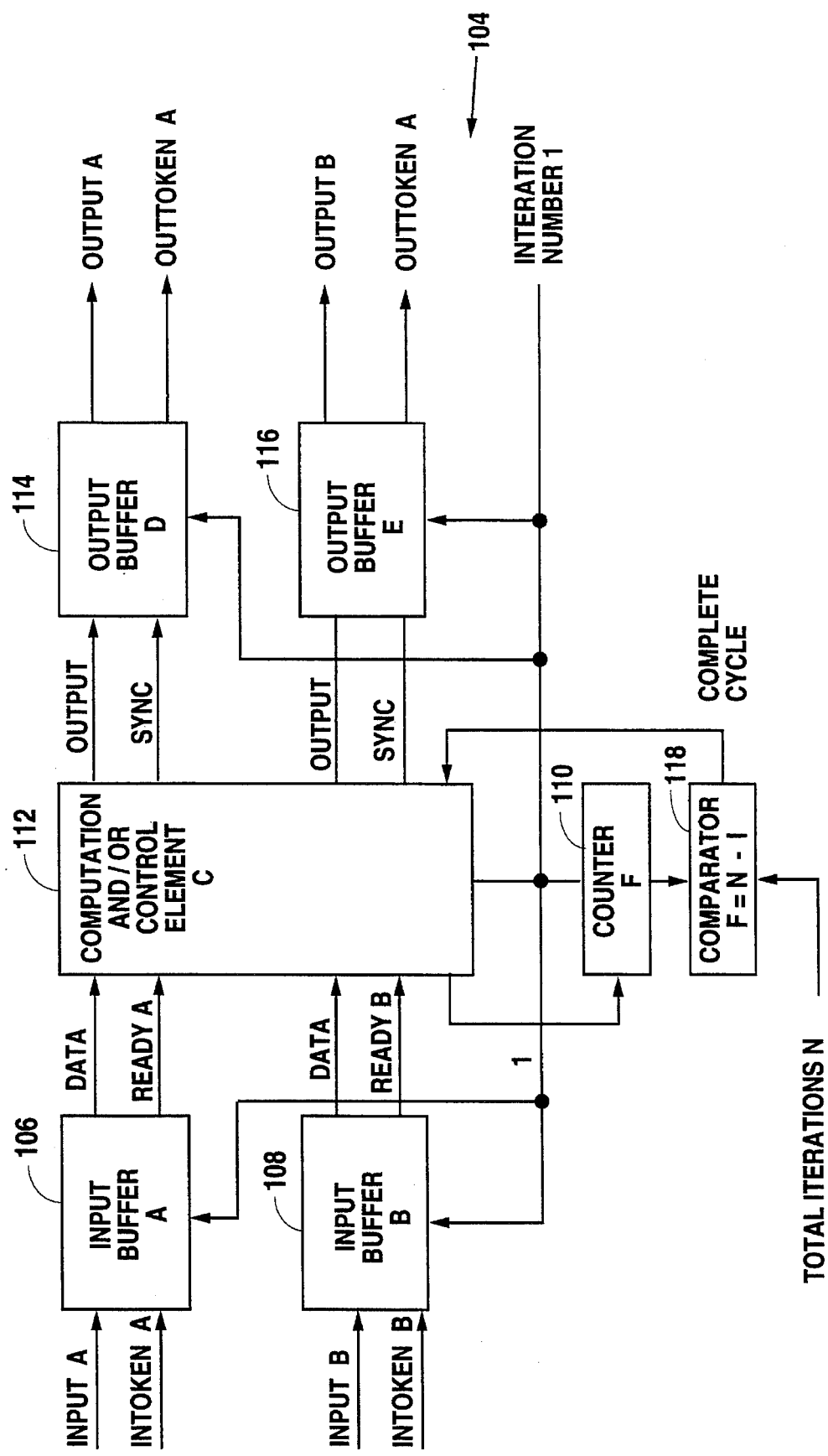
FIG. 14 shows an illustrative block diagram generally corresponding to the graphical representation of an iterative loop structure shown in FIG. 12B.

Referring to the illustrative drawings of FIG. 14, there is shown a block diagram 104 for an iterative loop. An iterative loop structure operates on data in an array one element at a time. The data for each element are sequentially stored in respective input buffers 106 and 108. A counter 110 begins its count at 0. When the first data elements are available for both inputs of both respective input buffers 106 and 108, computation and/or control element 112 will generate outputs to be stored in respective output buffers 114 and 116. At that time, the counter 110 will advance to 1, and the process will repeat for the second data element in the array. This process will repeat until the counter 110 reaches N-1 making a total of N computations. At that time a complete cycle signal will be generated by the comparator 118. The output signals stored in the respective output buffers 114 and 116 then will be available for use by other computation instruments (not shown).

Conditional Structure

The conditional structure, a graphical representation of which is shown in FIG. 12C, is similar in appearance to the sequence structure in its use of screen space, but it differs in its handling of signal paths crossing its border in that in each case a diagram may use any subset of incoming signal paths, but must produce all outgoing signal paths. In accordance with data-flow principles, all inputs must be available in order to start execution. Furthermore, all outputs are generated after execution is completed. The conditional structure is similar in operation to a case or switch statement used in certain text-based programming environments.

There must be a signal path that terminates at the case-selection terminal on the structure border. In the simplest case, a Boolean-valued scalar is connected to the selector to select between case FALSE and case TRUE. In the general case, a scalar number is connected to the selector to select among diagram case 0, case 1, etc.

Figure 15:
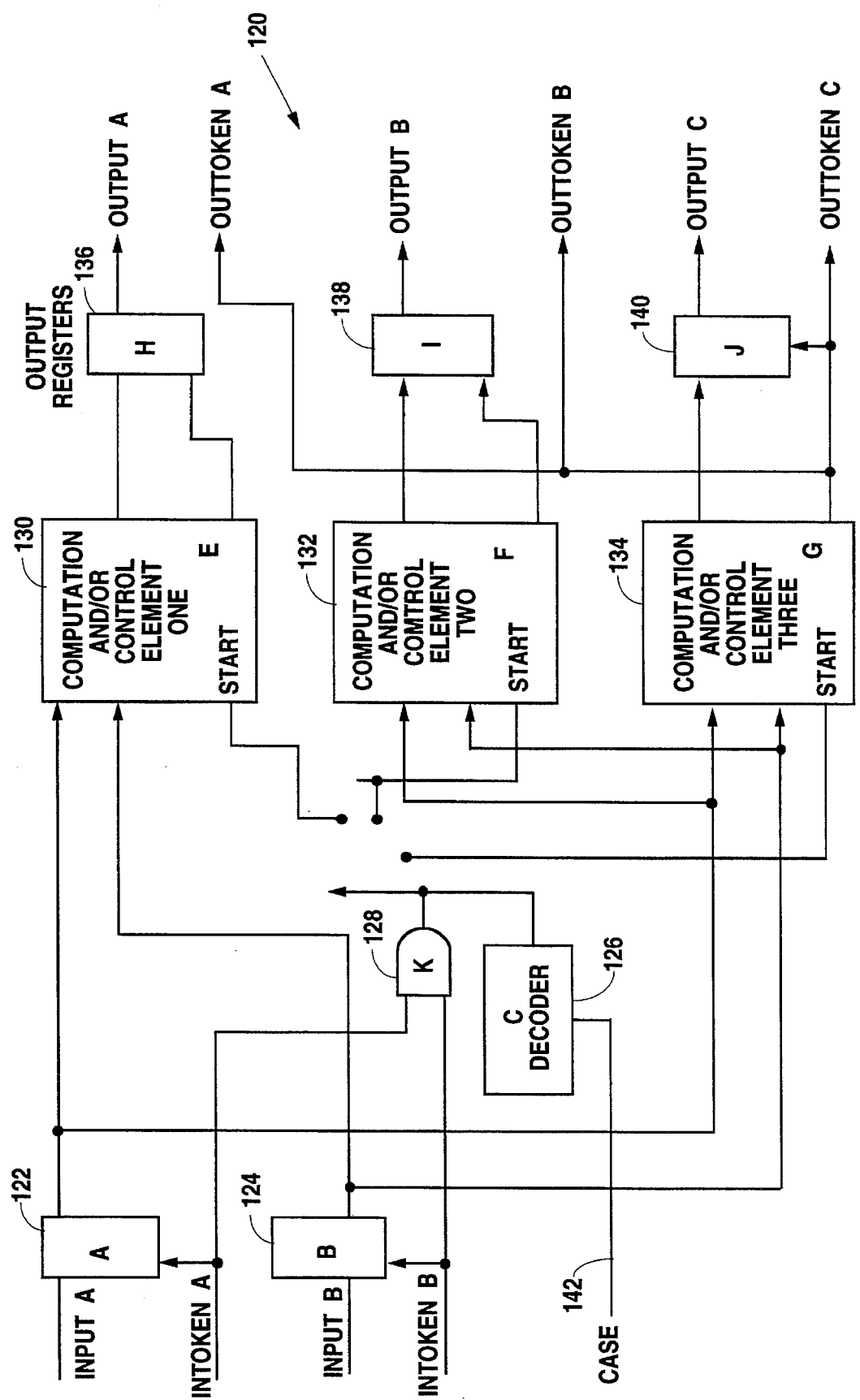
FIG. 15 shows an illustrative block diagram generally corresponding to the graphical representation of a conditional structure shown in FIG. 12C.

The drawings of FIG. 15 illustrate a block diagram 120 corresponding to a conditional structure. The block diagram 120 for the conditional structure is substantially similar to that of the block diagram 70 for the sequence structure. The block diagram 120 for the conditional structure includes respective input registers 122 and 124, a decoder 126, an AND gate 128, three respective computation and/or control elements 120, 132, and 134 and three respective output registers 136, 138, and 140 all coupled as shown in the drawings of FIG. 15. In operation, the conditional structure block diagram 120 operates in a manner substantially similar to that of the sequence structure block diagram 70, except that the decoder 126 of block diagram 120 is directly controlled by the case selection input provided on line 142 to select only one diagram.

Indefinite (While) Loop Structure

The indefinite loop structure, a graphical representation of which is shown in FIG. 12D, is similar in concept to the iterative loop structure in that the interior of the structure diagram represents the body of the loop, but it differs in that signal paths crossing the border of the indefinite loop structure do not usually have an indexing transformation applied. The indefinite loop structure is similar to a do-while loop in text-based programming languages.

There are two special variables applied within the body of the indefinite loop structure: iteration number or index, i, and continuation flag. The iteration number starts at zero and increments by one at the end of each iteration. A boolean value or expression is connected to the continuation flag. A value of TRUE means that another iteration will be performed. If the continuation flag is left unconnected, it is equivalent to connecting a FALSE constant. In accordance with data-flow principles applied in the preferred embodiments, all inputs must be available in order to start execution. Furthermore, outputs are generated after execution is complete.

Figure 16:
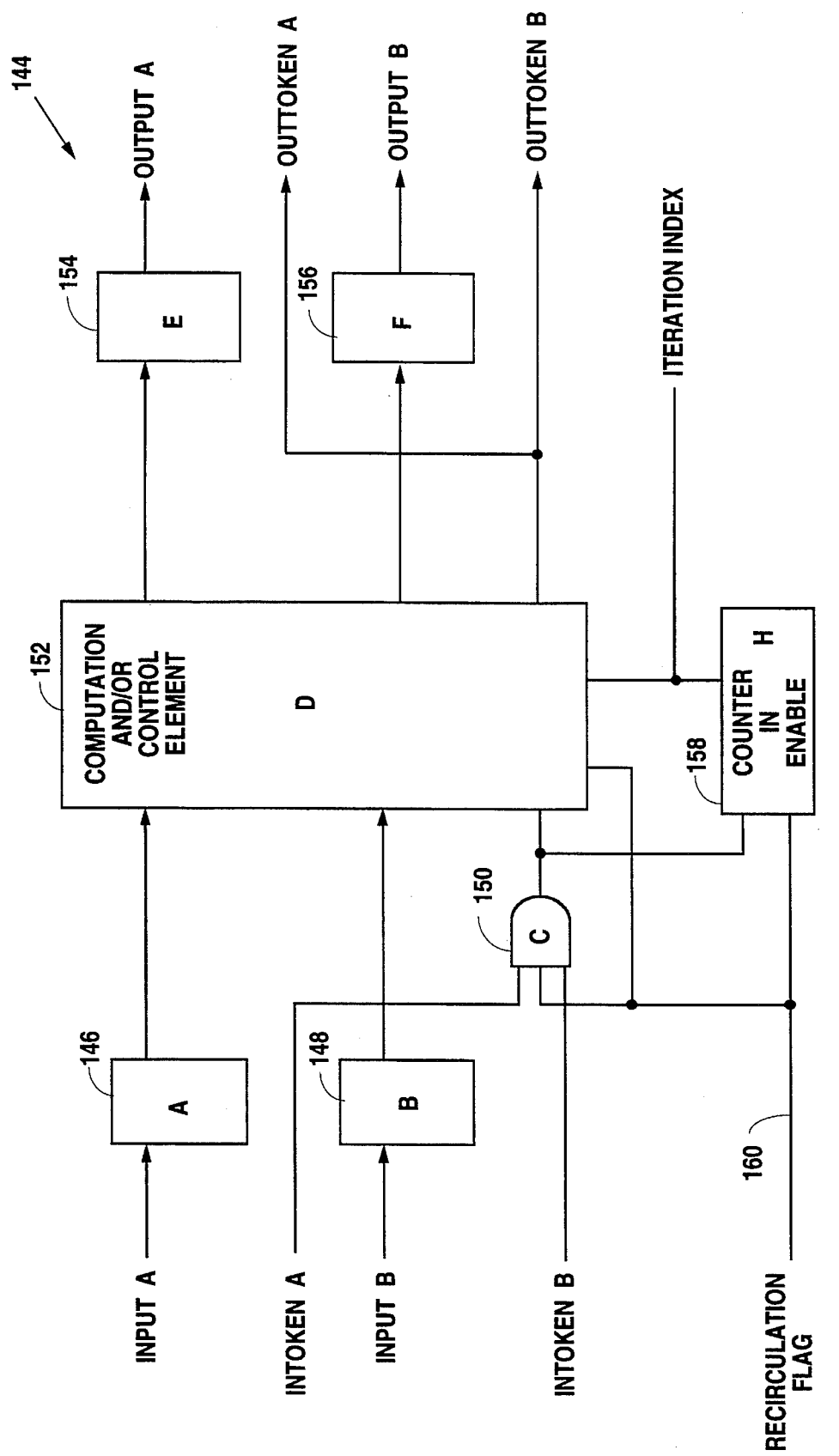
FIG. 16 shows an illustrative block diagram generally corresponding to the graphical representation of an indefinite loop structure shown in FIG. 12D.

The illustrative drawing of FIG. 16 shows a block diagram 144 which corresponds to the graphical representation of an indefinite loop structure shown in FIG. 11. In operation, when data inputs are available on both respective input registers 145 and 148, an output of AND gate 150 will become TRUE to enable computation and/or control element 152. After computation is complete, output data are stored in respective output registers 154 and 156. After completion of the first loop, counter 158 increments, and the cycle begins again. This process continues until a continuation flag provided on line 160 goes FALSE. The output data are present after each cycle.

Shift Register

A special construction available for use only within the respective loop structures is the shift register. A graphical representation of each respective loop structure type incorporating a shift register is shown in FIG. 12E. The shift register eliminates the need for cycles in a data-flow graph, making the result easier to comprehend and to prove correct. The shift register behaves as if it were an ordered set of two or more variables, all of the same type and dimensionality.

The first variable in a set is an output of the loop-body diagram and is located on the right border of the loop structure. The other variables of the set are inputs to the loop-body diagram and are located on the left border of the structure at the same elevation.

At the conclusion of each loop iteration, the data from the shift register output variable are shifted into the first input variable, and the previous value of the first input variable is shifted into the second input variable.

Figure 17:
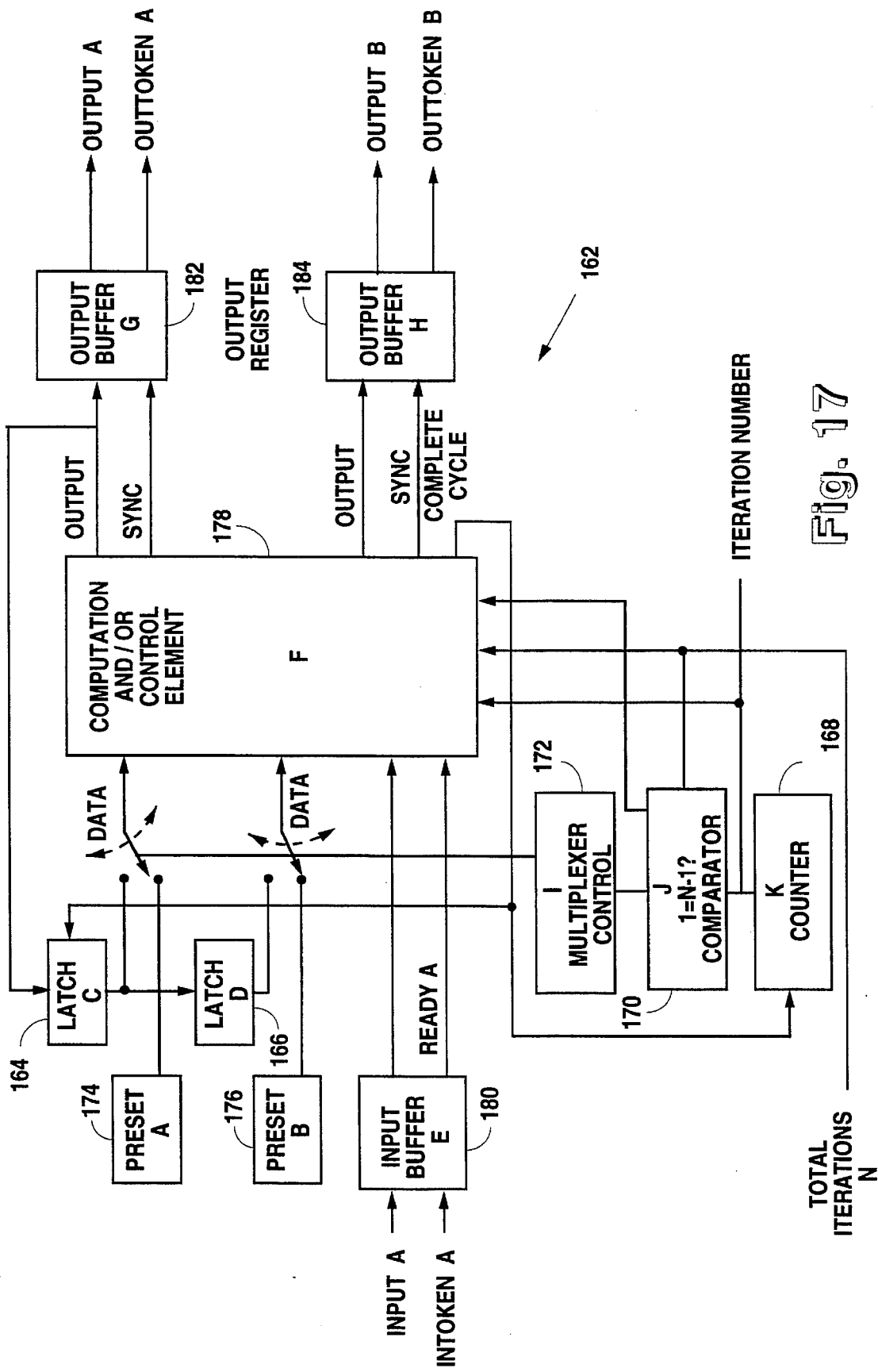
FIG. 17 shows an illustrative block diagram generally corresponding to the graphical representation of an iterative loop structure including a shift register shown on the left in FIG. 12E.

The drawing of FIG. 17 shows an illustrative block diagram 162 illustrating operation of an iterative loop structure including a shift register. Respective latches 164 and 166 are provided to implement the shift register. In operation, the block diagram 162 of FIG. 17 (which represents an iterative loop structure with a shift register) operates similarly to the block diagram 104 of FIG. 14 (which represents an iterative loop structure minus a shift register) except that computation inputs are provided which give the system feedback from a previous cycle.

An output provided by loop counter 168 is sensed by the comparator 170. For the first loop, the multiplexor control 172 selects preselect inputs from respective preset gates 174 and 176. For all other cycles, respective latches 164 and 166 are selected. The selected input is fed into the computation and/or control element 178. data from input buffer 180 also is fed into the computation element 178. After each cycle, the computed output data are fed into respective output buffers 182 and 184. When the comparator 170 reaches N-1, the process is completed, and the output data can be passed to a next instrument (not shown).

Type Descriptors

The system and method according to the preferred embodiment uses type descriptors to describe the contents of clusters and arrays. A type descriptor is essentially a language or grammar for describing data types used in the preferred embodiment. Referring now to FIG. 18, a diagram illustrating a type descriptor for a cluster containing an integer, a string, a character, and a float is shown. The block diagram editor encodes this cluster in the following manner. The first three elements in the type descriptor are a size word representing the size of the cluster, 22 bytes in this example; a word containing the number 50 representing a cluster code; and a word containing 4 for the number of elements within the cluster. The next word contains the number 4 representing the size of the first element of the cluster in bytes followed by the code of the first element of the cluster, an integer, which is encoded as a 3. The next element in the cluster also has a size of 4 bytes and it is a type string, which is encoded as a 30. Thus the next element is encoded as 4, 30. The third element has a size of 4 and is a character, so it is encoded as a 4, 1. The last element has a size of 4 and is encoded as a 10. Therefore, in summary, the type descriptor includes elements for size, data type code, and number of elements, as well as a size and code for each of the elements in the data structure.

Construction of an Exemplary Block Diagram

FIGS. 19A–K illustrate computer screen displays during each successive step in a construction of an exemplary block diagram using the block diagram editor 30 such as that of FIGS. 2 or 4. In FIGS. 19A–D, the front panel window appears on the left and the block diagram window appears on the right.

Figure 19A:
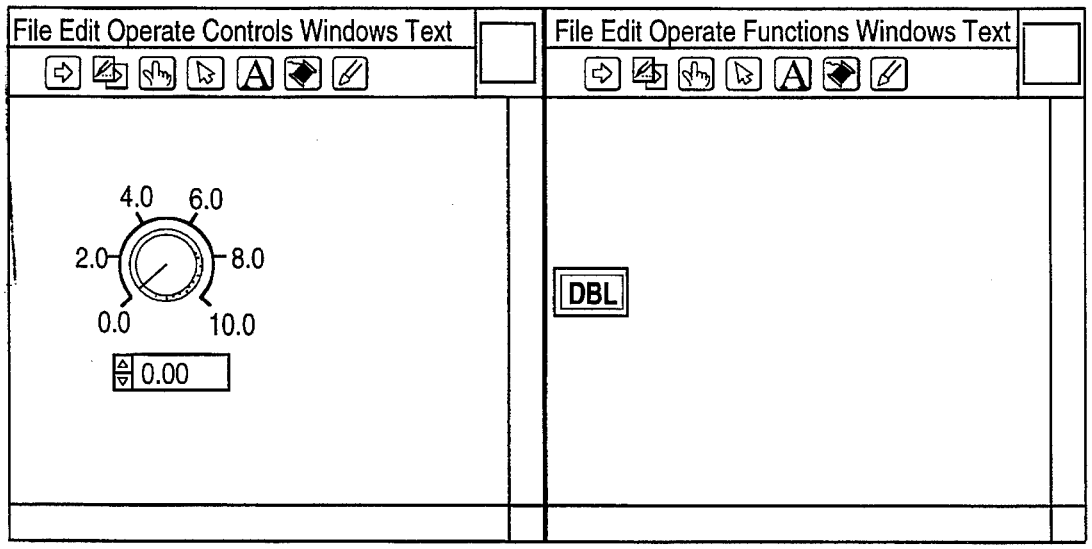
FIGS. 19A–K illustrate computer video displays during each successive step in a construction of an exemplary block diagram using the block diagram editor of FIGS. 2 or 4.
Figure 20A:
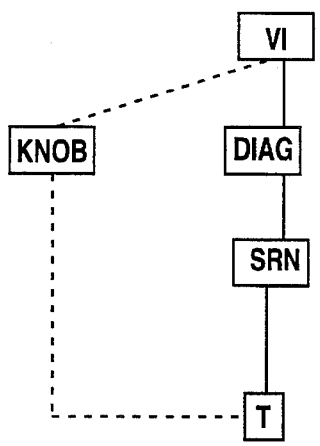
FIGS. 20A–C illustrate a system representation corresponding to FIGS. 19A–D.

More particularly, in FIG. 19A, a control knob is placed in the front panel, and its associated terminal automatically appears in the block diagram. Referring to FIG. 20A, the system representation shows the virtual instrument with a diagram containing a self reference node, and a terminal in the self reference node which references the front panel control.

Figure 19B:
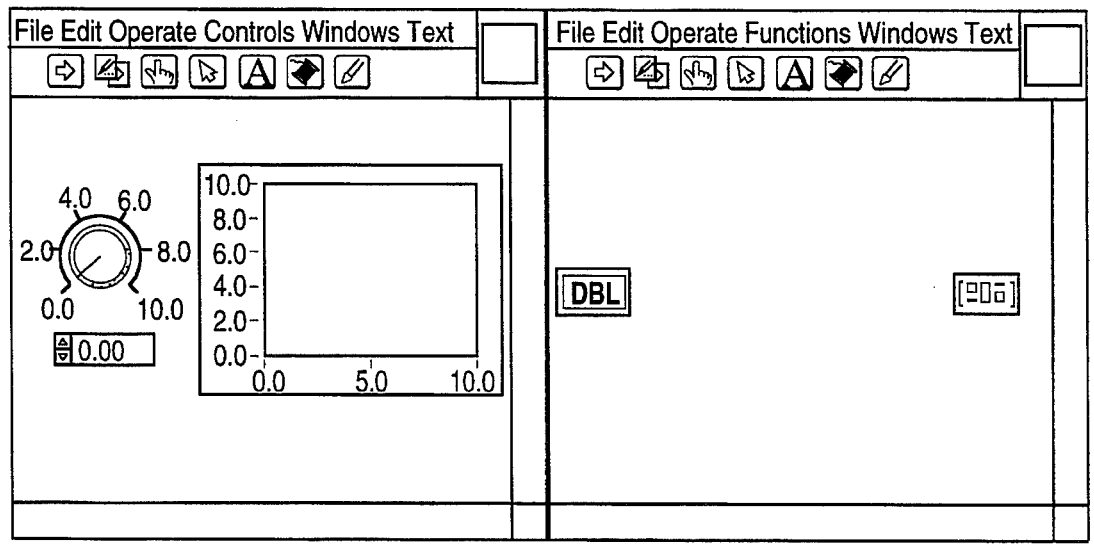

In FIG. 19B, a control graph indicator type is placed in the front panel, and its associated terminal automatically appears in the block diagram in the same position relative to the other terminal as the graph is to the knob. This makes it possible to distinguish the terminal even without supplementing the graphics with text labels.

Figure 19C:
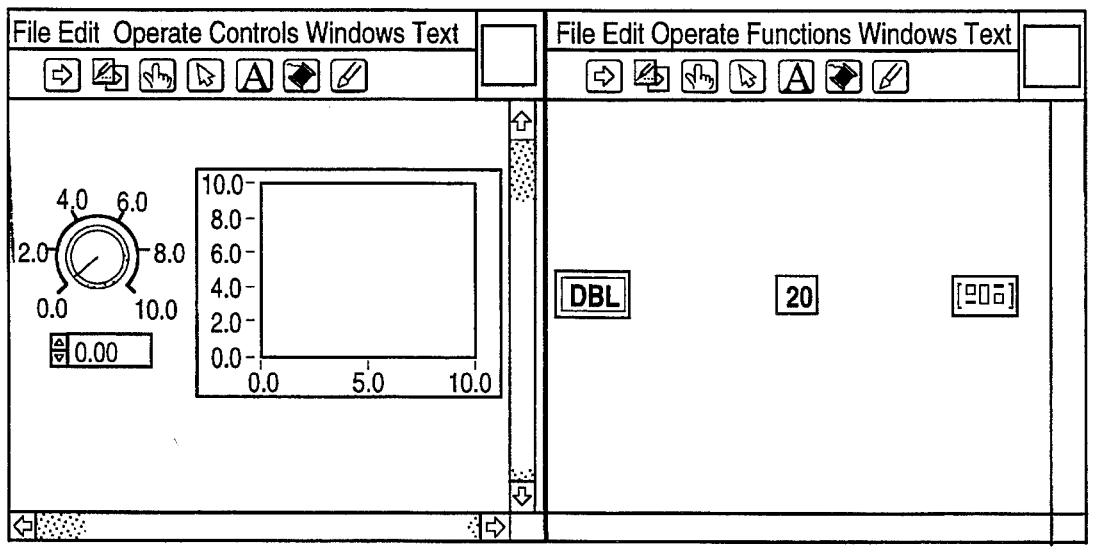
Figure 20B:
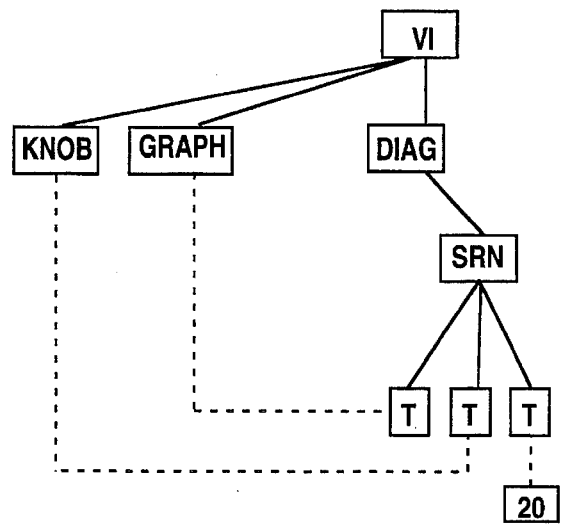

In FIG. 19C, a constant with value 20 is placed in the block diagram. As shown in FIG. 20B, this is reflected in the system representation by another terminal and control attached to the self reference node.

Figure 19D:
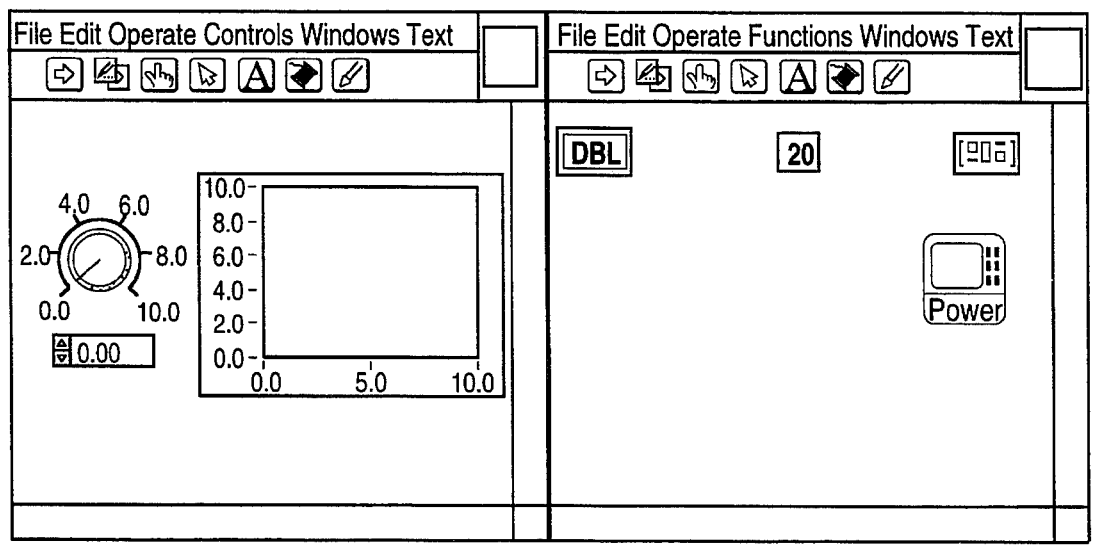
Figure 19:
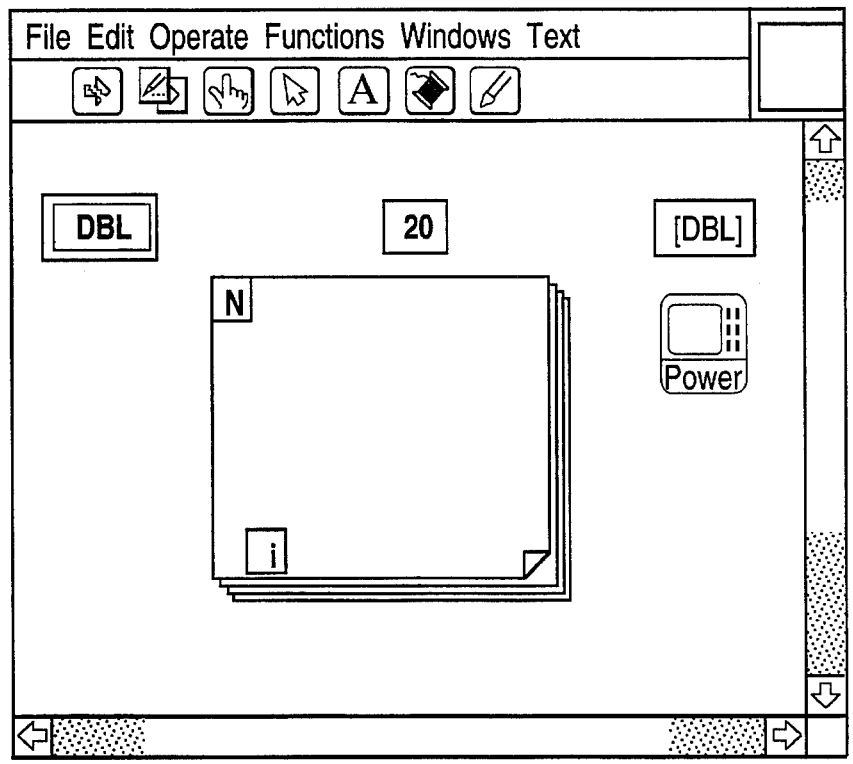
Figure 19:
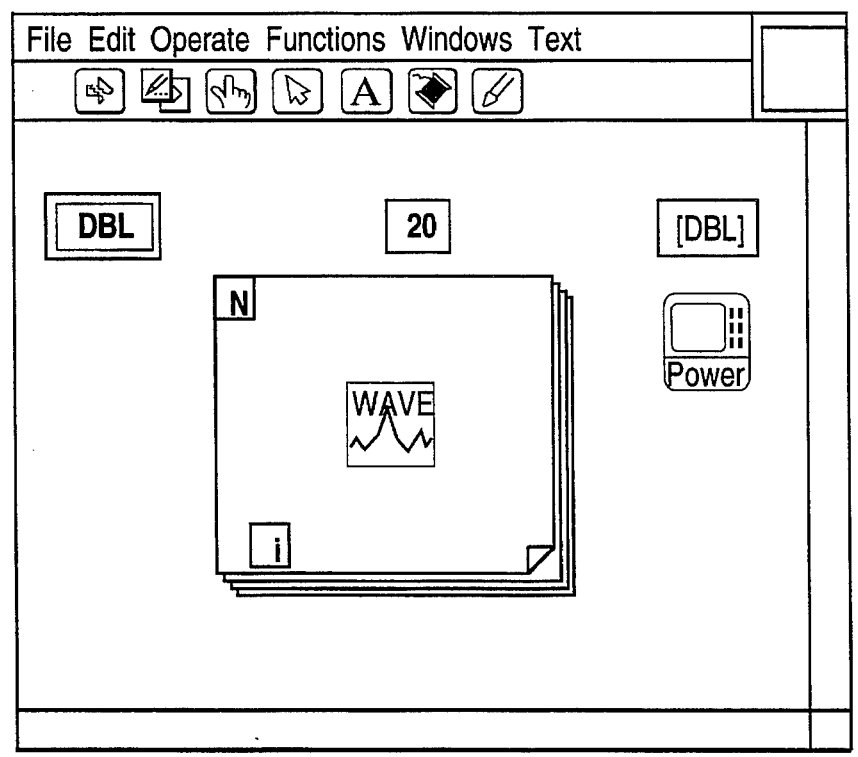
Figure 20C:
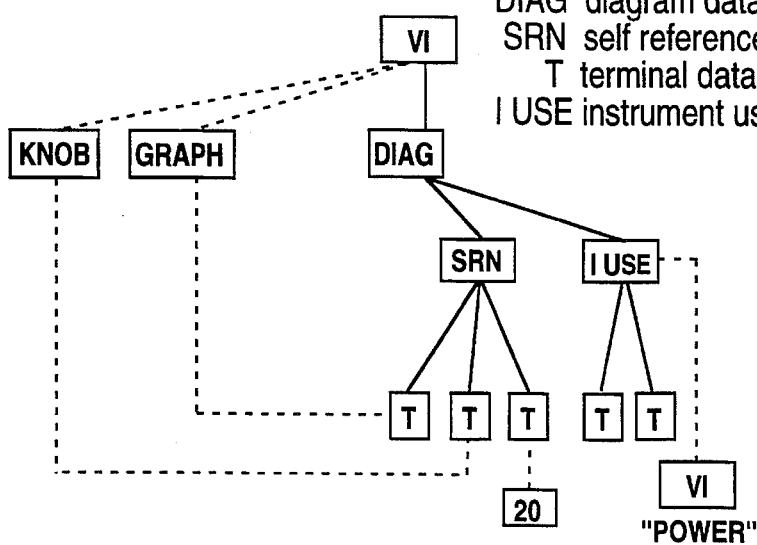

In FIG. 19D, an icon referring to a built-in virtual instrument is placed in the block diagram. (An alternative view of the block diagram could show the icon terminals instead of the icon itself). As shown in FIG. 20C the system representation shows another node of instrument use type in the virtual instrument diagram and three terminals and controls corresponding to the terminals and controls in the referenced virtual instrument.

Figure 21A:
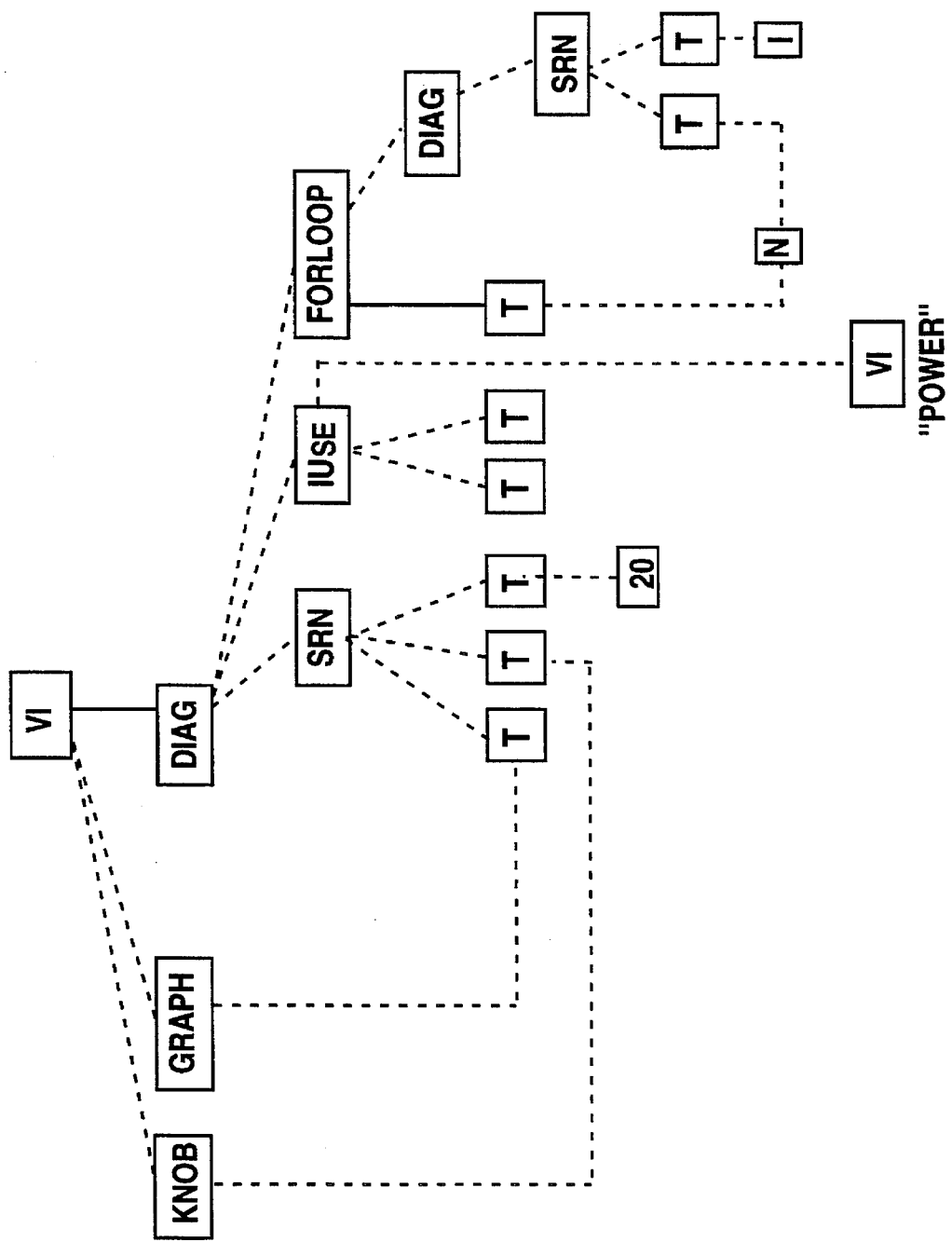
FIGS. 21A–B illustrate a system representation corresponding to FIGS. 19E and 19H.

In FIG. 19E, an iterative loop structure is placed in the block diagram. As shown in FIG. 21A, the system representation shows the structure node in the diagram along with terminals and controls for the loop variables. Note that the iteration number is accessible only from within the loop; while the iteration limit is available inside and outside the loop as evidenced by the two terminals which reference it, one in the structure node and the other in the self-reference node of the diagram within the structure node.

In FIG. 19F, an icon referencing another built-in virtual instrument is placed inside the iterative loop structure.

Figure 19G:
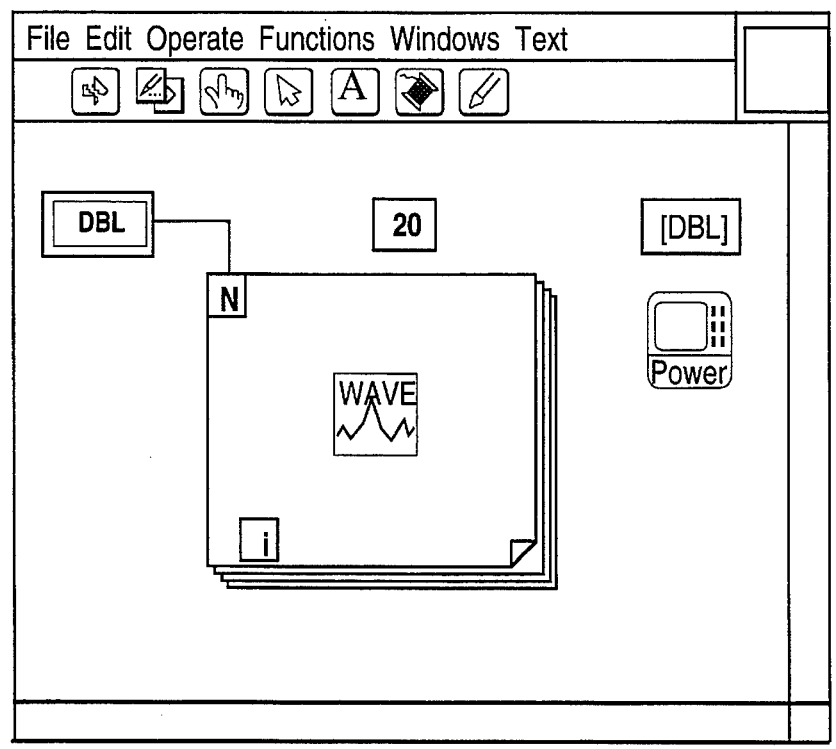

In FIG. 19G, a wire is connected from the terminal associated with the front panel knob to the loop limit terminal of the loop structure. The front panel knob terminal is determined to be the signal source.

Figure 19H:
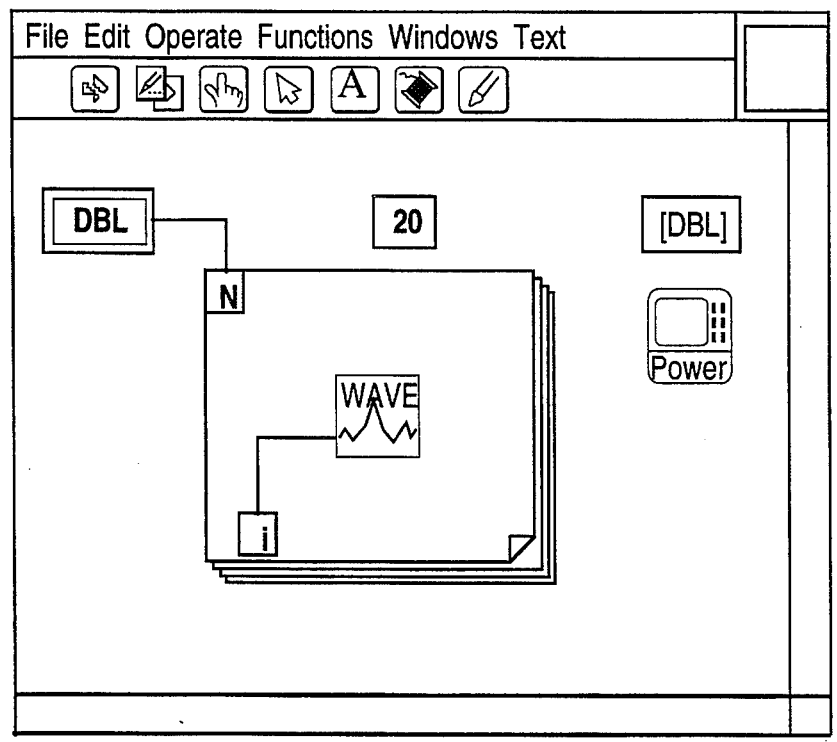
Figure 19:
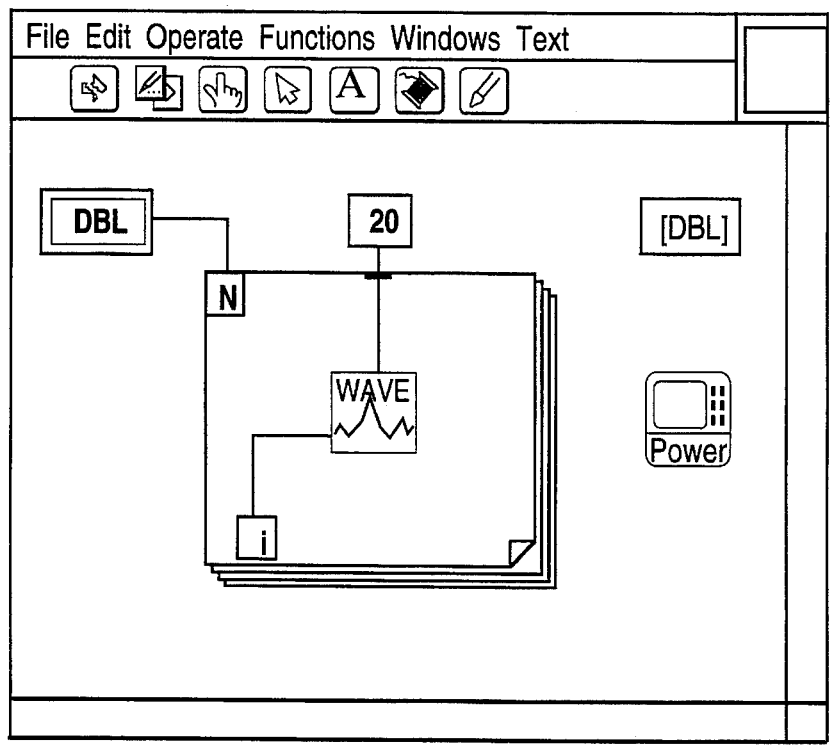
Figure 21B:
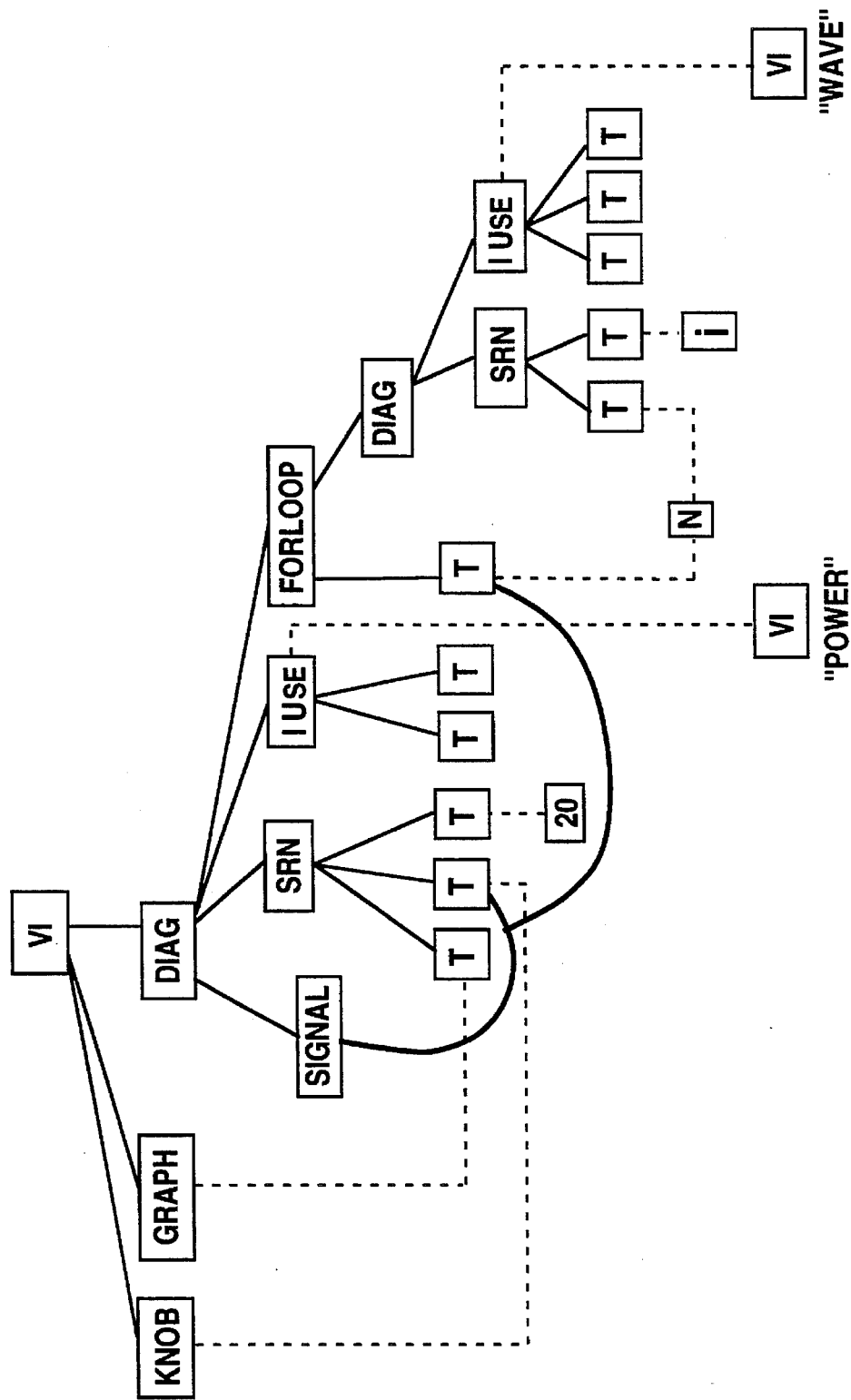

In FIG. 19H, a wire is connected from the iteration number terminal to a terminal on the virtual instrument inside the loop. This signal path lies completely within the loop structure subdiagram. As shown in FIG. 21B, the system representation shows the signal path with the iteration number terminal and the terminal on the instrument use node. The iteration number terminal is determined to be the signal source.

In FIG. 19I, the constant is wired to a terminal of the virtual instrument within the loop. In this case, the wire crosses the structure border so that a pair of terminals and a control are created, and the wire is split into two signal paths, one outside the loop structure and one inside. The constant is determined to be the source terminal of the outside signal, and the inside terminal at the border is determined to be the source of the inside signal.

Figure 19J:
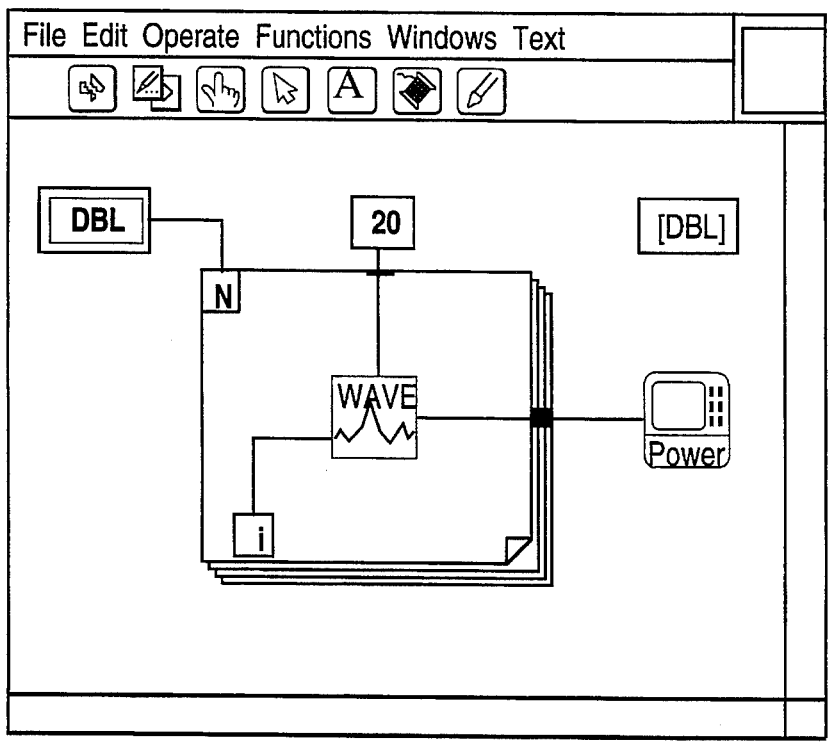

In FIG. 19J, a wire is drawn from the virtual instrument inside the loop to the virtual instrument outside the loop. This wire crosses the border so it is split into two signal paths. The wire on the outside is thicker because it represents an array signal path (as will be explained more fully below).

Figure 19K:
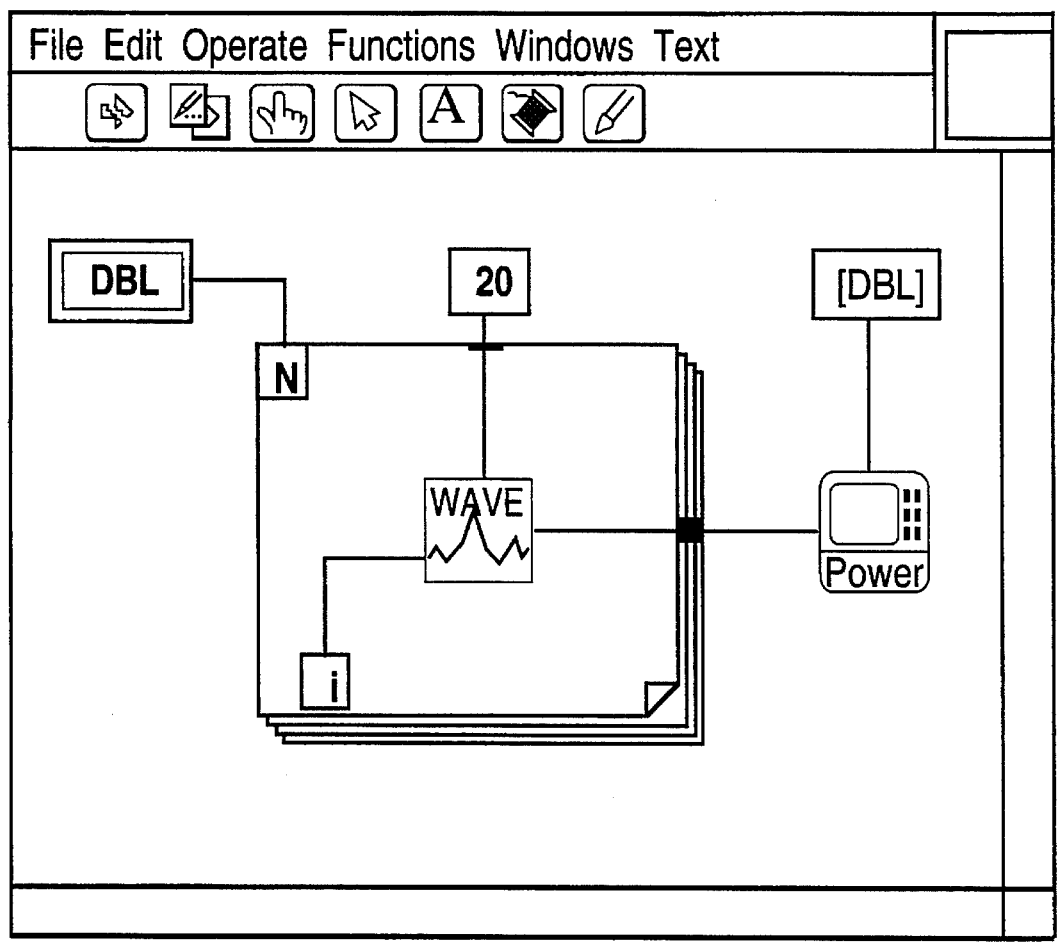

In FIG. 19K, the output of the virtual instrument outside the loop is connected to the terminal associated with the front panel graph. The wire pattern indicates that it represents a cluster signal path (as will be explained more fully below).

Block Diagram of FIG. 5A

FIG. 22 shows a drawing of a computer-generated display of a completed block diagram for the design example of FIG. 5A. This block diagram is the graphical program representing the instrument's operation, showing the interconnections between the elements of the instrument, the signal paths, and the relationship to other virtual instruments. The large rectangular region in the center of the diagram is an iteration loop structure. The diagram placed inside this region is executed multiple times: for i=0 to N-1. At the upper left of the diagram, four front panel inputs from controls are shown connected to the iteration loop. The inputs to the iteration loop are the Number of Steps, High and Low Frequencies, and Amplitude.

The Number of Steps and High and Low Frequency inputs are connected to a Formula Node icon called "Calculate Frequency," which is comprised within the iteration loop. This icon is a built-in function which in this example includes a formula that calculates a frequency.

The Number of Steps input is connected to the loop-count (the N at the upper left corner) of the iteration loop, which in turn, is connected to the variable N in the Formula Node. The index i of the iteration loop is connected to the variable i of the Formula Node. The High and Low Frequency inputs are connected to the Fh and Fl inputs of the Formula Node.

Two virtual instrument icons referred to as Tek and Fluke are also inside the iteration loop. The Tek VI takes as input Amplitude and the frequency Fi output from the Formula Node and performs the appropriate IEEE-488 operations to set the function generator 208 of FIG. 5A. The Fluke VI performs the appropriate IEEE-488 operations to obtain a voltage measurement from the multimeter 210 of FIG. 5A. These two icons represent simple virtual instruments that are easily designed using built-in high level IEEE-488 functions to communicate with the multimeter 210. The output from the multimeter (Fluke) icon is provided to logic nodes which convert from the RMS (root-mean square) value. This signal is output from the iteration loop and provided to nodes which convert the data to dB (decibel) form. This output is then provided to a bundle node which also receives the output from the Formula Node. The bundle node is a bundle by position node and acts to bundle the two arrays of data it receives, i.e., frequency and response for plotting purposes. This bundled data in then provided to an indicator on the front panel.

Each iteration of the iteration loop produces as output the input frequency and the corresponding voltage measurement. This results in two arrays of values which exit the loop at the right. The bundle function converts these two arrays into X, Y plots which are then provided to the front panel graph indicator. Note the self-documenting effect of the graphical language, with the iteration loop structure contributing to the readability of the program.

With the front panel and block diagram complete, the instrument is ready to be used. The instrument is operated from the front panel. To execute the instrument, the user simply configures the input controls and "clicks" the Run Arrow button on the top of the screen (as will be appreciated from the description below).

VI Execution Overview

The graphical system and method described above permits the computer-aided modeling of a process using graphical techniques which generally are more easily comprehended, especially by persons who do not possess specialized skills in computer programming techniques. The use of a computer-generated image of a front panel display permits a user to easily understand how data is provided to a system being modeled and how data is provided by the system. The block diagram editor permits a user to construct a graphical representation of a procedure for producing output data from input data using icons which reference modularized procedural units. A user may use the icon editor to construct his own icons; or he may call upon a ready-made library of icons. The execution subunit executes execution instructions which are constructed in response to the graphical images produced by a user to model a process. Thus, a user can program a computer substantially by constructing a hierarchy of icons connected to one another so as to model a process. A user, therefore, can use the system and method of the present invention to program a computer to model a process using graphical techniques which generally are easier to comprehend.

Furthermore, the system and method of the present invention advantageously can use data flow techniques. The use of the structures illustrated in FIGS. 12A–E facilitates the use of such data flow techniques. By using such techniques, a system modelled in block diagram form can operate in a parallel fashion, since each individual icon in a hierarchy comprising such a block diagram operates as soon as all input data provided to it are available. In addition, such structures render graphical representations of block diagrams using such data flow techniques more comprehensible to a user, and, therefore, simplify the task of using such techniques.

Parallel and Serial VI Execution

Having described how a VI is constructed and used, additional explanation regarding the execution description is provided. In the preferred embodiment, all VIs are referred to as diagram VIs. Diagram VIs in turn are comprised of nodes, which are discussed with regard to FIGS. 9C–9K. Referring once again to FIG. 8B, a node (icon or structure) begins execution when all its inputs are available. If a diagram has two or more icons referring to the same VI and a second one has all its inputs available before the first finishes execution, it is not always clear how to handle this second node. In fact, it depends on the "execution mode" of the VI. Absent some way to execute VIs in parallel, VIs would be executed in serial. In a serial mode of execution, the second node is placed on a FIFO wait queue of the self-reference node associated with the VI, and execution of the VI in the context of the second node is delayed until the execution in the context of the first node is completed.

Parallel or reentrant execution dynamically creates multiple instances of the VI at execution time in order to allow multiple nodes to execute in parallel. In the preferred embodiment, parallel execution is implemented for VIs designated as reentrant by the user.

Figure 23:
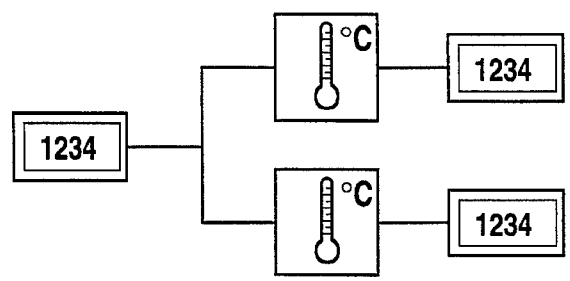
FIG. 23 illustrates serial execution mode of a VI.
Figure 25:
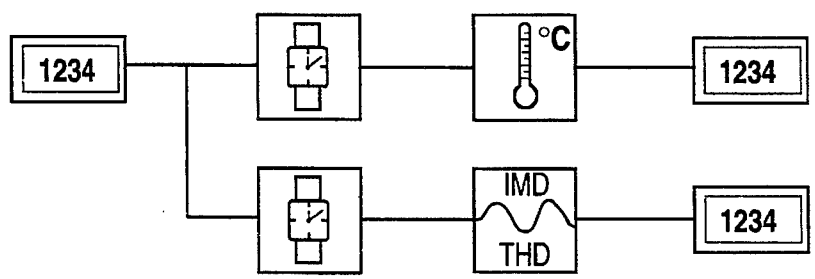
FIG. 25 illustrates parallel execution mode for a VI.

FIGS. 23 and 25 illustrate serial and parallel execution modes. In FIG. 23, one "thermometer" icon must wait until the other finishes execution before it can start, even though it has all its inputs at the same time as the other. This is because the "thermometer" VI is a serial VI.

Figure 24:
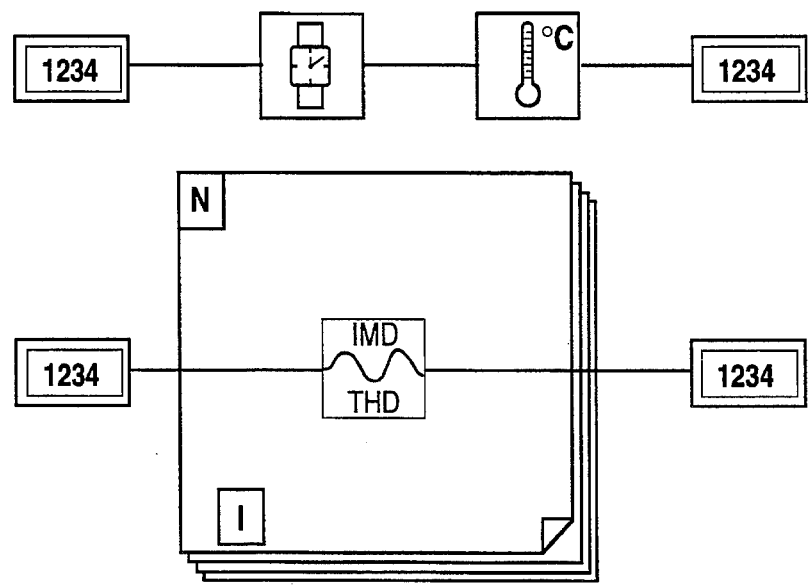
FIG. 24 illustrates "wait" icon execution.

In FIG. 24, the asynchronous behavior of the wait VI (the watch icon) is shown. It is a code type VI that does not execute atomically. During the time that it is executing (waiting) other components of the diagram may execute.

In FIG. 25, both "wait" icons execute at the same time showing the parallel execution mode of the wait VI. If execution were not parallel either the "thermometer" VI or the "IMD/THD" VI would effectively wait for the sum of the time delay intervals caused by the two "wait" VIs together.

The preferred embodiment can be embodied in software, hardware, or a combination of both. One way to implement a parallel VI in hardware is to have enough instances of the hardware to account for the maximum number of VI instances that must run in parallel.

The present invention provides the ability of a virtual instrument (with icon, front panel, and diagram or code) to be a template and effectively automatically replicate itself as necessary in order to allow multiple instances to run in parallel.

Figure 26:
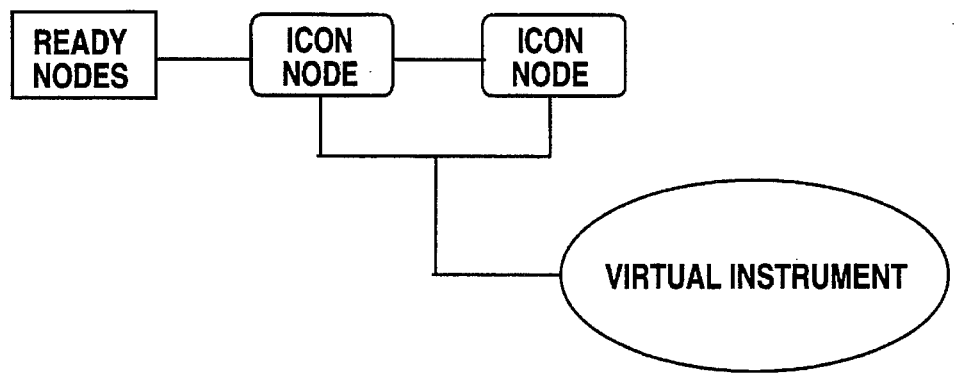
FIG. 26 illustrates a ready node list, also referred to as the run queue.

A node is executed when all its inputs have data ready. When this happens the node is put on a list of ready nodes, i.e., is placed on the run queue. This is illustrated in FIG. 26. One by one the ready nodes are taken off the list and executed. When more than one of the ready nodes are I-use nodes which refer to the same virtual instrument the scheduling of the execution depends on the mode of the virtual instrument. The possible modes are serial and parallel.

Serial Mode (Block Diagram Virtual Instruments)

Figure 27:
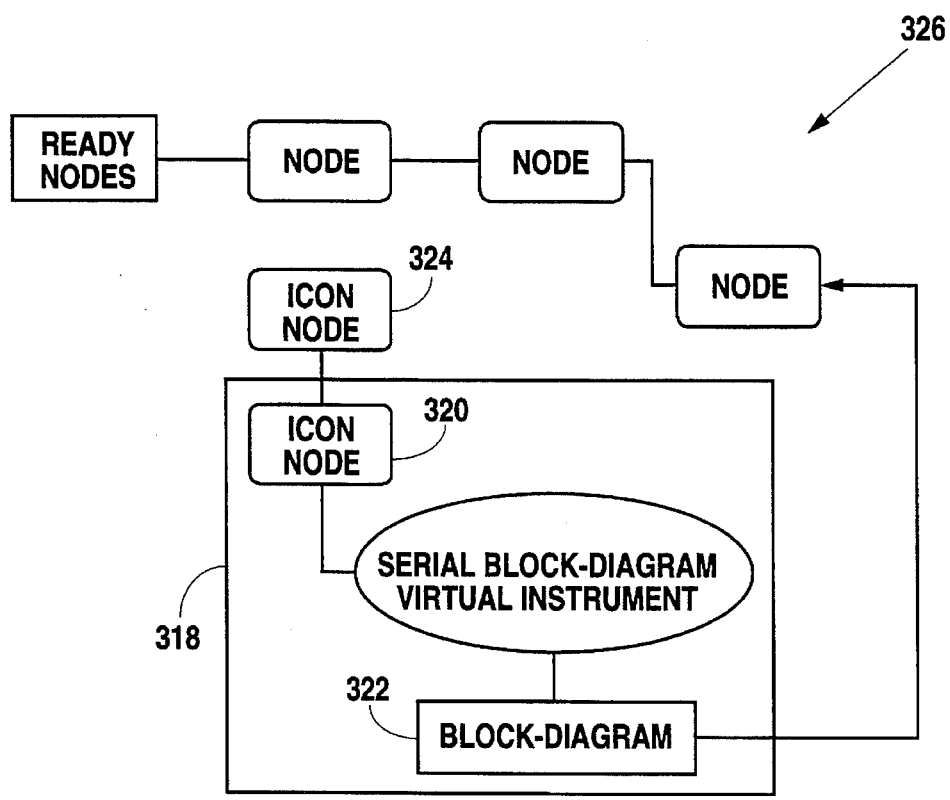
FIG. 27 illustrates how nodes are placed on the run queue as they become ready and are interleaved with other nodes.

Serial mode instruments place contending nodes on a list of nodes which execute the block diagram of the virtual instrument in turn. This list of nodes is the self-reference node wait queue. Because the block diagram of an instrument consists of more nodes which will become ready, the execution of the block diagram instrument is not atomic. The nodes of the diagram are put onto the ready node list or run queue as they become ready and are "interleaved" with ready nodes from other diagrams. This is illustrated in FIG. 27. The dashed box 318 once again contains the node on whose behalf the block diagram 322 of the virtual instrument is executing. The node 324 outside the dashed box must wait for the diagram to complete before it gets its turn. The arrow from the block diagram to the Ready Nodes list 326 shows that the block diagram 322 will produce more ready nodes which will be added to this list.

Parallel Mode (Block Diagram Virtual Instruments)

Figure 28:
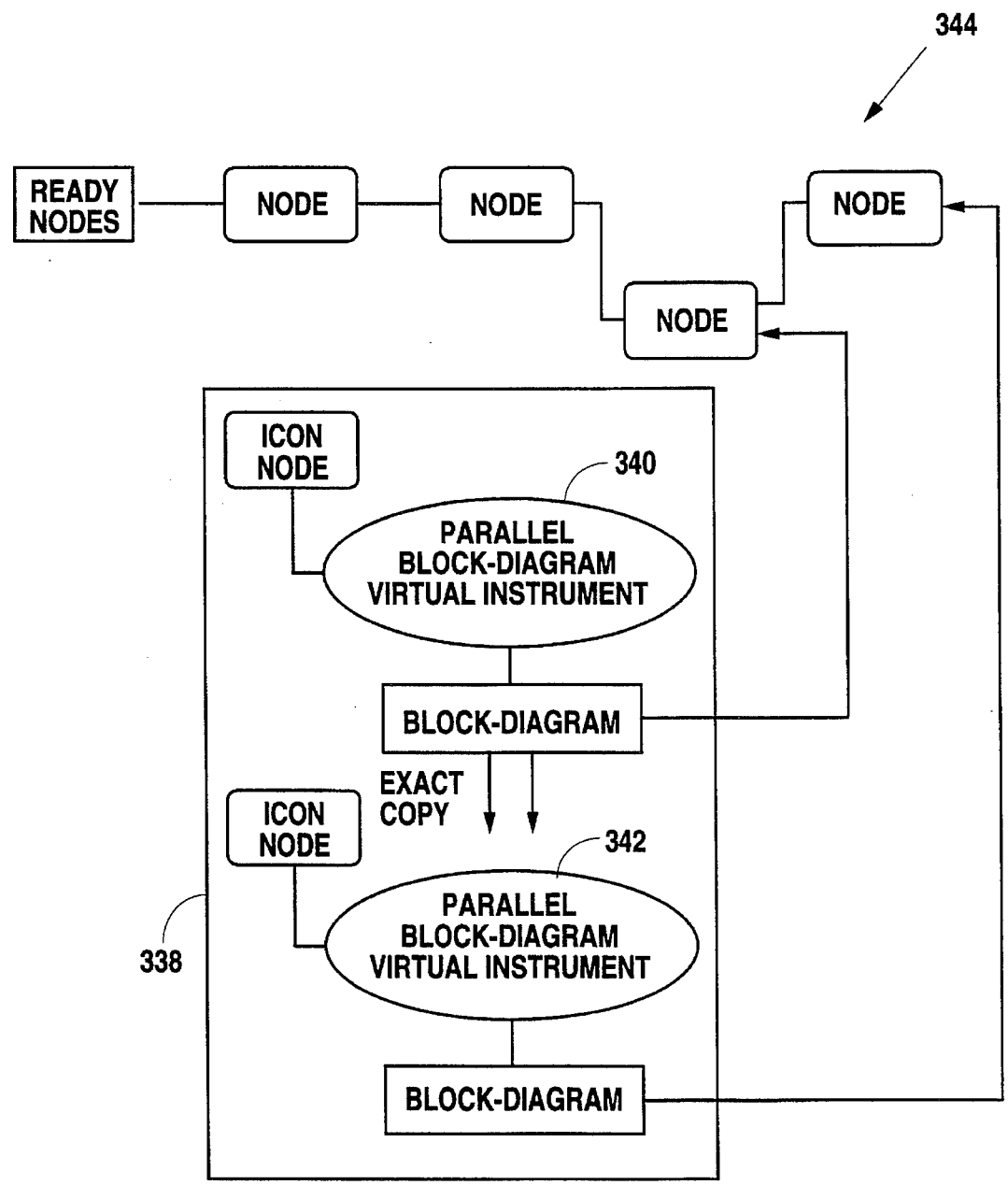
FIG. 28 illustrates parallel execution of nodes in a block diagram virtual instrument.

Block diagram instruments can be built to execute in parallel or reentrant mode. The means of making parallel execution possible for block diagram instruments is by using the instrument as a template to make identical copies of the instrument automatically as needed for contending nodes. Each block diagram then executes, producing ready nodes for the Ready Nodes list or run queue in such a way that the nodes can be "interleaved" and the execution of the identical diagrams takes place "at the same time." This is illustrated in FIG. 28. Inside the dashed box 338 the replicated virtual instrument 340, 342 is shown and each I-use node has "its own copy" of the instrument. Both diagrams are shown putting ready nodes onto the Ready Nodes 334 list.

Execution States

The fundamental capability which execution states permit is the interactive operation of more than one virtual instrument at a time, as well as the construction or editing of some virtual instruments while others are executing.

When a VI is interactively started (i.e., run from its front panel) it enters its active state. It remains active until it completes, at which time it returns to its idle state. At the point it becomes active all lower level VIs are "reserved." This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful troubleshooting aid. While a VI is reserved it may not be edited; however the values assigned to its front panel controls may be changed. Depending on the design of the VI and the point in time when the control value is changed such a change may produce unexpected results.

A "breakpoint" may be set so that a reserved VI enters its "suspended" state when it is about to execute. "Suspended" is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables top-down implementation and testing. "Stub" VIs can be built (icons and front panels but no diagram or code), and their execution simulated by setting the breakpoint, supplying relevant outputs when the VI becomes suspended and then resuming.

Breakpoints have been used in conventional programming languages, but there is no analogy in instrumentation systems. A related but different analogy in instrumentation is remote/local loosely related to reserved/idle (no analogy to suspended). Stubs are known in programming but not in hardware or instrumentation development.

The present invention provides the ability of VIs to exist in different states in order to protect execution from editing changes. Furthermore, it provides the ability to change the value of a VI indicator (output) while it is in its suspended state.

Controls

Figure 29:
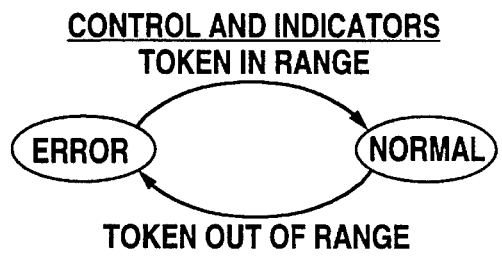
FIGS. 29–37 illustrate various virtual instrument execution states.

As illustrated in FIG. 29, whenever a token is propagated to a control the control is set to its normal or error state depending on whether the value of the token is in or out of range for the control.

Signals

Figure 30:
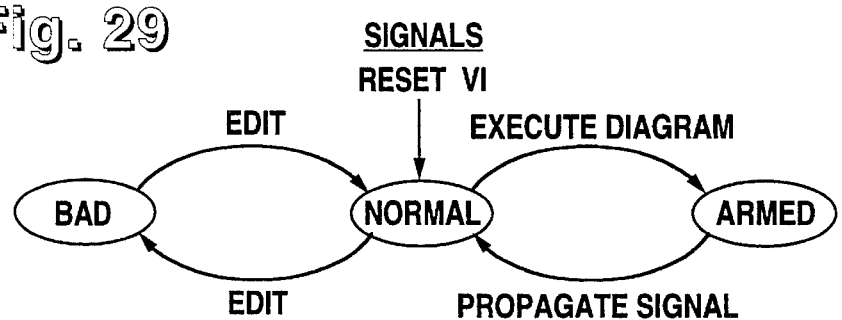

In FIG. 30, after a wiring change or a control type, dimension, direction, or unit change the type propagation code will set each signal to bad or normal. The VI is not executable unless all its signals are normal. When a diagram is about to be executed, all its signals are set to their armed state. When a signal is propagated from its source node it is set to its normal state. When the owning VI becomes idle all remaining armed signals are set to their normal states.

Diagrams

Figure 31:
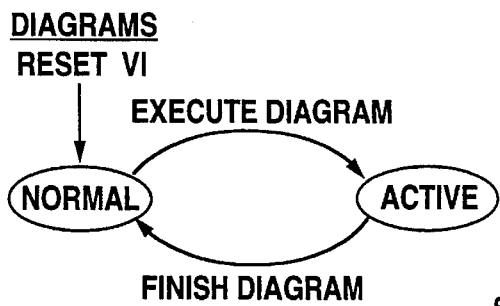

In FIG. 31, when a diagram begins execution it is set to its active state. When it finishes it is set to its normal state.

When the owning VI becomes idle all active diagrams are set to their normal states. The diagram state is needed only for reset to be able to identify the active diagram of a select or sequence structure.

Self Reference Nodes

Figure 32:
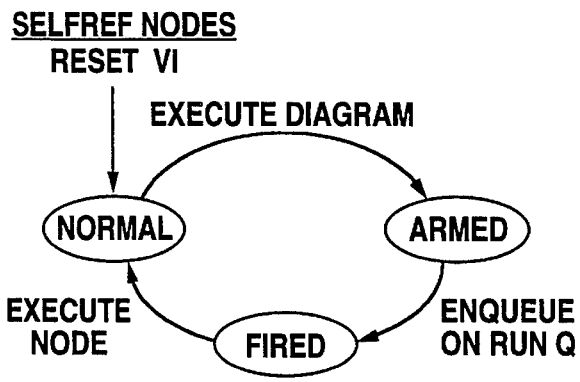

In FIG. 32, when a diagram is about to be executed the self reference node as well as all the other nodes in the diagram are set to their armed states. When all the other nodes have finished executing the self reference node is scheduled to run by being placed on the run queue. At that point it is set to its fired state. When it is removed frame the run queue and executed, signalling the completion of the diagram, it is set to its normal state. When the owning VI becomes idle all remaining armed self reference nodes are set to their normal states.

Structure Nodes

Figure 33:
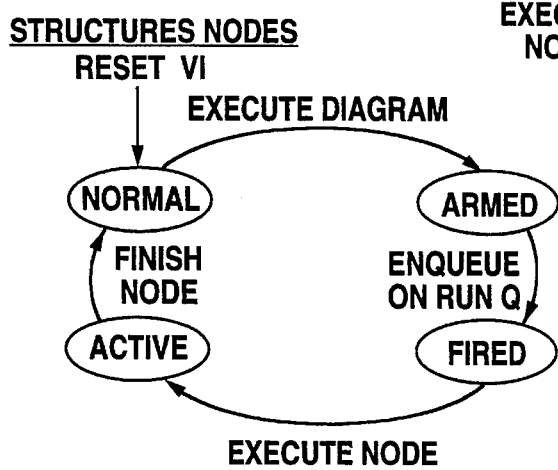

In FIG. 33, when a diagram is about to be executed all the nodes in the diagram are set to their armed states. When a node's short count is decremented to zero, it is scheduled to run by being placed on the run queue. At that point the node is set to its fired state. When it is removed from the run queue and begins execution it is set to its active state. When the subdiagrams finish (the required number of iterations) the structure node is set to its normal state and its outputs are propagated. When the owning VI becomes idle all remaining armed structure nodes are set to their normal states.

Instrument Usage Nodes

Figure 34:
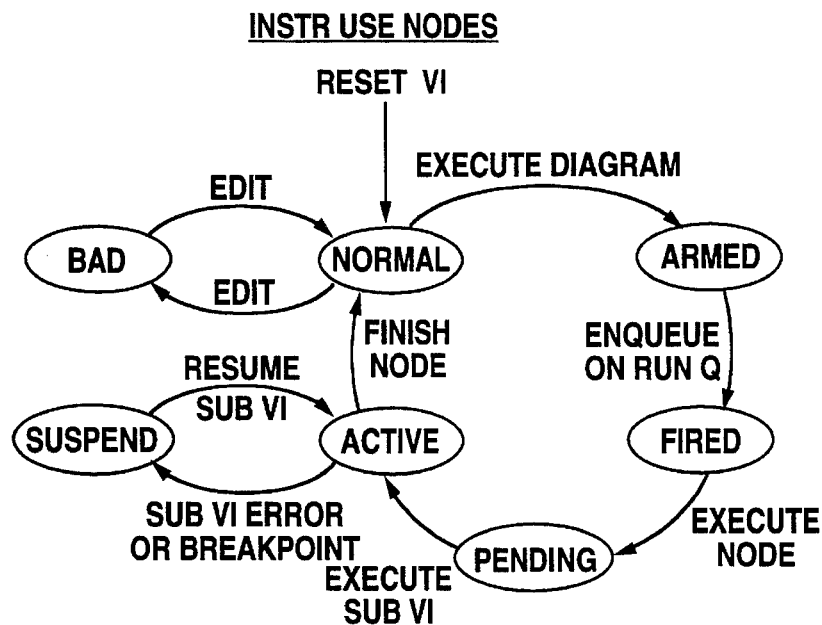

In FIG. 34, after a load operation or a change to the front panel of the sub VI the linking code will set the node to bad or normal (a node is bad also if the link is good but the sub VI is not executable). The owning VI is not executable unless all its nodes are normal. When a diagram is about to be executed all nodes are set to their armed states. When a node's short count is decremented to zero it is scheduled to run by being placed on the run queue. At that point the node is set to its fired state. When an instrument usage node is removed from the run queue and enqueued on the sub VI's self-reference node wait queue it is set to its pending state. When the sub VI actually begins execution in the context of the calling node the calling node is set to its active state. When the sub VI completes normally and the calling node is dequeued from the VI's ready queue the calling node is set to this normal state. If the referenced VI is stopped in its suspended state or executing in its retrying state the calling node is set to its suspended state. When the owning VI becomes idle all remaining armed nodes within it are set to their normal states.

Serial virtual instruments

Figure 35:
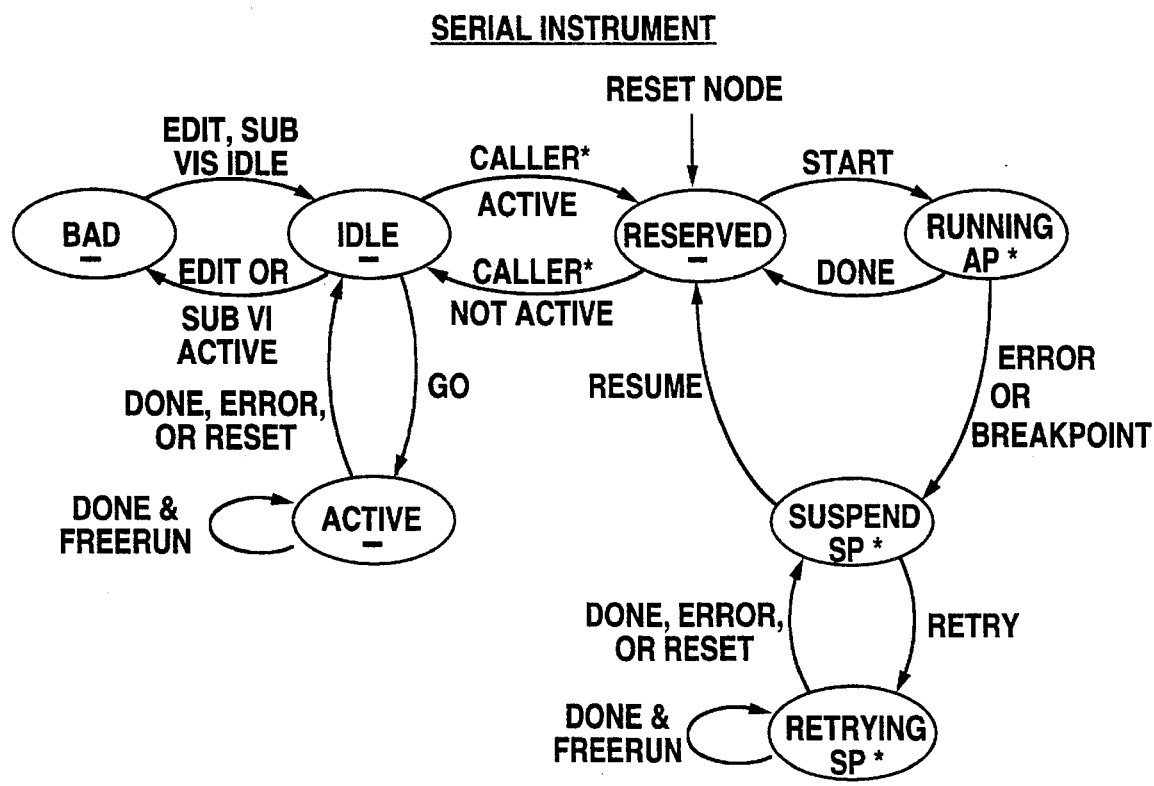

In FIG. 35, after a block diagram edit operation the type propagation code sets the VI to its bad or normal state depending on the presence of bad signals or nodes (a serial VI is bad also if any sub VI is not executable, or if it or any sub VI contains a recursive reference to it). When the go button is hit the VI in the front window (panel or diagram) is set to its active state. At this point all of its subVIs and all of theirs, etc., are set to their reserved states. When the VI completes normally or with an error it is placed in its idle state. If the reset button is hit while the VI is in its active state it is placed in its idle state, and all nodes in their pending, active, or error states are reset (which may involve resetting their subVIs). When a VI enters its idle state from its active or reserved state each of its subVIs still in its reserved state checks all its callers to see if it too can return to its idle state.

When a reserved VI actually begins execution in the context of a calling node it is placed in its running state. Whenever a VI has to abort execution because its calling node is being reset it is placed in its reserved state (it may subsequently have the opportunity to discover whether it should return to its idle state).

If the VI has a breakpoint set or if it detects an error on a control then instead of being placed in its running state at the start of execution it is placed in its suspended state.

When a VI completes normally it is placed back in its reserved state. If a VI detects an error on an indicator the VI is placed in its suspended state. When the retry button is hit the VI is placed in the retrying state. If the VI then completes normally or with an error or if the reset button is hit it is placed in the suspended state. A suspended VI is placed in the reserved state when the resume button is hit.

Front panel controls can be adjusted in any VI state but the effects are nondeterministic except for the idle and suspended states. Edit changes to the front panel or block diagram are not allowed in any state except idle and bad. The go button is inoperative except in the idle state. The reset button is inoperative except in the active and retrying states. The resume and retry buttons are inoperative except in the suspended state.

While the VI is in its running, suspended, or retrying state, additional pending I-use nodes may be enqueued on its wait queue. When the current node is completed it is dequeued from the wait queue, the next one is set active, and the VI begins execution in its context.

Parallel Block Diagram virtual instruments

Figure 36:
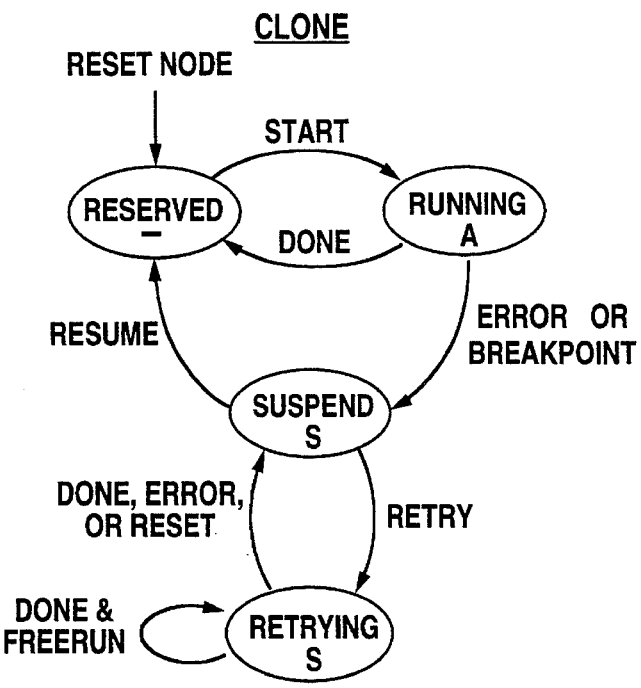
Figure 37:
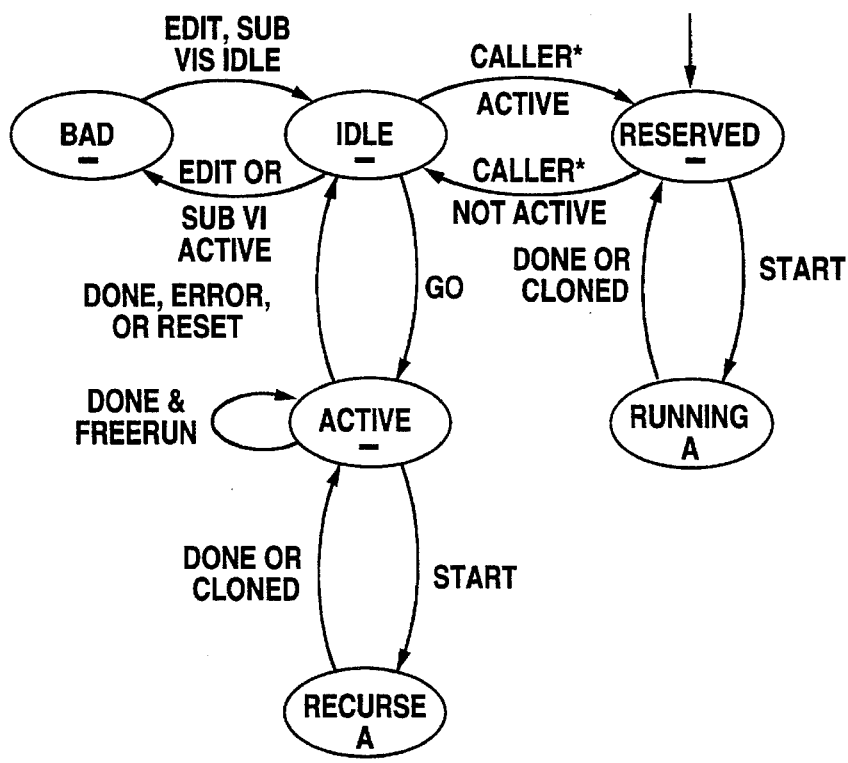

In FIG. 37, a parallel block diagram VI is similar to a serial VI except it has no suspended or retrying states. When a parallel VI actually begins execution in the context of a calling node a clone is created and placed in its running state. FIG. 36 illustrates a clone. When the clone completes normally it is discarded. The clone is discarded also whenever it has to abort execution because its calling node is being reset. If the VI has a breakpoint set then instead of placing the clone in its running state it is placed in its suspended state. The execution behavior of a VI clone is similar to that of a reserved serial VI.

TABLE

Figure 38:
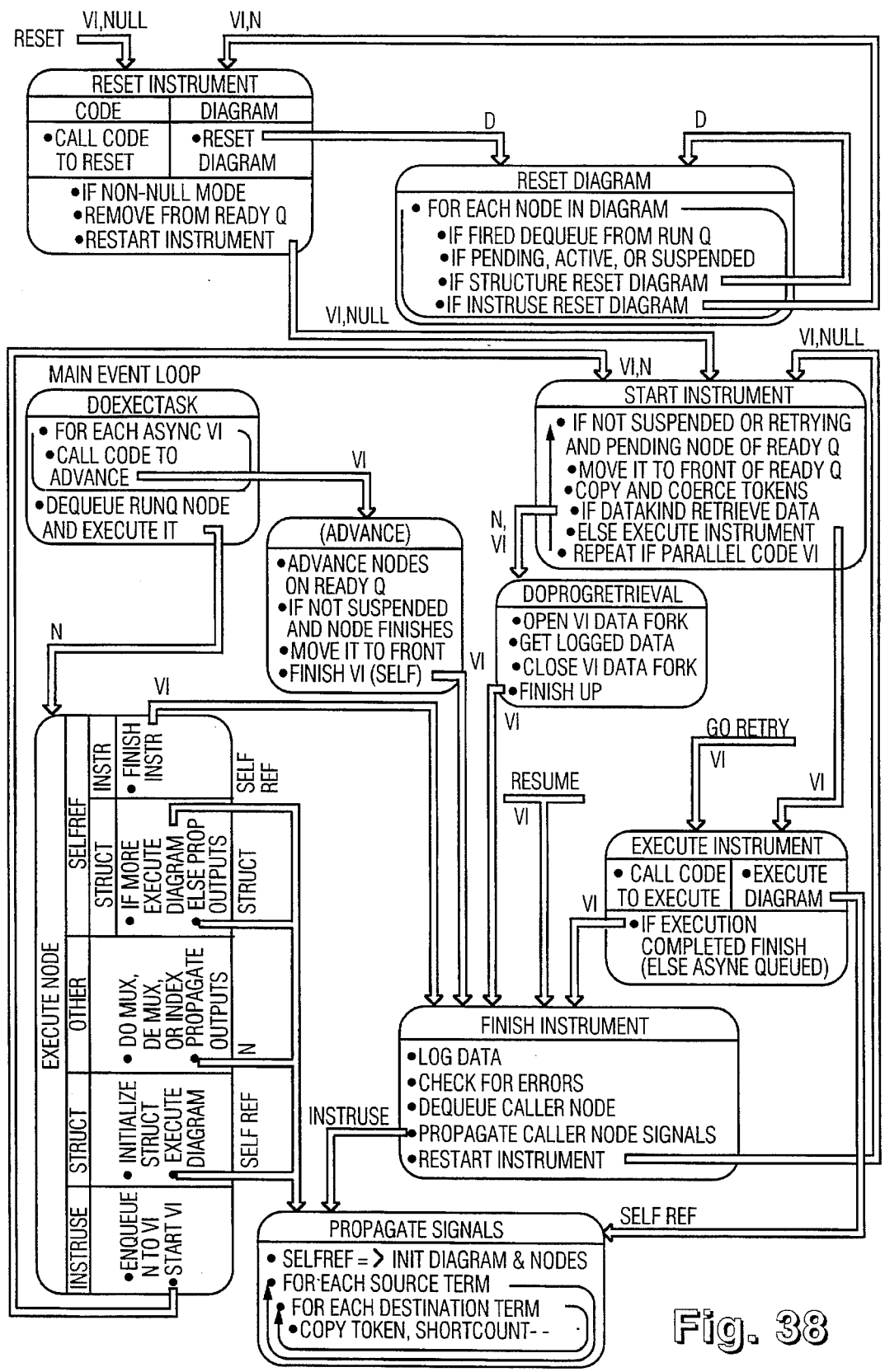
FIG. 38 illustrates an execution road map.

State and Indication and Transition Methods
Controls and indicators:
  normal: normal image
  error: gray indicator or red outline
Signals:
  Bad: dashed
  Normal: normal wire pattern and color
  Armed: normal width light gray line
Nodes:
  Bad: Grayed out icon
  Normal: Normal image
  Armed: Grayed out icon
  Fired: Normal image
  Pending: Normal image
  Active: Normal image
  Error: Normal image
VIs:
  Bad: go button drawn broken
  Idle: go button normal
  Active: reset button present
  Reserved: reserved indicator in place of go button
  Running: running indicator in place of go button Suspended: retry button in place of go button,
  resume button present
Retrying: reset button present,
  resume button disabled
Error on VI Control: go button disabled
Error on VI Indicator: resume button disabled FIG. 38 further explains execution states. In addition, the flowchart included as Appendix B in U.S. Pat. No. 4,914,568 explains FIG. 38 with regard to a prior embodiment and is incorporated herein by this reference.

Execution States

The fundamental capability which execution states provide is the interactive operation of more than one virtual instrument at a time, as well as the construction or editing of virtual instruments while others are executing.

Figure 39:
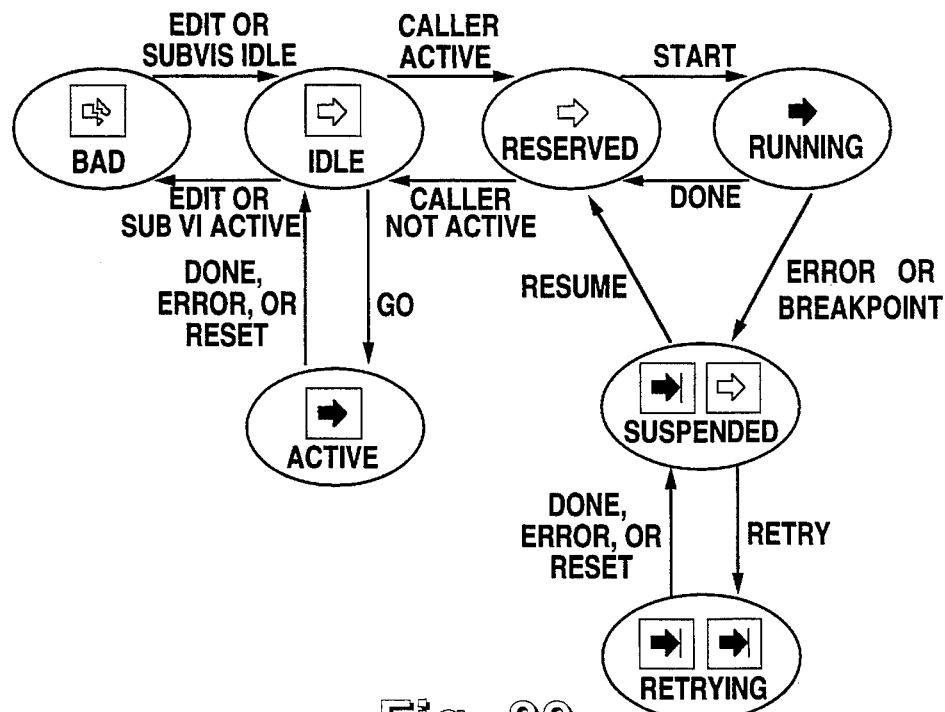
FIG. 39 illustrates execution state symbols.

The execution state diagram is shown in FIG. 39. State information is maintained internally for each virtual instrument. When the VI is in the front window, the state information for that VI is shown on the control palette by the one or two controls shown within each state in FIG. 39.

When the VI is interactively started (i.e., run from its front panel) it enters its active state. It remains active until it completes, at which time it returns to its idle state. At the point it becomes active, all lower level VIs are "reserved." This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful trouble-shooting aid. While a VI is reserved it may not be edited; however the values assigned to its front panel controls may be changed. Depending on the design of the VI and the point in time when the control values is changed such a change may produce unexpected results.

Figure 40:
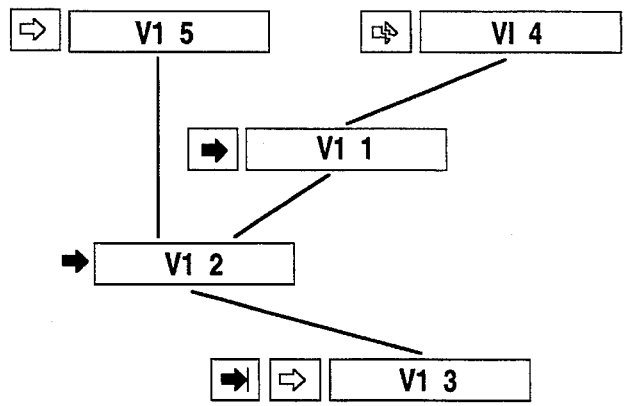
FIGS. 40–41 illustrates virtual instruments in various execution states.
Figure 41:
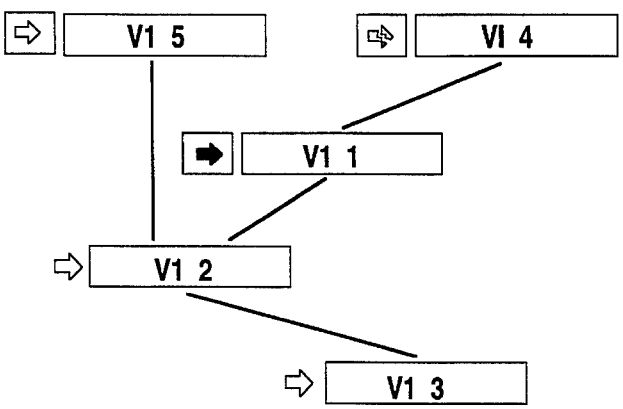

FIGS. 40 and FIG. 41 show five VIs in various stages of execution. The purpose of this example is to show how the change in state in one VI may cause state changes in other VIs, both above and below in the hierarchy. Assume all VIs have been loaded and all are initially in the idle state. FIG. 41 shows the execution states of all of the VIs after VI 1 is interactively started. Notice the changes caused in the execution states of VI 1's subVIs, VI 2 and VI 3, which are now reserved. They may not be edited or executed interactively. Notice also the state of VI 4. It is in the bad VI state because a sub-VI is active. VI 4 may not be executed interactively, but editing is allowed. If VI 4 was allowed to be executed interactively, it would attempt to reserve VI 1, which is already active. There is no transition from active to reserved in the state diagram, so we must guarantee that a VI cannot become active if any of its subVIs are already active. VI 5 has not changed states. It may be edited or executed interactively. One of its subVIs is reserved, but that does not affect the state of VI 5.

Setting breakpoints is a useful debugging tool. Stopping on a breakpoint is implemented with execution states. A "breakpoint" may be set so that a reserved VI enters its "suspended" state when it is about to execute. Suspended is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables top-down implementation and testing. "Stub" VIs can be built (icons and front panels but no diagram or code) and their execution simulated by setting the breakpoint, supplying relevant outputs when the VI becomes suspended, and then resuming.

Breakpoints are known in conventional programming languages, but there is no analogy in instrumentation systems. Stubs are prior art in programming but not in hardware or instrumentation development.

FIG. 40 shows the control palette execution state buttons corresponding to the VIs when VI 3 becomes suspended. A breakpoint was set on VI 3, and execution is suspended before it is executed. VI 1 is still active, VI 2 is running, and VI 3 is suspended. The VI states of VI 4 and VI 5 do not change.

The system is protected from executing with an error on the block diagram (wiring error). If the VI is in the bad state, the VI may not be executed interactively, or programmatically by a higher level instrument. When a VI becomes bad, all of its callers are also bad because they now contain a bad sub VI. When a VI changes from bad to idle, all of its callers are notified of the state change and they must check to see if any of their subVIs are still bad. This guarantees that when a VI is interactively executed, it does not contain errors on the block diagram or any subVI block diagrams.

To protect execution from editing changes that may cause errors, editing is not allowed except in the idle or bad state. Since the system guarantees that there are no block diagram errors when the execution begins, and no editing is allowed during execution, no diagram errors will be encountered during execution.

The present invention provides the ability of VIs to exist in different states in order to protect execution from editing changes. Furthermore, the ability of VIs to have a breakpoint and suspended state enable top-down implementation (running a top level VI without having all the subVIs finished yet). Also, it provides the ability to change the value of a V indicator (output) while it is in its suspended state.

Operation of the Graphical System

The graphical system and method for modeling a process are implemented in software. A copy of a program listing for one embodiment of the graphical system and method in which the present invention may be incorporated is filed as an Appendix to U.S. Pat. No. 4,901,221 and is hereby incorporated by reference. The present invention is described further below beginning at FIG. 115. The following description explains certain embodiments of the operation of the graphical system and method in which the present invention may be incorporated. The explanation is intended to be illustrative and not exhaustive and uses specific examples to explain the principles of operation of the preferred embodiments. It will be appreciated that the principles of operation explained below will serve as a basis for the heuristic learning process necessary to fully appreciate and practice the full scope of the present invention. Thus, it is not intended that the scope and content of protection afforded to the present invention be limited in any way by the following explanation.

The following explanation explains how to use the implemented functions of the preferred embodiments. A brief review of virtual instruments (VIs) is provided first, followed by a walk through of the display menus. This presentation is followed by a general discussion of how VIs are created and executed.

Virtual Instruments

In instrumentation applications according to the preferred embodiment, graphical data flow programs are referred to as virtual instruments (VIs). As previously discussed VIs have three main parts: the front panel, the block diagram, and the icon/connector.

Figure 42:
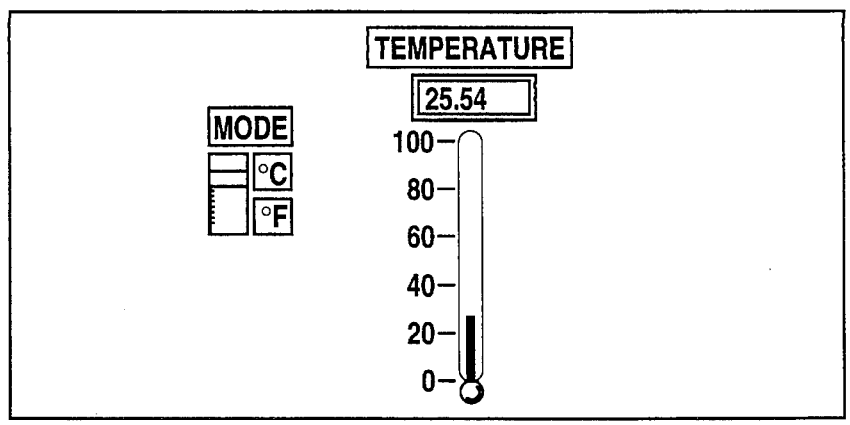
FIG. 42 illustrates an example of the front panel for a temperature VI.

The front panel is the means of setting input values and viewing outputs from the VI block diagram. Because the front panel is analogous to a front panel of a real instrument, the inputs are called controls and the outputs are called indicators. However, the term "control" is also used in this specification to mean both controls and indicators for convenience. A variety of controls and indicators, such as knobs, switches, buttons, charts, graphs, and so on can be used to make the front panel easily identifiable and understandable. An example of the front panel for a Temperature VI is illustrated in FIG. 42.

Figure 43:
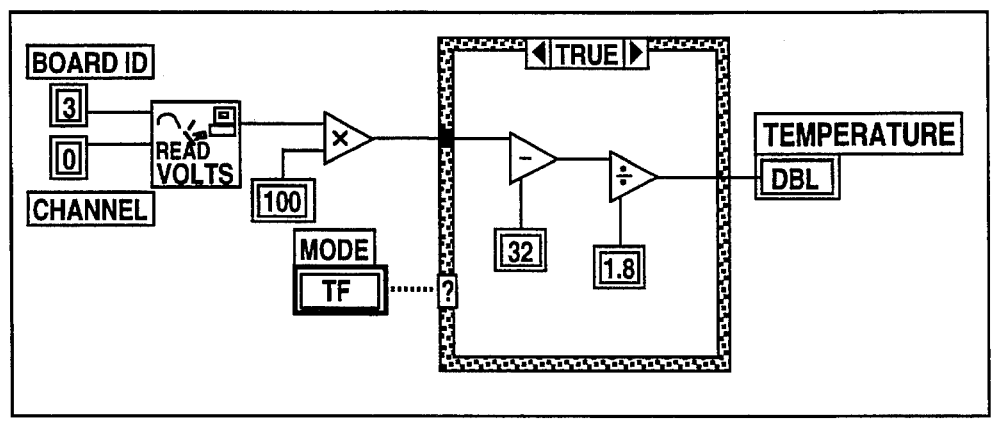
FIG. 43 illustrates the block diagram for the temperature VI in FIG. 42.

Each front panel has an accompanying block diagram, which is the VI program. The block diagram is built using a graphical programming environment, and the block diagram can be thought of as source code in this environment. The components of the block diagram represent program nodes that are "wired" together to show the flow of data within the block diagram. The block diagram for the Temperature VI is shown in FIG. 43.

Figure 44:
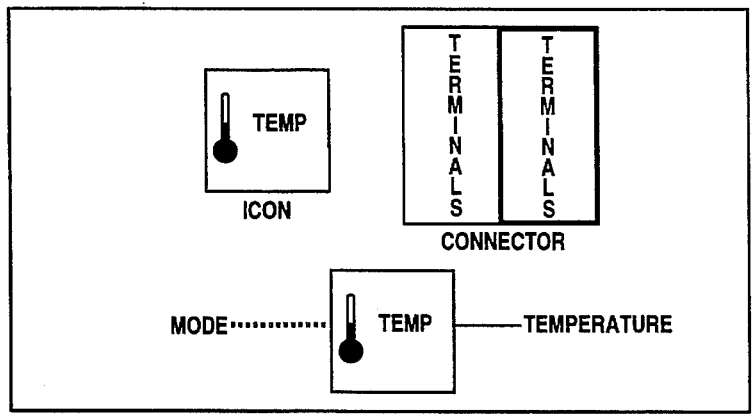
FIG. 44 illustrates the icon and connector for the temperature VI in FIGS. 42 and 43.

Referring now to FIG. 44, an icon connector is the means by which a VI is turned into an object that can be used in the block diagrams of other VIs as if it were a subroutine. The icon graphically represents the VI in the block diagram of other VIs. The connector terminals determine where the inputs and outputs on the icon must be wired. The terminals are analogous to parameters of a subroutine. They correspond to the controls and indicators on the front panel of the VI. FIG. 44 shows the icon and connector for the Temperature VI. The connector is usually hidden under the icon until the user chooses to view it.

Figure 45:
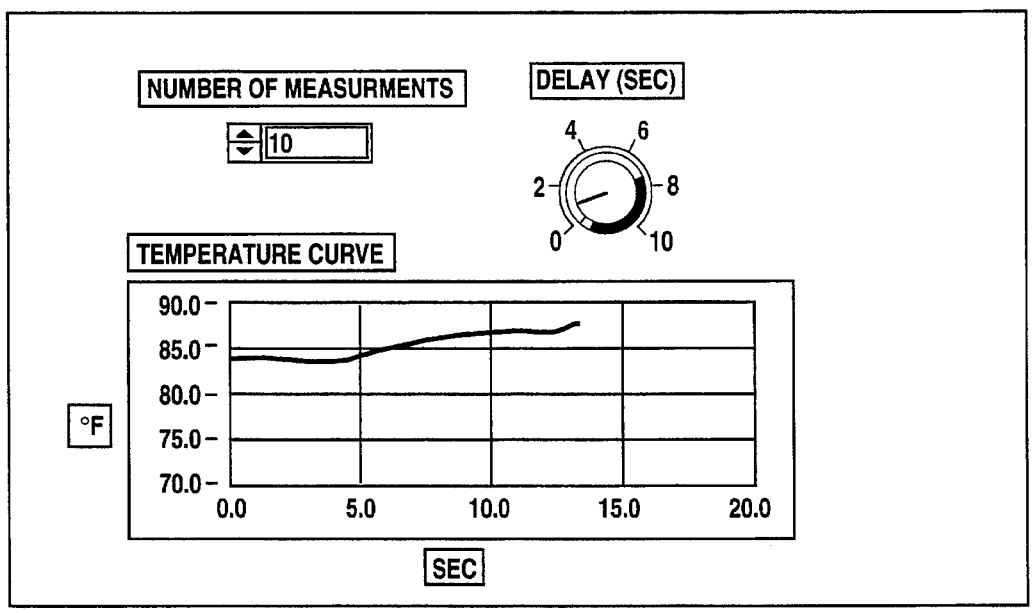
FIGS. 45 and 46 illustrate the front panel and block diagram of a VI that uses the temperature VI in FIGS. 42–44 as a subVI in its block diagram.
Figure 46:
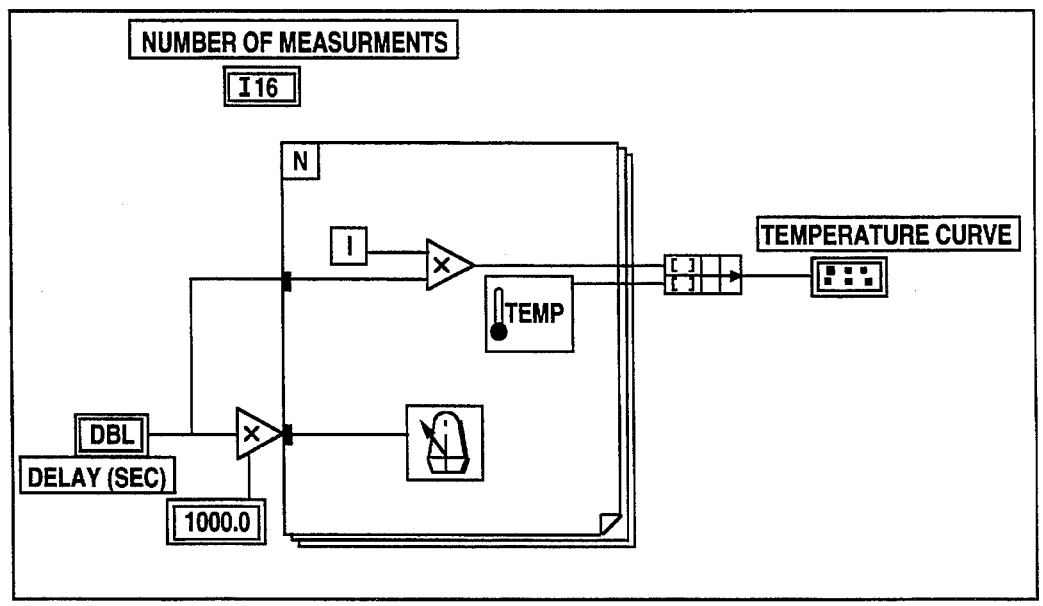

A powerful feature of the preferred embodiment lies in the hierarchical nature of the VI. Once a VI is created, it can be used as a subVI in the block diagram of a higher-level VI. There is no limit on the number of layers in the hierarchy. As an example, the VI illustrated in FIGS. 45 and 46 uses the Temperature VI as a subVI in its block diagram. The front panel for this VI is shown in FIG. 45 and the block diagram is shown in FIG. 46. Referring to FIG. 45, the Temperature VI collects data, and then the top-level VI graphs the results. The user specifies the number of measurements and the delay between each measurement on the top-level VI front panel. The top-level VI block diagram illustrated in FIG. 46 shows the Temperature VI in a loop. The VI collects the measurement during each iteration of the loop. After the loop has executed a specified number of times, the VI passes the data to an icon that graphs it on the front panel of the top-level VI. Therefore, in the preferred embodiment, a VI can be used as a subVI. This makes block diagrams modular, and easy to debug, understand, and maintain.

Panel and Diagram Windows

When the graphical programming environment is begun by double-clicking on its icon, a new, untitled Panel window appears. The Panel window displays the VI front panel and is one of the two windows used to build a VI in the preferred embodiment. The other window, the Diagram window, contains the block diagram.

Figure 47:
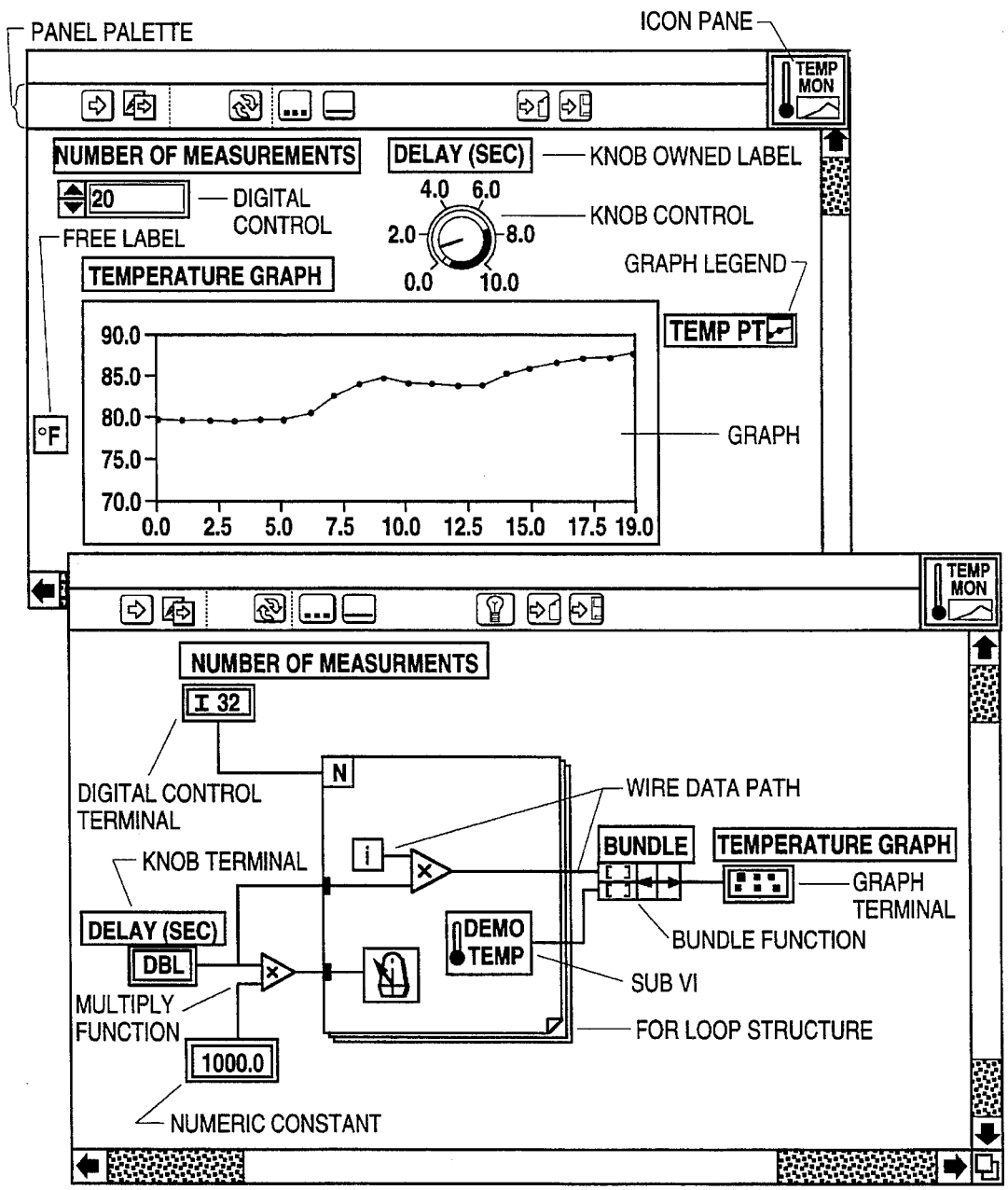
FIG. 47 illustrates a front panel and its associated block diagram.

Front panels and block diagrams comprise collections of graphical objects which represent programming elements. Front panels contain various types of controls and indicators. Block diagrams contain terminals corresponding to front panel controls and indicators, as well as constants, functions, subVIs, structures, and wires that carry data from one object to another. FIG. 47 shows a front panel and its associated block diagram.

Panel Palette

Figure 48:
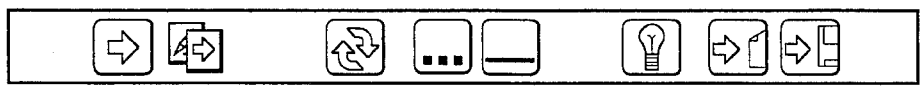
FIG. 48 illustrates the run mode palette that appears at the top of the window when a VI is in run mode.

Both the Panel and Diagram windows contain a palette of command buttons and status indicators that are used for controlling the VI. One of two palettes is available depending on whether the user is operating in run or edit mode. The palette illustrated in FIG. 48 appears at the top of the window when the VI is in run mode. This panel includes, from left to right, icons referred to as the Run button, the Mode button, the Continuous Run button, the Breakpoint button, the Step Mode button, the Execution Highlighting button, the Print Mode button, and the Datalogging button.

1. Run Mode

The user clicks on the Run button (FIG. 49A) to run the VI. While the VI is executing, the button changes to alternate appearances as shown in FIG. 49B depending on whether the VI is a top-level VI or one of the VI callers is running at the top level. While the VI is executing, the Stop button appears as illustrated in FIG. 49C. The user clicks on this button if it is necessary to halt the VI immediately. However, it is noted that the user should avoid using the Stop button to terminate a VI. The user preferably should either let the VI execute to completion or design a method to stop the VI gracefully. For example, placing a switch on the front panel to stop the VI is one method. If a VI contains an error, an icon referred to as the Broken Run button shown in FIG. 49D replaces the Run button and indicates that the VI cannot compile due to errors. To find out why, the user can click on this button and a pop-up window will list all errors.

Figure 50A:
FIGS. 50A–B illustrate the mode button in run mode and edit mode.
Figure 50B:

The Mode button switches operation of the block diagram editor between run mode and edit mode. In run mode, the user can execute but not edit a VI. In edit mode, the user can create and change a VI. Thus the button appears differently depending on whether the program is in run mode (FIG. 50A) or edit mode (FIG. 50B).

Figure 49A:
FIGS. 49A–D illustrate the run button and its associated icons.
Figure 49B:
Figure 49C:
Figure 49D:

If the user desires to run the VI from the edit mode without setting other options in the run mode palette, the user clicks on the run arrow (FIG. 49A). If necessary, the execution subsystem compiles the VI first, then switches to run mode, runs the VI, and returns to edit mode after the VI has run.

Figure 51A:
FIGS. 51A–B illustrate the icons associated with the continuous run button.
Figure 51B:

The user clicks on the Continuous Run button (FIG. 51A) to execute the VI repeatedly. While in the continuous run mode, the symbol changes to where the two arrows are darkened as shown in FIG. 51B. The user clicks on this button to disable continuous running.

Figure 52A:
FIGS. 52A–B illustrate breakpoint button icons.
Figure 52B:

The user clicks on the Breakpoint button (FIG. 52A) to set a breakpoint in the VI. The button changes its appearance (FIG. 52B) to indicate when a breakpoint is set.

Figure 53A:
FIGS. 53A–C illustrate icons associated with the step mode button.
Figure 53B:
Figure 53C:

The user clicks on the Step Mode button (FIG. 53A) to enable single-step mode. When in the single-step mode, the button changes appearance as indicated in FIG. 53B, and the Step button (FIG. 53C) appears besides it. The user clicks on the Step button to single-step through the VI.

Figure 54A:
FIGS. 54A–B illustrate execution highlighting button icons.
Figure 54B:

The user clicks on the Execution Highlighting button (FIG. 54A) to enable execution highlighting. In this mode, the button changes its appearance to that illustrated in FIG. 54B, and the flow of data can be viewed through the block diagram. Execution highlighting is commonly used with single-step mode discussed above to trace the flow of data in the block diagram.

Figure 55A:
FIGS. 55A–B illustrate print mode button icons.
Figure 55B:

The user clicks on the Print Mode button (FIG. 55A) to automatically print the front panel after the VI finishes executing and the VI has updated the indicators with new values. The symbol changes to indicate that the print mode is activated as illustrated in FIG. 55B.

Figure 56A:
FIGS. 56A–C illustrate data logging button icons.
Figure 56B:
Figure 56C:

The user clicks on the Datalogging button (FIG. 56A) to log all front panel control and indicator data to the separate log file when the VI executes. As shown in FIG. 56B, the button changes to indicate when data logging is active, and a complementary button (FIG. 56C) indicates that data is logged in a log file.

2. Edit Mode

In edit mode, the user has access to the palette illustrated in FIG. 57 and VIs can be created and modified. Along with the Run and Mode buttons, this palette contains the tools needed to build and operate VIs. These tools include from left to right the Operating tool, Positioning tool, Labeling tool, Wiring tool, and Coloring tool. After a tool is selected from the menu, the mouse cursor takes its shape.

The Operating tool (FIG. 58A) is used to manipulate front panel controls and indicators. As shown in FIG. 58B, the tool changes when it passes over a text-based control such as a digital or string control.

The Positioning tool (FIG. 59A) is used to select, move, or resize objects. The tool changes form when it passes over a corner of a resizable object, as illustrated in FIG. 59B and 59C.

The Labeling tool appears as shown in FIG. 60B and is used to enter text into labels or create free labels. The tool changes to the form illustrated in FIG. 60C when the user creates free labels.

The Wiring tool (FIG. 61) is used to wire objects together on the block diagram.

The Coloring tool (FIG. 62) is used to color an object. FIG. 62B shows the alternate form of the coloring tool when the user wishes to set the color of the tool from the object.

When any tool is placed over a subVI or function icon, information pertaining to the particular subVI or function is displayed in the Help Window. It is noted that the user must first select Show Help Window from the Windows menu to do so.

Pop-Up Menus

The menu used most often in the preferred embodiment is the pop-up menu. Nearly all the objects required to build VIs require pop-up menus for selection and modification. The action of accessing a pop-up menu is known as "popping-up."

Pull-Down Menus

Figure 70:
FIG. 70 illustrates the menu bar when the diagram window is active.

The menu bar at the top of the screen illustrated in FIG. 63 contains several pull-down menus. The pull-down menus contain options common to most applications, such as Open, Save, Copy, and Paste, as well as many others. FIG. 63 shows the menu bar when the Panel window is active. As shown in FIG. 70 the Functions menu replaces the Controls menu when the Diagram window is active.

1. File Menu

Referring now to FIG. 64, options in the File menu are used primarily to open, close, save, and print VIs.

The New option creates a new VI and opens its panel.

The Open . . . option opens an existing VI.

The Close option closes the active window.

The Save option saves the current VI.

The Save As . . . option saves the current VI under a new name.

The Save A Copy As . . . option saves a copy of the current VI under a new name.

The Save with Options . . . option allows options for saving VIs without hierarchy and/or block diagrams.

The Revert . . . option reverts the current VI to the last saved version.

The Page Setup . . . option sets configuration options for the printer.

The Page Layout . . . option sets options for printing the VI.

The Print Preview . . . option displays selected VI components as they appear when printed.

The Print . . . option prints selected components of the current VI.

The Data Logging option displays data logging options.

The Get Info . . . option displays a dialog box containing information on the current VI.

The Edit VI Library . . . option removes VIs in a library or rearranges VI palette order.

The Mass Compile . . . option compiles all VIs in a library.

The Import Picture . . . option imports graphics files.

The Build Application . . . option builds a stand-alone application using Application Builder (optional).

The Quit or Exit option quits operation.

2. Edit Menu

As shown in FIG. 65 the options in the Edit menu are used to build the front panel and block diagram of a VI.

The UNDO option restores the current VI to its state immediately prior to the last editing step (currently not implemented).

The Cut option removes the selected object and places it on the Clipboard.

The Copy option copies the selected object and places it on the Clipboard.

The Paste option places a copy of the Clipboard contents in the active window.

The Clear option deletes the selected object.

The Remove Bad Wires option deletes all faulty wiring connections.

The Panel Order . . . option changes the order number for front panel objects interactively.

The Edit Control . . . option invokes the Control Editor.

The Alignment option aligns selected items using a selected Alignment axis.

The Align option aligns the selected items by the current Alignment setting.

The Distribution option distributes selected items using selected Distribution setting.

The Distribute option spaces the selected items by the current Distribution setting.

The Move Forward option moves selected item on position higher in the stack.

The Move Backward option moves the selected item one position lower in the stack.

The Move to Front option moves the selected item to the top of the stack.

The Move to Back option moves the selected item to the bottom the stack.

The Preferences . . . option sets preferences for memory, disk, and display.

The Move Forward, Move Backward, Move to Front, and Move to Back options are useful when multiple objects are "stacked up" so that they overlap. This is a useful feature for creating certain visual effects on the front panel.

3. Operate Menu

As shown in FIG. 66 the commands in the Operate menu are used to execute the VI.

The Run option executes the current VI.

The Stop option stops execution of the current VI.

The Change to Run Mode option toggles between Run mode and Edit mode. (In run mode the menu item reads "Change to Edit Mode")

The Make Current Values Default option makes current values the default on all controls and indicators.

The Reinitialize All to Default option sets all controls and indicators to their default values.

4. Controls Menu

Referring now to FIG. 67 controls and indicators are added to the front panel via the Controls menu. Each option in the menu displays a palette of available controls and indicators for that selection. The Controls menu is available only when the Panel window is active.

- The Numeric option displays controls and indicators for numeric data.
- The Boolean option displays controls and indicators for Boolean values.
- The String option displays controls and indicators for ASCII character strings.
- The Array & Cluster option displays controls and indicators that group sets of data types.
- The Graph option displays indicators that plot numeric data in graph or real time chart form.
- The Path & RefNum option displays controls for file paths and refnums.
- The Decoration option displays graphical objects that enhance the panel display.
- The Control . . . option displays a dialog box to load custom controls.
- The Picture option displays indicators for drawing graphical objects.

5. Windows Menu

Figure 68:
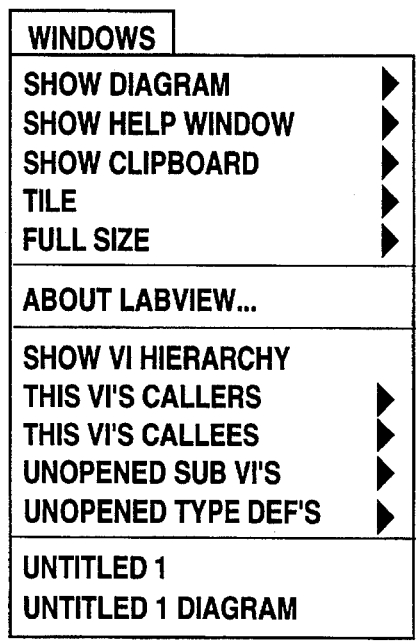
FIG. 68 illustrates the windows menu.

Referring now to FIG. 68 the Windows menu is used to locate opened windows quickly and to open windows of subVIs and calling VIs.

The Show Diagram option makes the diagram window active. (When the diagram is active, the menu item reads "Show Panel")

The Show Help Window displays the help window for block diagram function and VIs. (When the Help Window is visible the menu item reads "Hide Help Window")

- The Show Clipboard option displays the contents of the clipboard. (if clipboard visible then "hide")
- The Tile option displays the front panel and block diagram of a VI side by side.
- The Full Size option uses the entire screen to display the active window.
- The About LabVIEW . . . option displays a dialog box with the LabVIEW version number. The preferred embodiment of the graphical dataflow programming environment is marketed under the trademark LabVIEW®.
- The Show VI Hierarchy option graphically displays the calling hierarchy of all VIs in memory. (if hierarchy window visible, menu reads "hide hierarchy window")
- The This VI's Callers and the This VI's Callees options displays a palette of VIs that call the current VI and a palette of subVIs of the current VI, respectively.
- The Unopened SubVIs option displays a palette of subVIs that are unopened,
- The Unopened Type Defs option . . . allows the user to open a file containing the original of a type definition. For more information please see related U.S. patent application Ser. No. 08/125,459 titled "Method and Apparatus for Providing Improved Type Compatibility Checking Data Structure Variable in a Graphical Data Flow Program," filed Sep. 22, 1993, which is hereby incorporated by reference.

At the bottom of the Windows menu, all the Panel and Diagram windows currently open are listed. A check mark indicates an active window.

6. Text Menu

Figure 69:
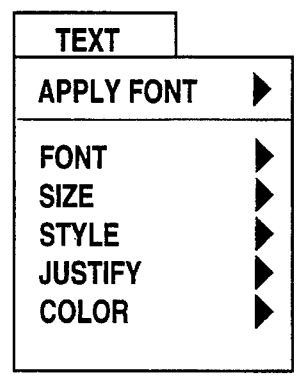
FIG. 69 illustrates the text menu.

Referring now to FIG. 69, the Text menu is used to change the font, style, and color of text.

- The Apply Font option displays options to let the user choose from predefined font styles.
- The Font option displays available fonts.
- The Size option displays font sizes.
- The Style option displays font styles such as plain, bold, italic, and underline.
- The Justify option displays options to justify text such as left, center, and right.
- The Color option displays a color palette to color text.

Figure 71:
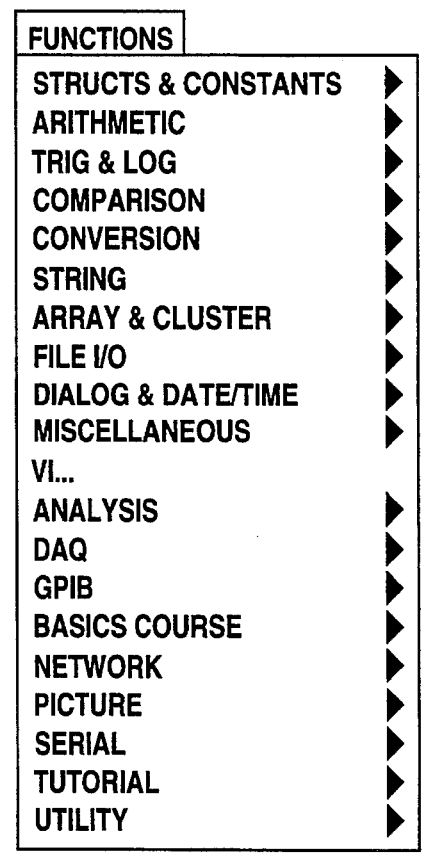
FIG. 71 illustrates the functions menu.

As shown in FIG. 70, when the Diagram window is active, the Functions menu illustrated in FIG. 71 replaces the Controls menu from the Panel window menu bar. All other menu selections are identical.

7. Functions Menu

The user builds the block diagram with the Functions menu. Each option in the menu displays a palette of available icons for that option. As mentioned above, the Functions menu is only available when the Diagram window is active.

- The Structs & Constants option displays program control structures, such as For Loops and constants.
- The Arithmetic option displays arithmetic and logical functions.
- The Trig & Log option displays trigonometric and logarithmic functions.
- The Comparison option displays functions to compare numbers, Booleans, or strings.
- The Conversion option displays functions to convert from one data type to another.
- The String option displays functions to manipulate strings.
- The Array & Cluster option displays function to process arrays and graph data.
- The File I/O option displays functions for reading and writing files.
- The Dialog & Date/Time option displays functions for operator dialog, timing, and time/date acquisition.
- The Miscellaneous option displays miscellaneous functions.
- The VI . . . option invokes the Select File dialog box, from which you can select any VI.
- The Analysis option displays analysis VIs.
- The DAQ option displays data acquisition VIs (for plug-in data acquisition boards).
- The GPIB option displays VIs for controlling the GPIB interface.
- The Basics Course option displays the VIs used in the Basic training course manual.
- The Network option displays VIs for communicating over a network.
- The Picture option displays VIs for creating pictures.
- The Serial option displays VIs for controlling a serial port.
- The Tutorial option displays VIs used in the tutuorial manual.
- The Utility option displays utility VIs.

Creating a VI

VIs have three main parts: the front panel, the block diagram, and the icon/connector. The front panel and the block diagram are discussed here, and the icon/connector is discussed below.

Front Panel

The front panel of a VI is built with a combination of controls and indicators. Controls are the means of supplying data to the VI. Indicators display data that the VI generates. There are several types of controls and indicators. These include numeric, Boolean (True-False), string, array and cluster, and graph. Controls and indicators are added to the front panel through the Controls menu.

"Popping up" is the preferred method for placing objects on the Panel and Diagram windows. If a free area in the Panel window is popped up on, the Controls menu is accessed. Similarly, if a free area in the Diagram window is popped up on, the Functions menu is accessed. This method is not only quicker than moving the cursor to the panel palette, but the selected item will appear where the cursor is positioned instead of at the center of the window.

Numeric Controls and Indicators

Figure 72:
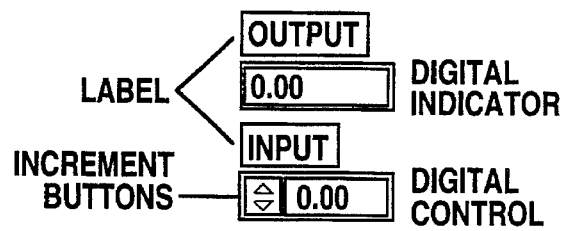
FIG. 72 illustrates examples of numeric controls and indicators.

Numeric controls are used to enter numeric quantities, while numeric indicators display numeric quantities. The two most commonly used numeric objects are the digital control and the digital indicator illustrated in FIG. 72.

Boolean Controls and Indicators

Figure 73:
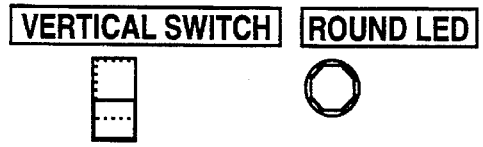
FIG. 73 illustrates examples of Boolean controls and indicators.

Boolean controls and indicators are used to enter and display Boolean (True-False) values. Boolean objects simulate switches, buttons, and LEDs. The most commonly used Boolean objects are the vertical switch and the round LED illustrated in FIG. 73.

Configuring Controls and Indicators

Figure 74:
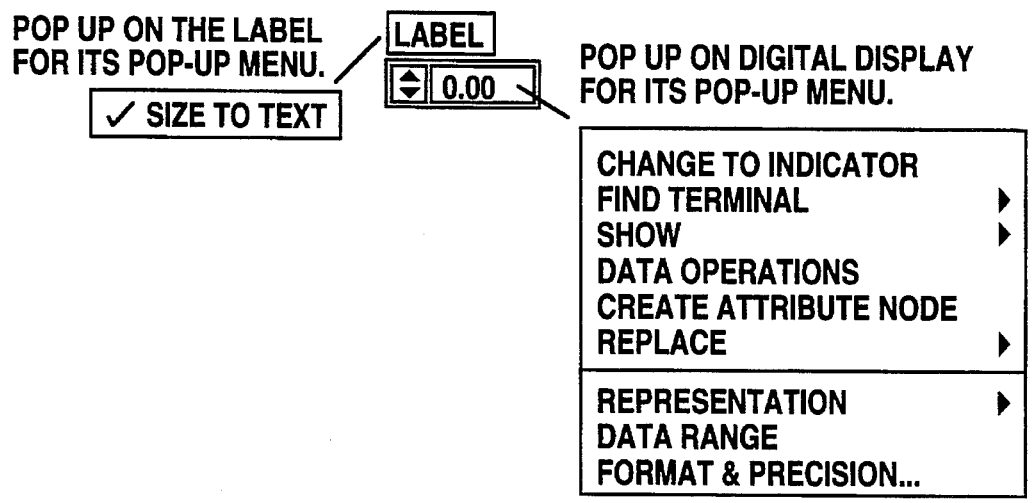
FIG. 74 illustrates how controls and indicators are configured.

Nearly all of the controls and indicators can be configured using options from their pop-up menus. Popping up on individual components of controls and indicators displays menus for customizing those components. This method is illustrated in FIG. 74 for a digital control.

Block Diagram

Figure 75:
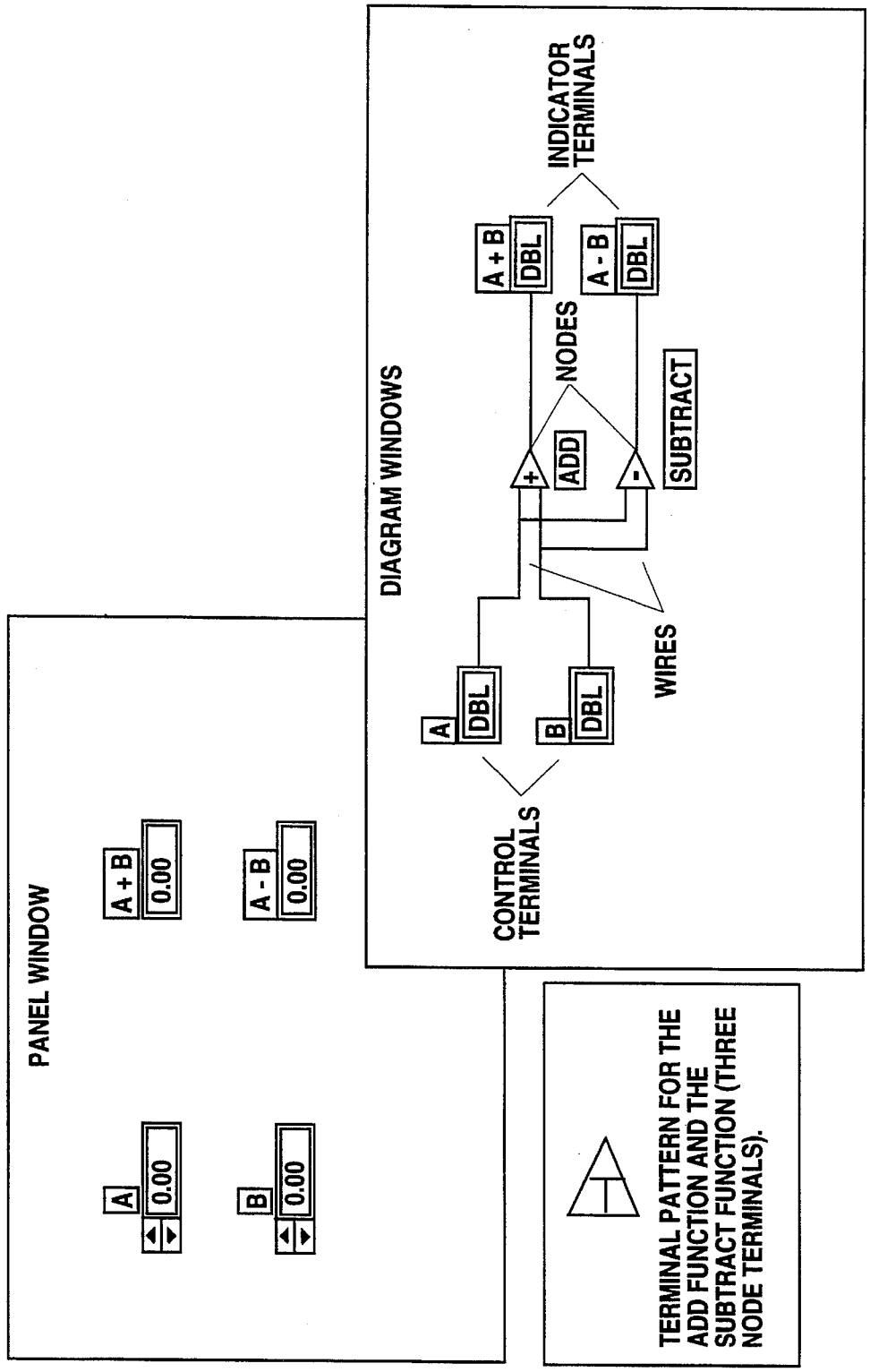
FIG. 75 illustrates the panel window and diagram window of a VI illustrating nodes, terminals, and wires.

As illustrated in FIG. 75, the block diagram is composed of nodes, terminals, and wires. Nodes are program execution elements and nodes are analogous to statements, functions, and subroutines in conventional, text-based programming languages. There are four node types—functions or primitives, subVI nodes, structures, and Code Interface Nodes (CINs). Functions are the built-in nodes for performing elementary operations such as adding numbers, file I/O, or string formatting. SubVI nodes are VIs that are designed by the user and later called from the diagram of another VI. Structures such as For Loops and While Loops control the flow of the program. CINs are interfaces between the block diagram and user-supplied code written in a text-based programming language. FIG. 75 shows a VI that has two function nodes, one that adds two numbers and one that subtracts them.

Terminals are ports through which data passes between the block diagram and the front panel and between nodes of the block diagram. Terminals are analogous to parameters and constants. There are two types of terminals—control or indicator terminals and node terminals. Control and indicator terminals belong to front panel controls and indicators. The values that an operator or a calling VI enters into these controls pass to the block diagram through these terminals when the VI executes. When the VI finishes executing, the output data passes from the block diagram to the front panel through the indicator terminals. Control and indicator terminals are automatically created or deleted when a front panel control or indicator is created or deleted. The block diagram of the example VI in FIG. 75 shows terminals belonging to four front panel controls and indicators. Like VIs, the Add and Subtract functions also have node terminals which underlie the icon. The terminal pattern for the Add function and the Subtract function is also illustrated in FIG. 75.

Wires are data paths between terminals and are analogous to variables in conventional languages. Data flows in only one direction, from a source terminal to one or more destination terminals. Different wire patterns represent different data types, as shown in FIG. 76. On a color monitor each data type appears in a different color for emphasis. Examples of the more common wire types are also shown in FIG. 76.

Data Flow Programming

The principle that governs how a program executes in the preferred embodiment is called data flow. A node executes only when data is available at all its input terminals; the node supplies data to all of its output terminals when it finishes; and the data passes immediately from source to destination terminals. Data flow contrasts with the control flow method of executing a conventional program, in which instructions execute in the sequence in which they are written.

As an example, consider a VI that multiplies two numbers together and then subtracts 50.0 from the result of the addition. The block diagram for such a VI is shown in FIG. 77. In this case, the block diagram executes from left to right, not because the objects are placed in that order, but because one of the inputs of the Subtract function is not valid until the Multiply function has multiplied the numbers together and passed the data to the Subtract function. It is again noted that a node (function) executes only when data is available at all of its input terminals, and it supplies data to its output terminals only when it finishes.

In the example shown in FIG. 78, it is not clear which function would execute first—the multiply or divide. This is unknown because input to both the divide and multiply functions is available at the same time. In a situation where one function must execute before another, and there is no type of dependency between the functions, a Sequence structure must be used to force the order of execution.

Basic Ideas

Figure 79:
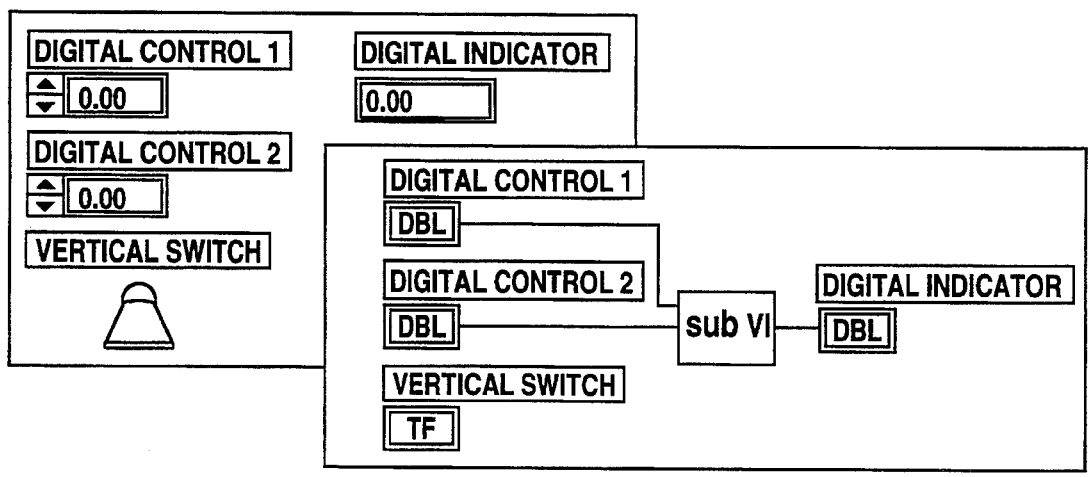
FIG. 79 illustrates icons grouped together into lower level VI.

Referring now to FIG. 79, one key to creating applications in the preferred embodiment is understanding and using the hierarchical nature of the VI. That is, once a VI is created, it can be used as a subVI in the block diagram of a higher-level VI. When creating an application, the user should start at the top-level VI and define the inputs and outputs for the application. Then, subVIs are constructed to perform the necessary operations on the data as it flows through the block diagram. If a block diagram has a large number of icons, they should be grouped into a lower-level VI to maintain the simplicity of the block diagram. This modular approach makes applications easy to debug, understand, and maintain.

Figure 80:
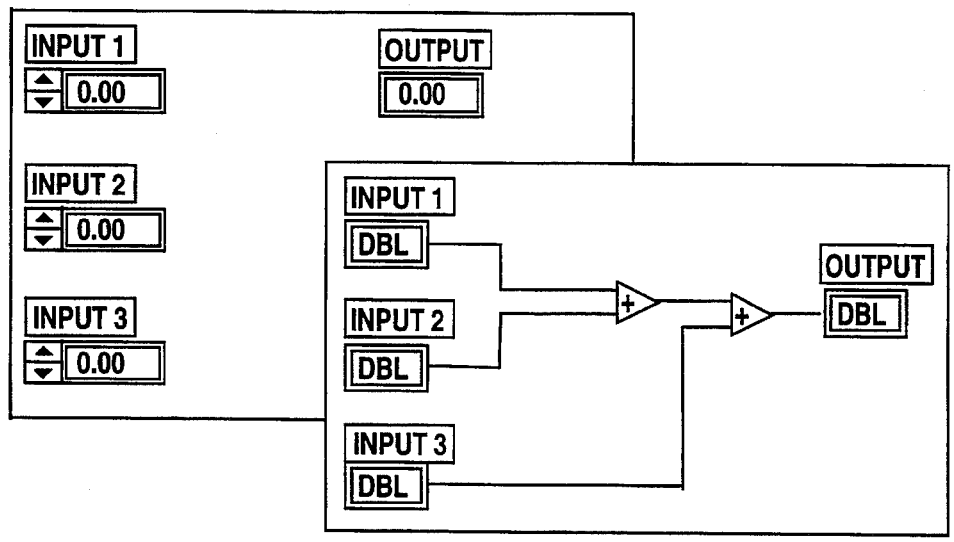
FIG. 80 illustrates a VI that adds three numbers together and returns their result.

As an example, consider a VI that adds three numbers together and returns the result. The front panel and the block diagram for the VI shown in FIG. 80. To use this VI as subVI, an icon and a connector must be created for it.

Creating the Icon and Connector

A VI used as a subVI needs an icon to represent it in the block diagram of a calling VI. The subVI also must have a connector with terminals to pass data to and from the higher-level VI.

Icon

Figure 81:
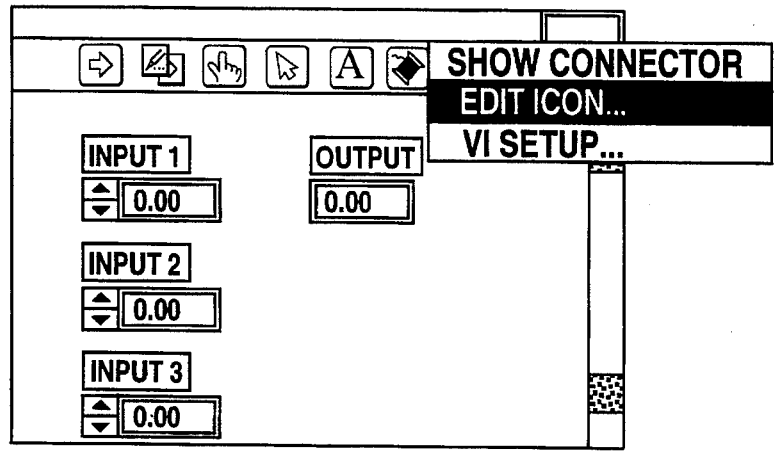
FIG. 81 illustrates activating the icon editor.
Figure 82:
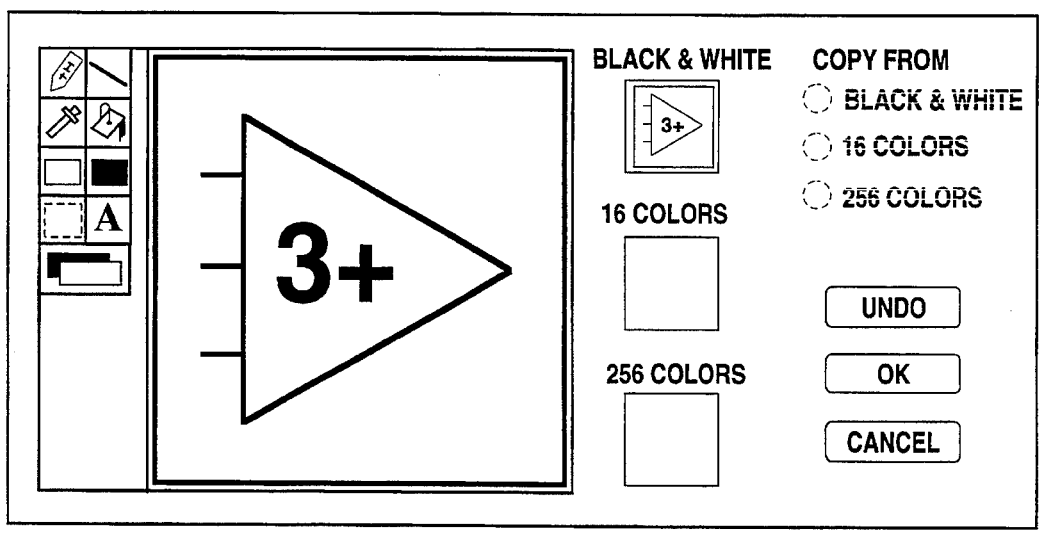
FIG. 82 illustrates the tools that may be used to create an icon design.

Every VI has a default icon displayed in the upper-right corner of the Panel and Diagram windows. The default icon is a blank frame. The Icon Editor is used to design the icon by turning individual pixels on and off. To activate the Icon Editor, pop up on the blank icon in the top right corner of the Panel window and select Edit Icon as shown in FIG. 81. It is noted that the menu is available only in the edit mode. The window illustrated in FIG. 82 appears. The tools shown on the left side of the illustration are used to create the icon design in the fat pixel editing area. The actual-size icon image appears in one of the boxes to the right of the editing area.

Connector

The connector is the programmatic interface to a VI. Data passes from front panel controls and to front panel indicators via the connector terminals. Connections are defined by choosing the number of terminals desired for the VI and assigning a front panel control or indicator to each of those terminals. If the panel controls or indicators are used programmatically, these controls or indicators need terminals on the connector pane.

Figure 83:
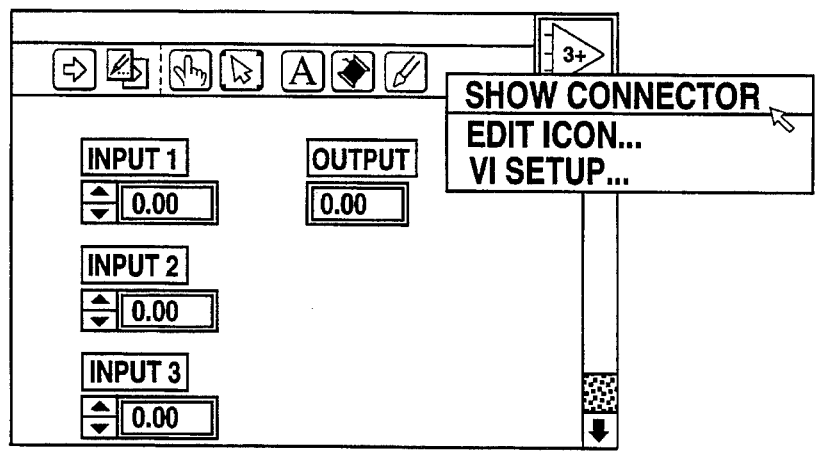
FIG. 83 illustrates the show connector function in the icon pane pop-up menu which may be used to define a connector.
Figure 84:
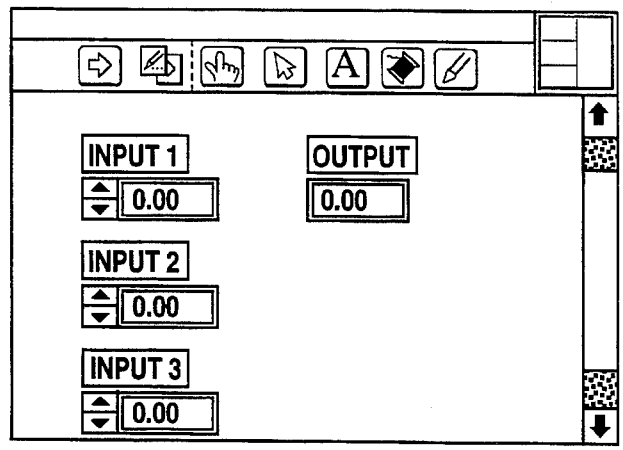
FIG. 84 illustrates a front panel with the connector replacing the icon pane in the upper right corner of the panel window.

To define a connector, Show Connector is selected from the icon pane pop-up menu, as illustrated in FIG. 83. The Diagram window does not have a connector pane. The connector replaces the icon in the upper-right corner of the Panel window, as shown in FIG. 84. The block diagram editor tries to select a terminal pattern for the VI with as many terminals on the left of the connector pane as controls on the front panel, and as many terminals on the right of the connector pane as indicators on the front panel.

Each rectangle on the connector represents a terminal area, and the rectangles may be used for either input to or output from the VI. If necessary, different terminal patterns can be selected for the VI.

Selecting and Modifying Terminal Patterns

Figure 85:
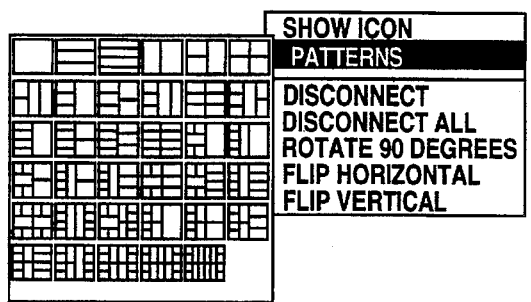
FIG. 85 illustrates the various choices for terminal patterns selected using the patterns option from the pop-up menu.

Referring now to FIG. 85, to select a different terminal pattern for the VI, pop up on the connector and choose Patterns from the pop-up menu. A boldfaced border highlights the pattern currently associated with the icon. To change the pattern, click on a new pattern. If a new pattern is chosen, any assignment of controls and indicators to the terminals on the old connector pane will be lost.

In order to change the spatial arrangement of the connector terminal patterns, one of the following commands from the connector pane pop-up menu is chosen: Flip Horizontal, Flip Vertical, or Rotate 90°. These items are disabled if any terminal connections exist.

Assigning Terminals to Controls and Indicators

Front panel controls and indicators are assigned to the terminals using the wiring tool. The following steps detail the method to follow in order to associate the connector pane with the front panel controls and indicators.

Figure 86:
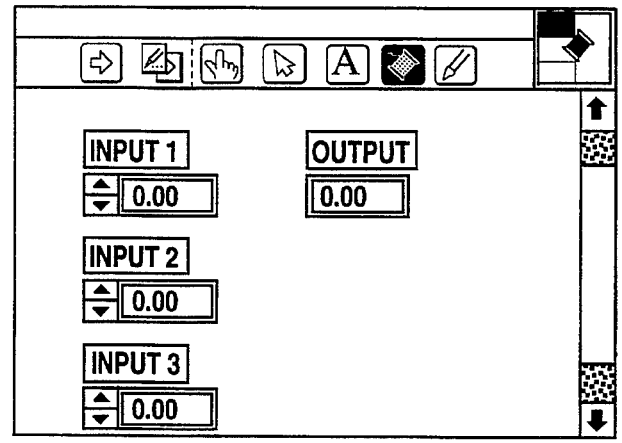
FIG. 86–88 illustrates how a user assigns front panel controls and indicators to the terminals using the wiring tool.
Figure 87:
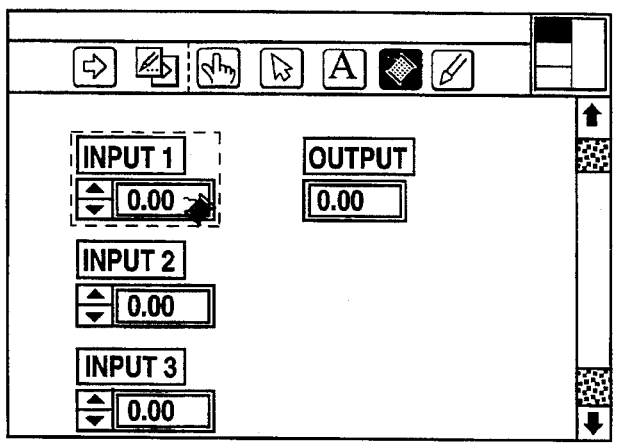
Figure 88:
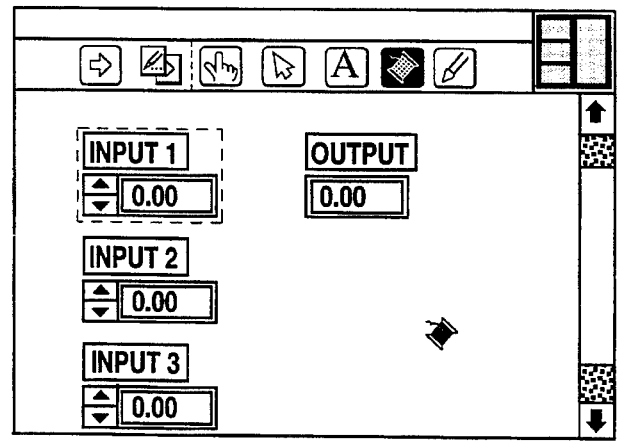

1. Click on a connector terminal. The tool automatically changes to the Wiring tool. The terminal turns black (See FIG. 86).
2. Click on the front panel control or indicator to be assigned to the selected terminal. A marquee frames the selected control as shown in FIG. 87. As shown in FIG. 88, if the cursor is positioned in free space and clicked, the dashed line disappears and the selected terminal dims, indicating that the control or indicator selected now corresponds to the dimmed terminal. It is noted that although the Wiring tool is used to assign terminals on the connector to front panel controls and indicators, no wires are drawn between the connector and these controls and indicators.
3. Steps 1 and 2 are repeated for each control and indicator to be connected.

It is also possible to select the control or indicator first and then select the terminal. A pattern can be chosen with more terminals than necessary. Unassigned terminals do not affect the operation of the VI. There can also be more front panel controls than terminals.

Using a VI as a SubVI

Figure 89:
FIG. 89 illustrates the VI option which is used to place a VI as a subVI in the block diagram of another VI.

Any VI that has an icon and a connector may be used as a subVI in the block diagram of another VI. VIs to be used as subVIs are selected from the VI . . . option of the Functions menu as shown in FIG. 89. Choosing this option produces a file dialog box, from which any VI in the system can be selected. If a VI is opened that does not have an icon and a connector, a blank square box appears in the calling VI's block diagram. This node cannot be wired to.

A subVI is analogous to a subroutine. A subVI node (icon/connector, i.e., I-use node) is analogous to a subroutine call. The subVI node is not the subVI itself, just as a subroutine call statement in a text-based program is not the subroutine itself. A block diagram that contains several identical subVI nodes calls that subVI several times.

Opening, Operating, and Changing SubVIs

A VI used as a subVI may be opened from the calling VI block diagram. The Panel window of the subVI is opened by double-clicking on the subVI icon. The Diagram window can then be opened by selecting Show Diagram from the Windows menu.

Any changes made to a subVI alter only the version in memory until the subVI is saved. It is noted that the changes affect all calls to the subVI and not just the node used to open the VI.

Online Help for SubVI Nodes

Figure 90:
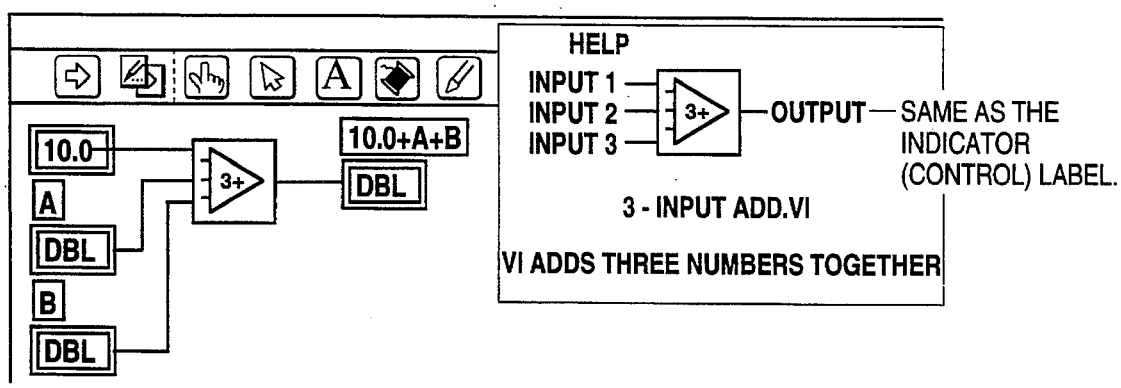
FIG. 90 illustrates the help window for a subVI icon.

When one of the editing tools is moved across a subVI node, the Help window shows the subVI icon with wires attached to each terminal. An example is shown in FIG. 90. Show Help Window is first selected and then an editing tool is placed on the subVI to display the wiring diagram. After choosing the Help window, the Diagram window must be clicked on to make it active.

While Loop

Figure 91:
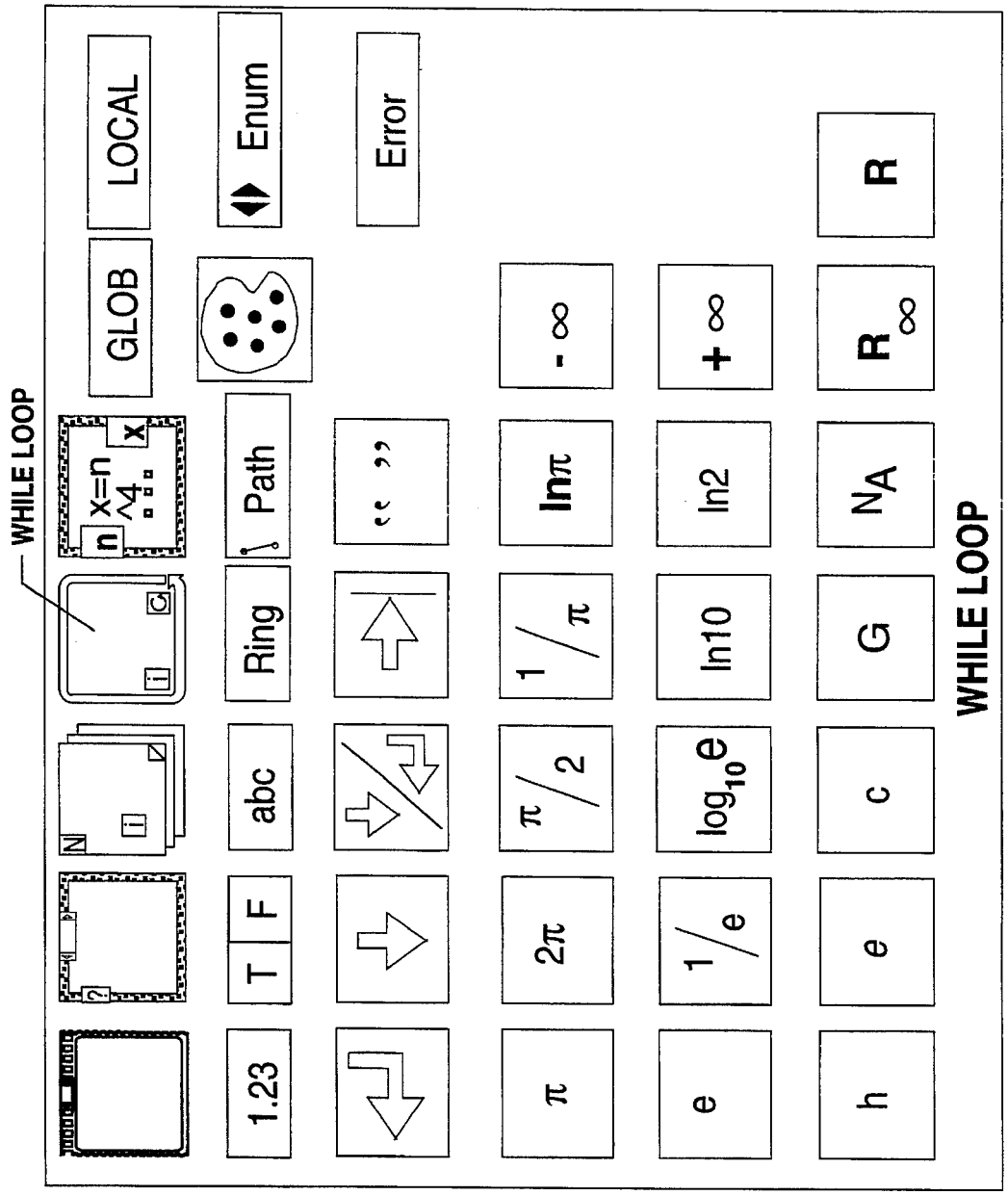
FIG. 91 illustrates a While Loop selected from the Structs and Constants palette of the Functions Menu.
Figure 92:
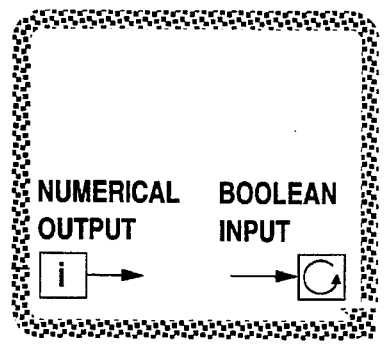
FIG. 92 illustrates a while loop.

Referring now to FIG. 91, the While Loop, which is referred to in FIG. 12D as an indefinite loop structure, is placed in the block diagram by selecting it from the Structs & Constants palette of the Functions menu (FIG. 71). As shown in FIG. 92, the While Loop is a resizable box used to execute the diagram inside it until the Boolean value passed to the conditional terminal is FALSE. The VI checks the conditional terminal at the end of each iteration; therefore, the While Loop always executes once. The iteration terminal is an output numeric terminal that contains the number of times the loop has executed.

The While Loop is equivalent to the following pseudo-code:

Do

Figure 93:
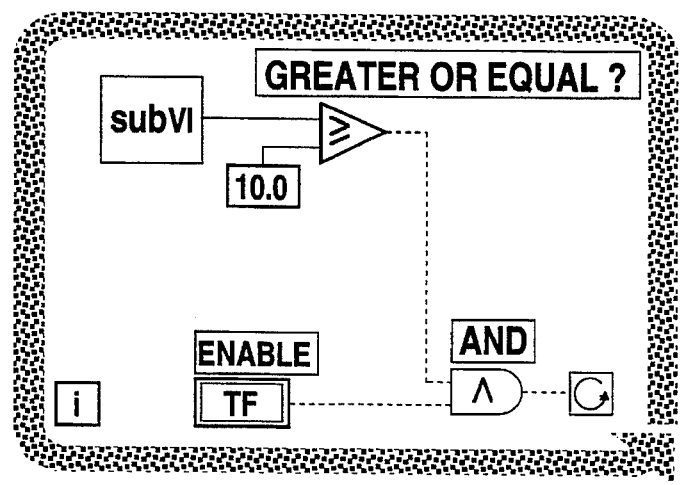
FIG. 93 illustrates an example of a while loop.

Execute Diagram Inside the Loop (which sets the condition) While Condition is TRUE In the example shown in FIG. 93, the While Loop executes until tile value output from the subVI is less than 10 or the Enable Boolean is FALSE. (The And function outputs a TRUE only if both inputs are TRUE; otherwise it outputs a FALSE.)

For Loop

Figure 94:
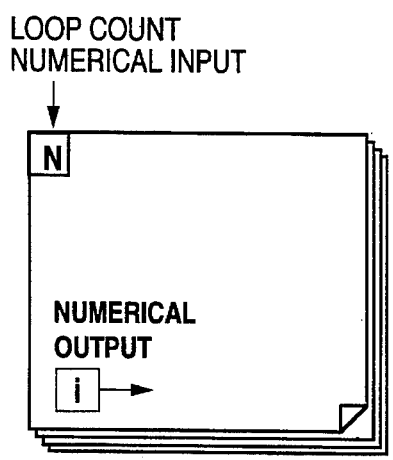
FIG. 94 illustrates a for loop.

Referring now to FIG. 94, the For Loop, which is referred to in FIG. 12B as an iterative loop structure, is placed on the block diagram by selecting it from the Structs & Constants palette of the Functions menu (FIG. 71). The For Loop is a resizable box, and it executes the diagram inside its border a predetermined number of times. The For Loop has two terminals: the count terminal (an input terminal) and the iteration terminal (an output terminal). The count terminal specifies the number of times (N) to execute the loop. The iteration terminal contains the number of times (i) the loop has executed.

Figure 95:
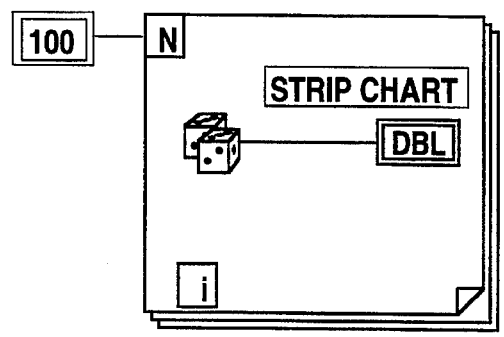
FIG. 95 illustrates an example of a for loop.
Figure 100A:
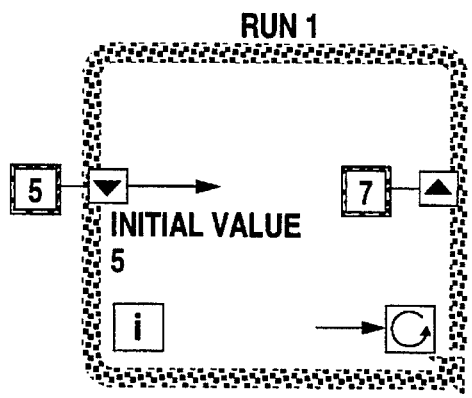
FIG. 100 illustrates operation of initialized and uninitialized shift registers.
Figure 100B:
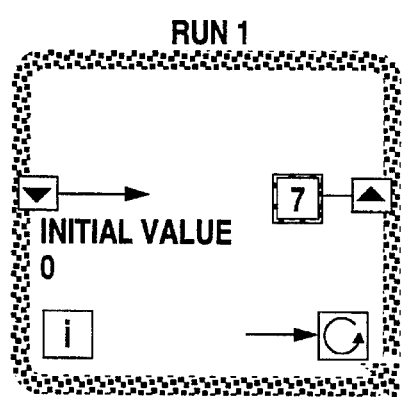
Figure 100C:
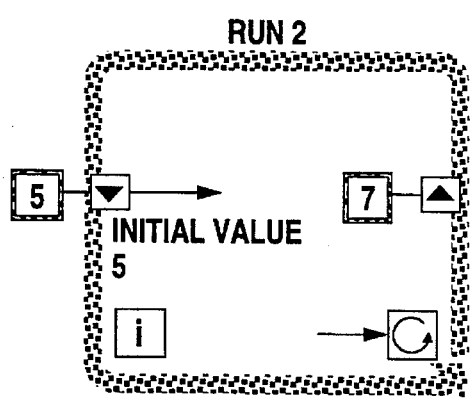
Figure 100D:
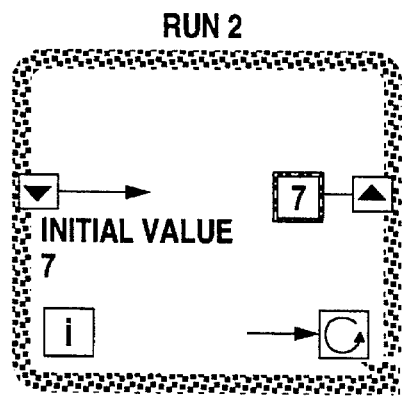

The For Loop is equivalent to the following pseudo-code:
For i=0 to N-1
Execute Diagram Inside The Loop The example in FIG. 95 shows a For Loop that generates 100 random numbers and displays the points on a waveform chart. It is noted that the loop timing of For Loops and While Loops can be controlled using a function referred to as "Wait Until Next ms Multiple." This function ensures that no iteration is shorter than a specified number of milliseconds.

Numeric Conversion

All previous numeric controls and indicators are double-precision floating-point numbers. In the preferred embodiment, however, numerics can be represented as integers (byte, word, or long) or floating-point numbers (single, double, or extended precision). The default representation for a numeric is double precision floating point.

If two terminals are wired together that are of different data types, the block diagram editor converts one of the terminals to the same representation as the other terminal. As a reminder, the editor places a gray dot, called a coercion dot, on the terminal where the conversion takes place.

For example, consider the For Loop count terminal "N" in FIG. 96. The terminal representation is a long integer. If a double-precision floating-point number is wired to the count terminal, the block diagram editor converts the number to a long integer.

When the VI converts floating-point numbers to integers, the VI rounds to the nearest integer. x0.5 is round to the nearest even integer. For example, 2.5 is rounded to 2 and 3.5 is rounded to 4.

Shift Registers

Referring now to FIG. 97, shift registers (available for While Loops and For Loops) are local variables that transfer values from one iteration to the next. A shift register is created by popping up on the left or right loop border and selecting Add Shift Register from the pop-up menu.

As shown in FIG. 97, the shift register contains a pair of terminals directly opposite each other on the vertical sides of the loop border. The right terminal stores the data upon the completion of an iteration. That data is shifted at the end of the iteration and it appears in the left terminal at the beginning of the next iteration (see FIG. 98). A shift register can hold any data type—numeric, Boolean, string, array, and so on. The shift register automatically adapts to the data type of the first object that is wired to the shift register.

As shown in FIG. 99, the shift register can be configured to remember values from several previous iterations. This feature is very useful when averaging data points. Additional terminals are created to access values from previous iterations by popping up on the left terminal and choosing Add Element from the pop-up menu. For example, if three elements are added to the left terminal, values can be accessed from the last three iterations.

Initializing Shift Registers

Referring now to FIG. 100, to initialize the shift register with a specific value, the initial value is wired to the left terminal of the shift register (outside the While Loop). If the initial value is left unwired, the initial value will be the default value for the shift register data type. For example, if the shift register data type is Boolean, the initial value will be FALSE. Similarly, if the shift register data type is numeric, the initial value will be zero.

It is noted that values stored in the shift register are not discarded until the VI is closed and removed from memory.

In other words, if a VI is run which contains uninitialized shift registers, the initial values for the subsequent run will be the ones left from the previous run.

Case Structure

Figure 101:
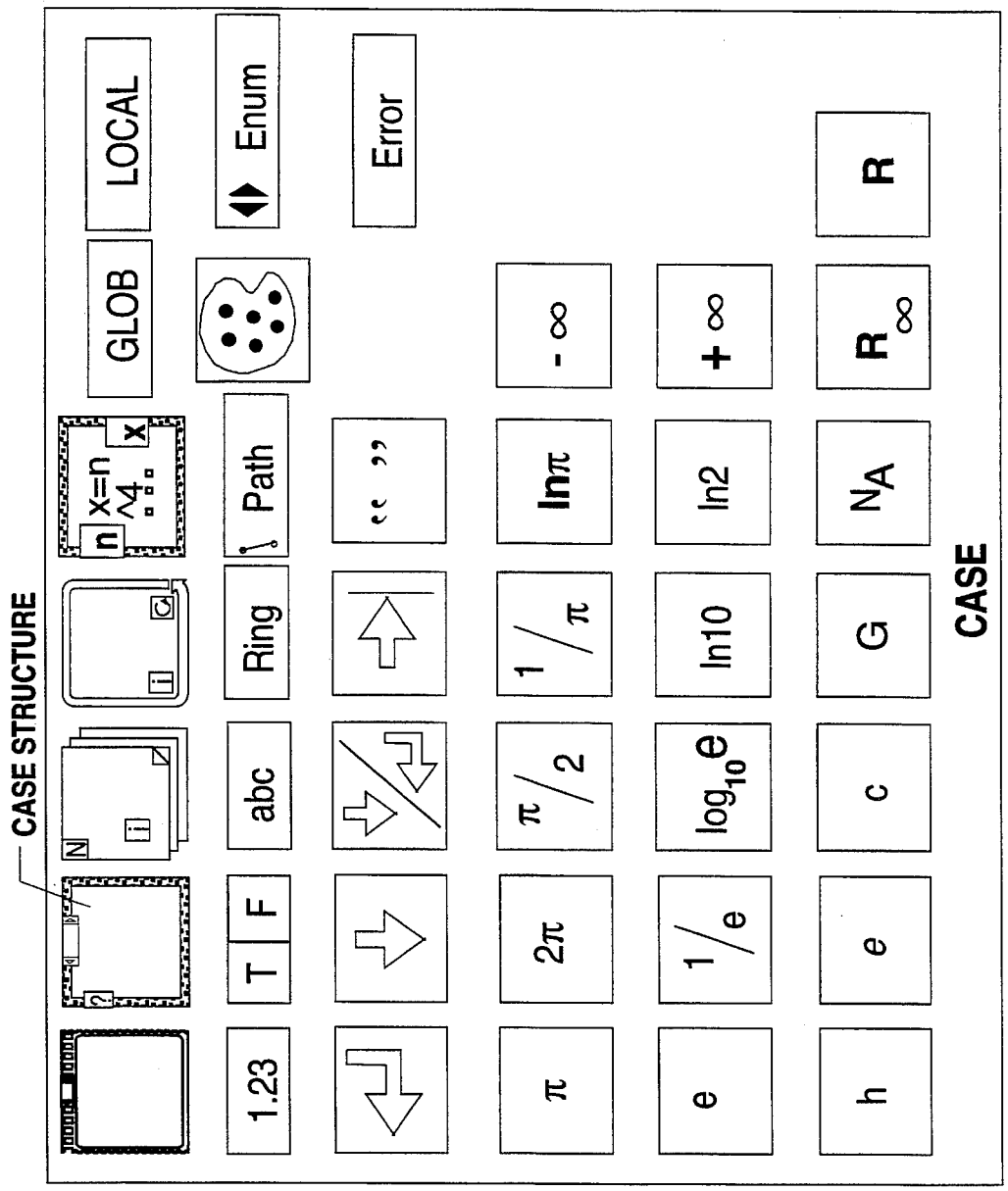
FIG. 101 illustrates selection of a case structure from the Structs and Constants palette of the Function Menu.
Figure 102:
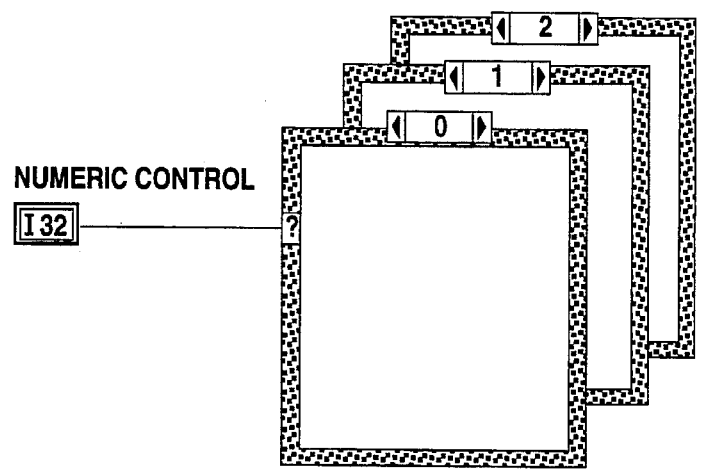
FIG. 102 illustrates a numerical case structure.
Figure 103:
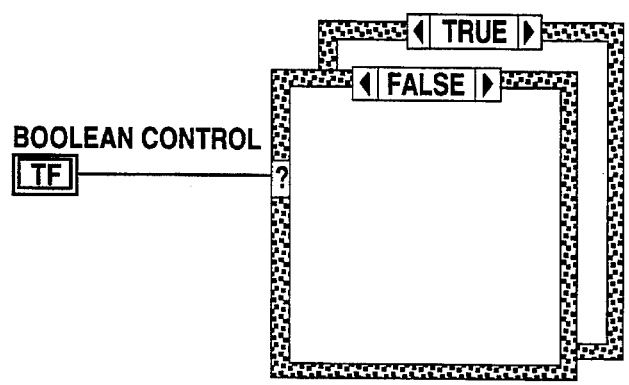
FIG. 103 illustrates a Boolean case structure.

Referring now to FIG. 101, the Case Structure is placed on the block diagram by selecting it from the Structs & Constants palette of the Functions menu (FIG. 71). The Case Structure shown in FIGS. 102 and 103 are analogous to case statements or if ... then ... else statements in conventional, text-based programming languages. The Case Structure is configured like a deck of cards; only one case is visible at a time. Each case contains a subdiagram. Only one case executes depending on the value wired to the selector terminal. The selector terminal can be either numeric or Boolean as shown in FIGS. 102 and 103, respectively. If the data type is Boolean, the structure has a True case and a False case. If the data type is numeric, the structure can have up to $2^{31}-1$ cases.

Figure 104:
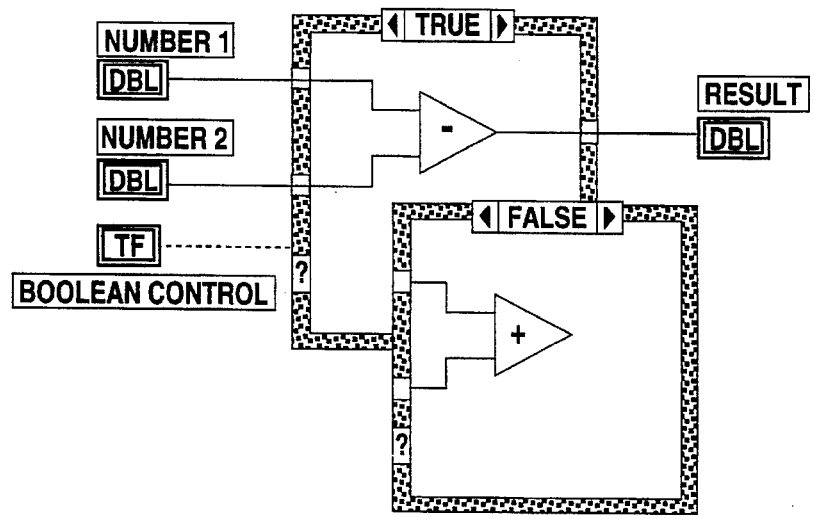
FIG. 104 is an example of a Boolean case structure.

FIG. 104 is an example of a Boolean Case structure. In this example, the numbers pass through tunnels to the Case structure, and are either added or subtracted, depending on the value wired to the selector terminal. If the Boolean wired to the selector terminal is FALSE, the VI will add the numbers; otherwise, the VI will subtract the numbers.

Sequence Structure

Figure 105:
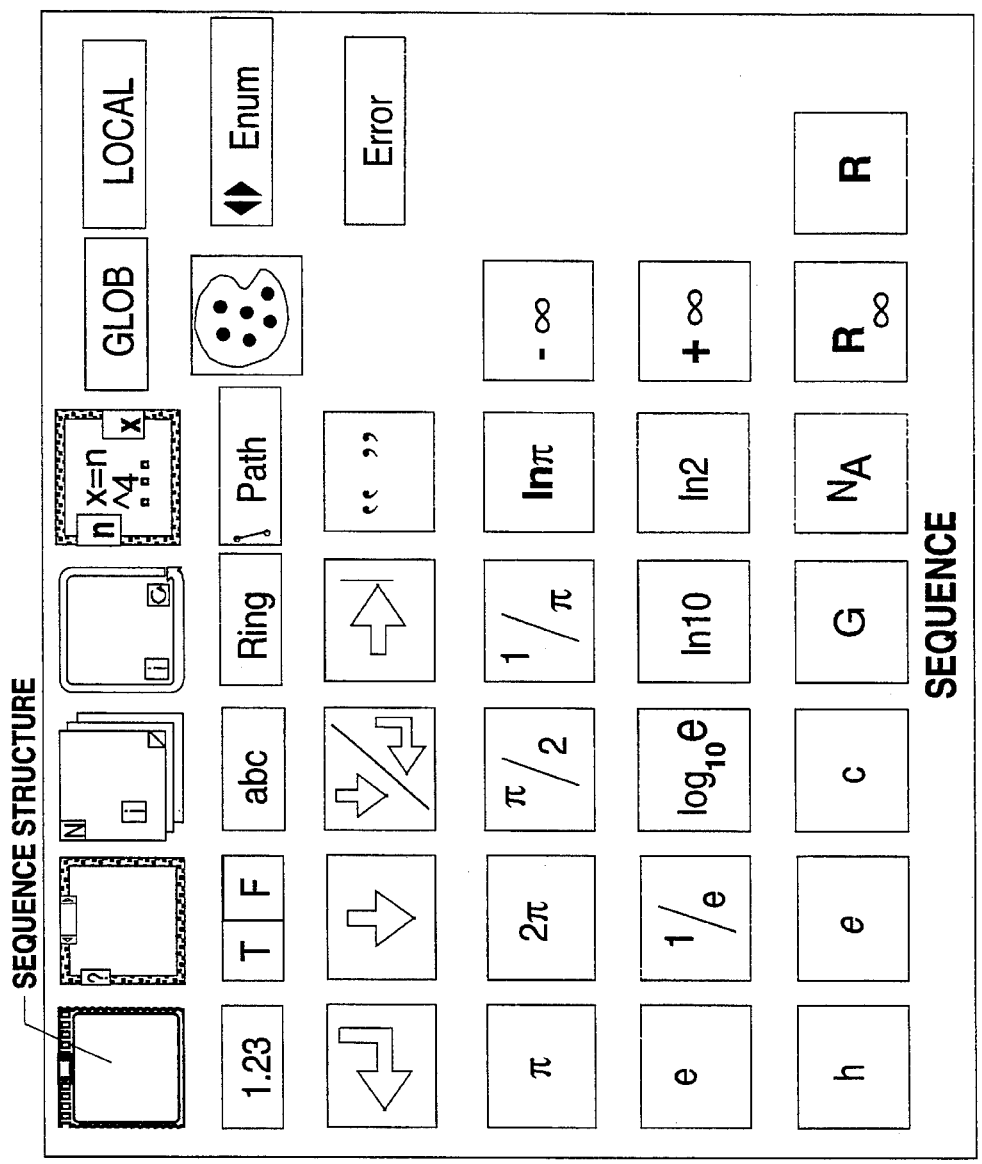
FIG. 105 illustrates a sequence structure selected from the Structs and Constants menu palette of the Functions Menu.

Referring now to FIG. 105, the Sequence Structure is placed on the block diagram by selecting it from the Structs & Constants palette of the Functions menu (FIG. 71). As shown in FIG. 106, the Sequence Structure looks like a frame of film, and it operates to execute diagrams sequentially. In conventional text-based languages, the program statements execute in the order in which they appear. In contrast, in data flow programming a node executes when data is available at all of the node inputs. However, sometimes it is necessary to ensure that one node is executed before another. The Sequence Structure is a method of controlling the order in which nodes execute. The diagram to be executed first is placed inside the border of Frame 0, the diagram to be executed second is placed inside the border of Frame 1, and so on. As with the Case Structure, only one frame is visible at a time.

Sequence Locals

Sequence locals are variables that pass data between frames of a Sequence structure. Sequence locals can be created on the border of a frame. the data wired to a frame sequence local is then available in subsequent frames. The data, however, is not available in frames preceding the frame in which the sequence local was created.

The example illustrated in FIG. 107 shows a three-frame Sequence structure. A sequence local in Frame 1 passes the value that the Tick Count (ms) function returns. (The Tick Count (ms) function returns the number of milliseconds that have elapsed since power on.) Note that this value is available in Frame 2 (as the arrow pointing into Frame 2 indicates). Also note that the VI displays only one sequence frame at a time.

Formula Node

Figure 108:
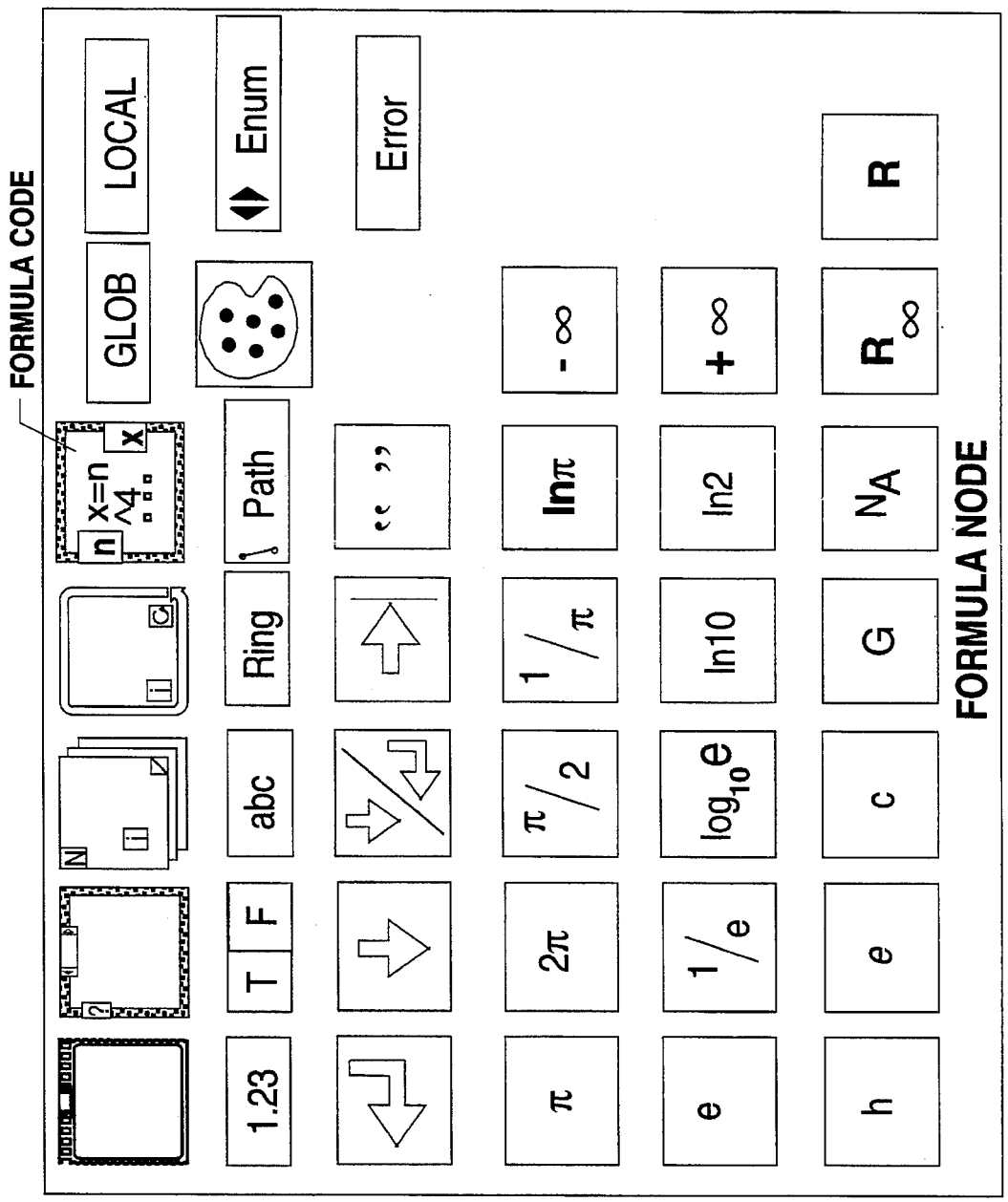
FIG. 108 illustrates a formula node selected from the structs and constants palette of the functions menu.
Figure 109:
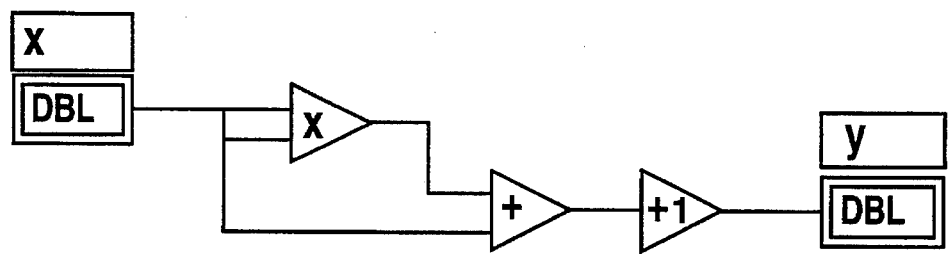
FIG. 109 illustrates an equation implemented using arithmetic functions.
Figure 110:
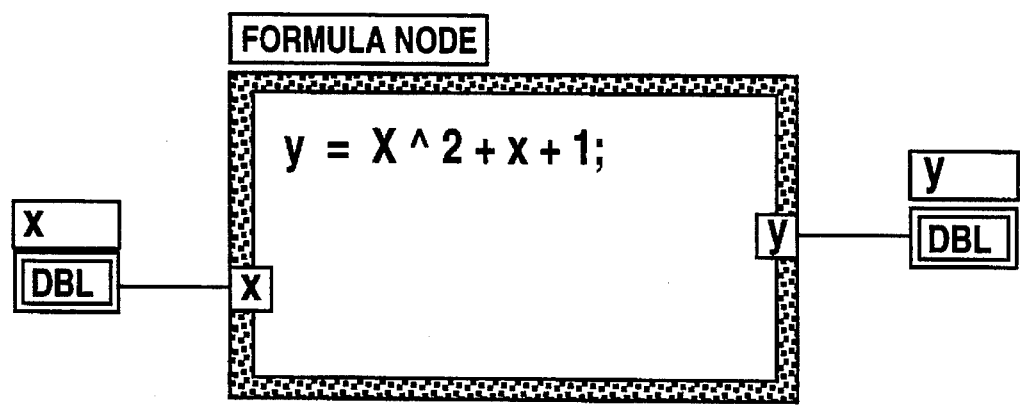
FIG. 110 illustrates the same equation implemented using a formula node.

Referring now to FIG. 108, the Formula Node is placed on the block diagram by selecting it from the Structs & Constants palette of the Functions menu (FIG. 71). The Formula Node is a resizable box that is used to enter algebraic formulas directly into the block diagram. This feature is extremely useful when the function equation has many variables or is otherwise complicated. For example, consider the equation $y=x^2+x+1$. If this equation is implemented using regular arithmetic functions, the block diagram appears like that shown in FIG. 109. The same equation can be implemented using a Formula Node, as shown in FIG. 110.

With the Formula Node, the user can directly enter a complicated formula, or formulas, in lieu of creating block diagram subsections. The input and output terminals of the Formula Node are created by popping up on the border of the node and choosing Add Input (Add Output) from the pop-up menu. The formula or formulas are entered inside the box. Each formula statement must terminate with a semicolon (;).

Waveform Charts

The waveform chart is a special numeric indicator that displays one or more plots. The waveform chart is in the Graph palette of the Controls menu. Waveform charts may display single or multiple traces. An example of a multiple-plot waveform chart is shown in FIG. 111.

As shown in FIG. 112, the waveform chart has three update modes—strip chart, scope chart, and sweep chart. The update mode can be selected by popping up on the waveform chart and choosing one of the options from the Data Operation Update Mode menu. (In the run mode, Update Mode from the chart pop-up menu is selected.)

The strip chart has a scrolling display similar to a paper strip chart. The scope chart and the sweep chart have retracing displays similar to an oscilloscope. Because there is less overhead in retracing a plot, the scope chart and the sweep chart are significantly faster than the strip chart in displaying plots. On the scope chart, when the plot reaches the right border of the plotting area, the plot is erased, and plotting begins again from the left border. The sweep chart acts much like the scope chart, but the display does not blank when the data reaches the right border. Instead, a moving vertical line marks the beginning of new data and moves across the display as new data is added.

Wiring a Single-Plot Chart

A scalar output can be directly wired to a waveform chart. The data type displayed in the waveforms chart's terminal icon matches the input type, as shown in FIG. 113.

Wiring a Multiple-Plot Chart

Waveform charts can accommodate more than one plot. The data must be bundled together using the Bundle function (Array & Cluster menu). As shown in FIG. 114, the Bundle function "bundles" or groups the output of the three different VIs that acquire temperature for plotting on the waveform chart. It is noted that the waveform chart terminal icon changes. To add more plots, the number of Bundle function input terminals are increased by resizing the Bundle function using the Positioning tool.

IMPROVED FUNCTION SYNCHRONIZATION OF THE PRESENT INVENTION

As described in the background section, in the system and method described in Kodosky et al, a situation often arose where it was necessary for two functions to be executing in parallel where one function required data from the other. For example, assume a situation where two functions, such as iteration loops, are running concurrently, and one function is waiting on a result from the other before it can continue. In the prior art, the common method was to require the first function to continually poll the second function to determine when the second function has completed and has produced the result desired for the first function. This results in a large amount of execution overhead in that the first function must continually monitor and check a register or memory location associated with the second function to determine when the second function has completed. In the preferred embodiment of the present invention, the first function is not required to poll the second function, but rather the second function notifies the execution subsystem when it completes its result. The execution subsystem then "wakes up" the first function, which then proceeds.

Figure 115:
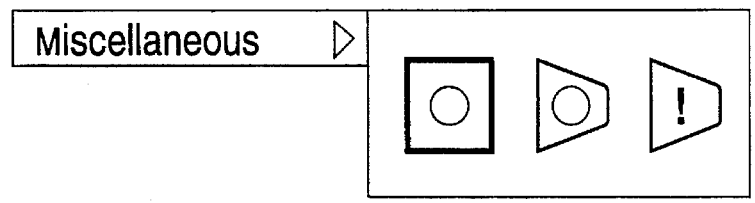
FIG. 115 illustrates selection of various occurrence icons from the Miscellaneous menu.

Referring now to FIG. 115, the occurrence function of the present invention is implemented using one or more of a collection of three separate icons. These icons from left to right are referred to as Generate Occurrence, Wait on Occurrence, and Set Occurrence.

Figure 116:
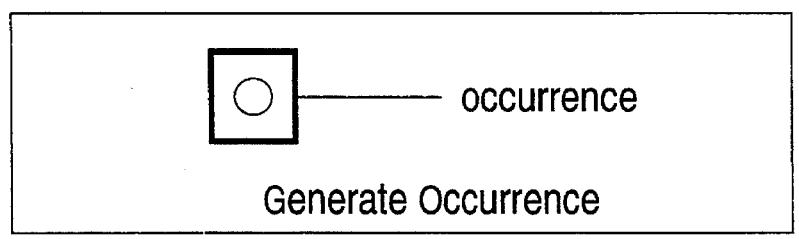
FIG. 116 illustrates a Generate Occurrence icon.

Referring now to FIG. 116, the Generate Occurrence node includes an occurrence output which is used to pass identifier values linking one or more Set Occurrence nodes and one or more Wait on Occurrence nodes, i.e., linking multiple sources and destinations.

Figure 117:
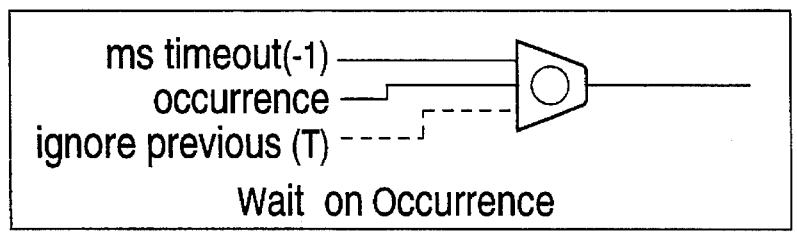
FIG. 117 illustrates a Wait on Occurrence icon.
Figure 118:
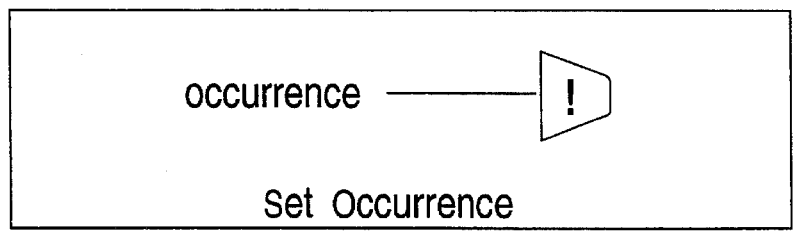
FIG. 118 illustrates a Set Occurrence icon.

Referring now to FIG. 117, the Wait on Occurrence node is associated with a first function that is waiting on an occurrence to be triggered, an example of an occurrence being a second function producing a result. The Wait on Occurrence node waits for the given occurrence to be triggered, typically by a Set Occurrence node (FIG. 118). However, it is noted that other devices or nodes may be used to set occurrences as desired. For example, a code interface node can include code which sets an occurrence.

As shown in FIG. 117, the Wait on Occurrence node includes three inputs referred to as "ms timeout", "occurrence", and "ignore previous". The occurrence input is typically connected to the occurrence output of a Generate Occurrence node. The "ms timeout" input is used to set a value for a timeout. If the occurrence does not occur within the specified timeout, measured in milliseconds, the function returns a value of TRUE. If the timeout input is set to −1, the function does not timeout, but rather waits for the occurrence to occur. If ignore previous is TRUE, and another node, or function has set the occurrence before the Wait on Occurrence began, i.e., before the function began executing, then the function ignores the previous occurrence and waits for another one. If ignore previous is FALSE, the function triggers immediately if the occurrence was set since the last time this function waited on the incoming occurrence. In other words, this function "remembers" only the previous occurrence it waited on. If ignore previous is FALSE, and this function is presented with an occurrence it does not recognize, i.e., an occurrence that is not the same as the previous occurrence, and the occurrence has never been set, the function triggers immediately. Since the Wait on Occurrence node does not know when the occurrence was last set, the node does not wait.

The Wait on Occurrence node further includes an output which is coupled to nodes or function icons that are required to wait for the occurrence to occur. Nodes or diagrams which receive the output from the Wait on Occurrence icon cannot begin until that output has been received. The Wait on Occurrence node does not generate this output until the occurrence is triggered.

Referring now to FIG. 118, the Set Occurrence node is associated with a function producing a result and is one method used to trigger the occurrence. The Set Occurrence node receives as an input the occurrence output generated by the Generate Occurrence node.

In the preferred embodiment, occurrences are built into the block diagram before execution of the functions which are desired to be synchronized. The function that has a Set Occurrence function is one that is producing data, and the function sets the occurrence when the data is available. At that point any portion of the diagram that is waiting on a Wait on Occurrence icon is triggered, i.e., is woken up or restarted.

Occurrence Memory Organization

Figure 119:
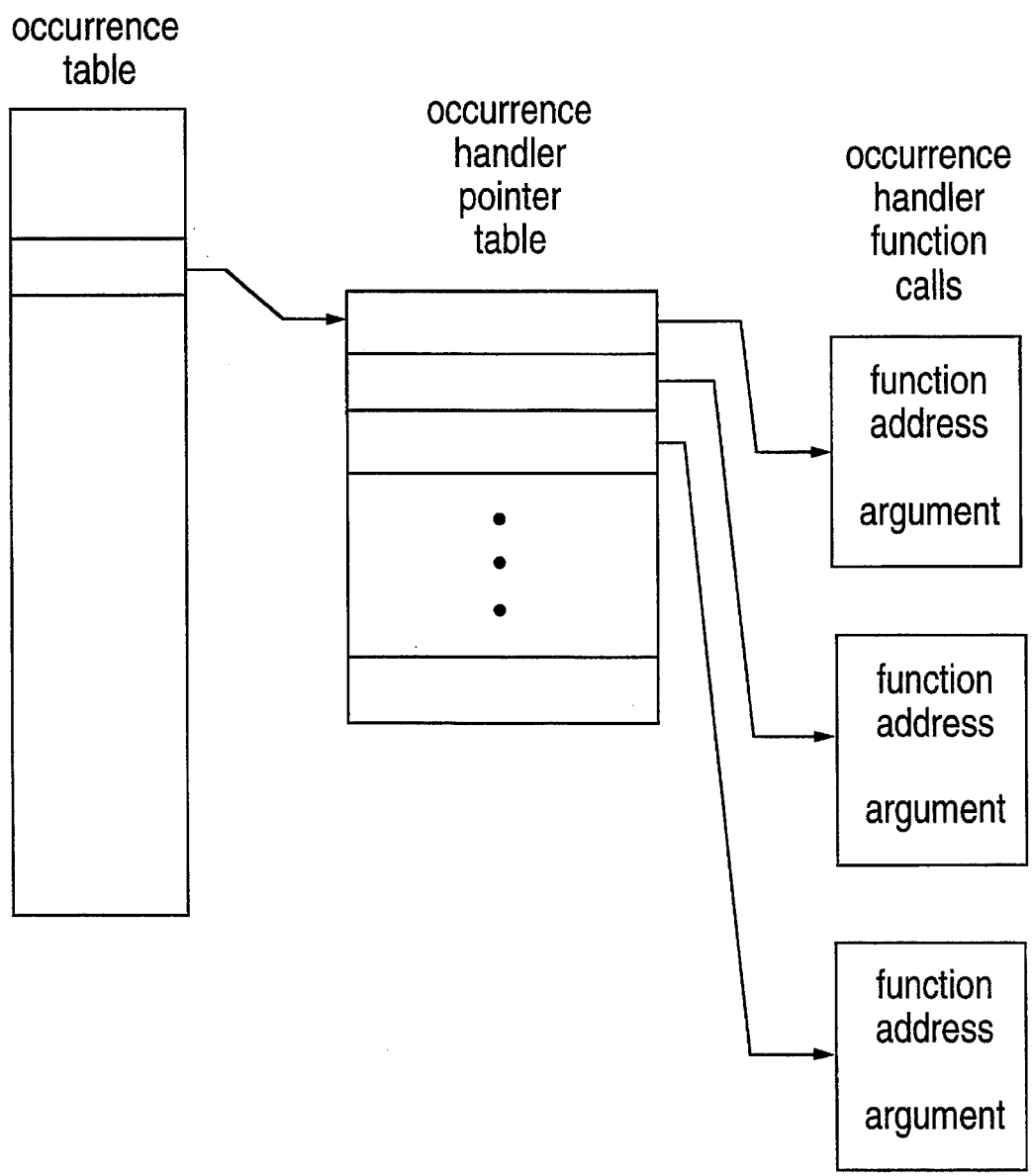
FIG. 119 illustrates the memory organization of occurrences according to the preferred embodiment.

Referring now to FIG. 119, a diagram illustrating the manner in which occurrences are implemented in memory is shown. As shown, the present invention includes an occurrence table which includes a number of occurrence entries corresponding to Generate Occurrence nodes on the block diagram. It is also noted that other asynchronous nodes are placed on the occurrence table.

When a Wait on Occurrence node is encountered during run time, i.e., when the inputs to the Wait on Occurrence node arrive at run time, the execution subsystem indexes into the occurrence table using the occurrence identifier. As previously noted, the occurrence identifier is the output of the respective Generate Occurrence node that is connected to the Wait on Occurrence node.

The subsystem indexes to the proper entry, which comprises a pointer, and uses that entry to access an occurrence handler pointer table having one or more entries. The occurrence handler pointer table comprises all the nodes that desire to be identified and called when the respective occurrence is set. At this time, a new entry is created for the respective Wait on Occurrence node, and the node is said to be "armed." As shown in FIG. 119, each entry in the occurrence handler pointer table points to a respective occurrence handler function call. Each occurrence handler function call includes the beginning address of an occurrence handler function which restarts operation of the Wait on Occurrence node when the respective occurrence occurs or is "triggered." Thus, the occurrence handler function call calls a function whose job it is to requeue the Wait on Occurrence node on the run queue when the occurrence is triggered. Each occurrence function call also includes a respective argument which informs the function as to which Wait on Occurrence node is to be requeued. This argument is provided to the occurrence handler function call at compile time.

When the Set Occurrence node triggers the respective occurrence, the occurrence identifier output from the respective Generate Occurrence node and provided to the input of the Set Occurrence node is used to index into the occurrence table. The respective entry is used to access the respective occurrence handler pointer table. Each entry in this table then calls the respective occurrence handler function calls. These calls in turn invoke the respective occurrence handler functions which replace the respective Wait on Occurrence node(s) on the run queue. Every occurrence handler associated with an entry in the occurrence handler pointer table is executed consecutively to enqueue the respective Wait on Occurrence nodes on the run queue. It is also noted that an occurrence can be set by a code interface node having respective code that essentially accomplishes the code associated with a Set Occurrence node.

Occurrence Operation

When a compiled block diagram is first loaded into RAM, memory is allocated for an occurrence handler function call for each Wait on Occurrence node. The occurrence handler function includes all the information necessary to replace the Wait on Occurrence node on the run queue except the "trigger," i.,e. the occurrence that triggers the node.

The Wait on Occurrence node is an example of an asynchronous node, other examples being block diagram timer functions and device drivers. As previously discussed, an asynchronous node is a node which is required to wait on other functions to occur before it can execute. Referring back to FIGS. 9A–L, and more specifically to FIG. 9J, the execution of an asynchronous node is shown. As shown, when the Wait on Occurrence node is first entered, its starting point is 0 in step 460, and thus execution advances to step 462. In step 462 the node's starting point is set to 1.

In step 464 the execution subsystem attaches the occurrence handler to the incoming argument, which is almost always the occurrence output from a Generate Occurrence node. This means that an entry is placed on the occurrence handler pointer table. As previously discussed, an occurrence handler function call is essentially a data structure containing a pointer to a function and an argument. The occurrence handler function call is said to be armed at this time. The occurrence handler function call invokes an occurrence handler function that asynchronously enqueues this node after the Set Occurrence function has triggered an occurrence. Also at this time a timer is begun depending on the ms timeout input of the Wait on Occurrence node. In step 466 node complete is set to false and in step 468 the desire to be requeued is set to false.

The Set Occurrence node is an example of a simple node which indexes into the occurrence table to access the pointers in the occurrence handler pointer table. As previously discussed, these entries or pointers point to respective occurrence handler function calls which in turn invoke occurrence handler functions. If one of these occurrence handler functions is associated with a Wait on Occurrence node, that Wait on Occurrence node is rescheduled on the run queue. Thus, when an occurrence is set, all attached handlers are called if they are armed. It is also noted that a handler may time out before and independently of the occurrence being set. When a handler is called, it becomes inactive until it is re-armed.

Thus the purpose of a Set Occurrence node is to trigger an occurrence. An occurrence may be one that is being waited for by a Wait on Occurrence node, but this may not necessarily be the case. In other words, the Set Occurrence and Wait on Occurrence functions are two separate functions. Occurrences may also be set for other activities where it is desirable that these activities not waste CPU time waiting for occurrence to be triggered.

The Wait on Occurrence node will not complete it execution until such time as the occurrence that has bee given is triggered by a Set Occurrence node. During the time between when the Wait on Occurrence node is first encountered and placed on the run queue and when it is replaced on the run queue, the node is inactive. A node that is connected to the output of the Wait on Occurrence node is also waiting on the occurrence before it can resume execution.

Thus the diagram in which the Wait on Occurrence node is comprised is inactive and thus does not consume any CPU time. Therefore, instead of requiring this diagram to continually poll for the occurrence to happen, wasting CPU time, the use of occurrences according to the present invention notifies the Wait on Occurrence node in the diagram when the occurrence occurs.

EXAMPLE

Figure 120:
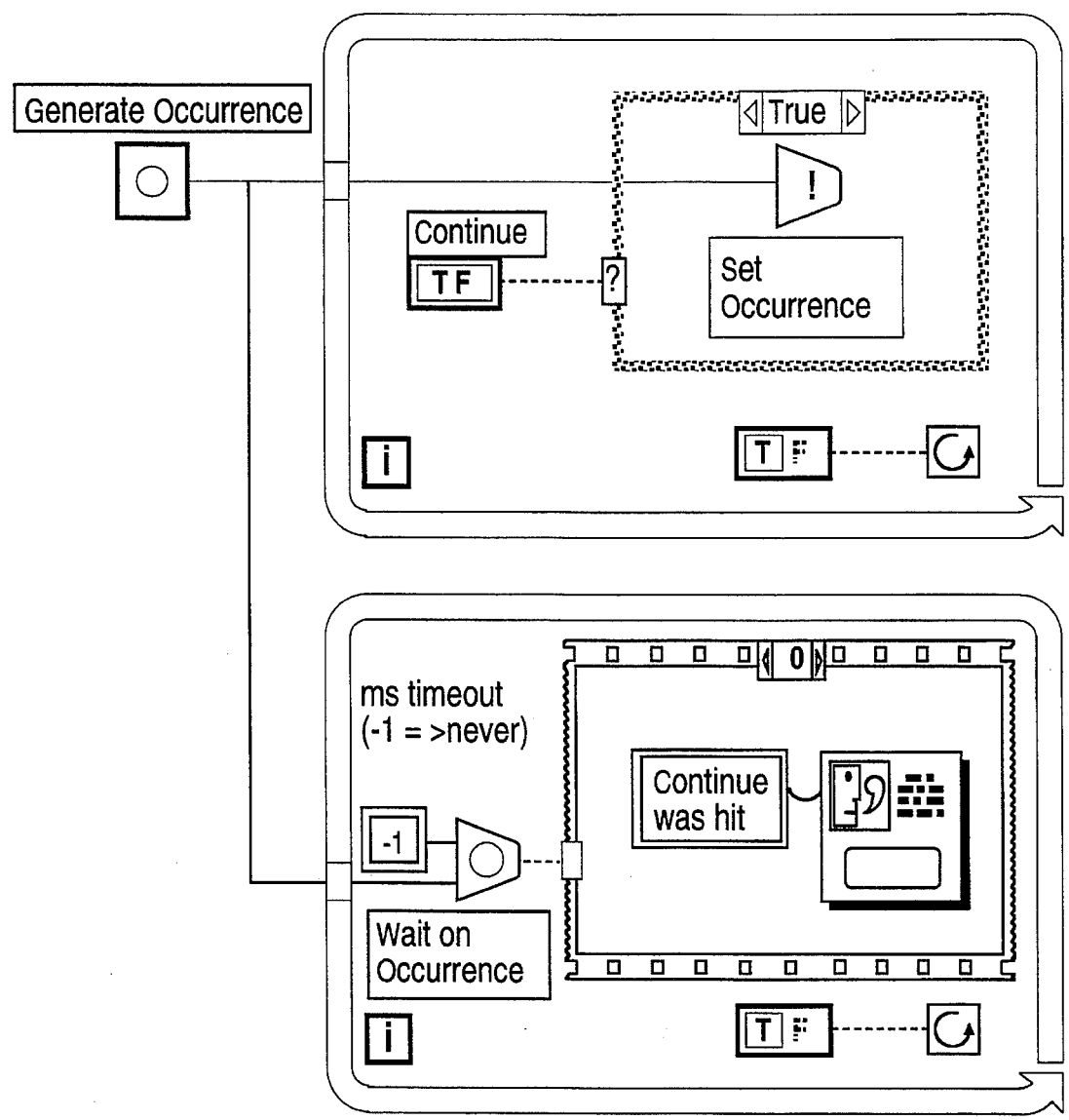
FIGS. 120–122 are examples illustrating use of the occurrence feature of the present invention.

Referring now to FIG. 120, a block diagram illustrating operation of the occurrence function of the present invention is shown. The block diagram in this example includes two loops set to execute in parallel. The top loop includes a case structure diagram which includes a Set Occurrence node, as shown. The input of the Set Occurrence icon receives a wire from the Generate Occurrence icon, as shown.

The bottom loop includes a sequence structure diagram having a singe frame, frame 0. The lower loop also includes a Wait on Occurrence icon whose occurrence input receives a wire from the Generate Occurrence icon. The ms timeout receives a −1 value and the ignore previous input is not connected.

In this example, each diagram is waiting for a continue button to be hit before proceeding with operations. In prior art embodiment, each diagram would have to continually poll the button to determine when the button was hit. However, in FIG. 120 occurrences are used according to the present invention so that only one loop, the top loop having the Set Occurrence node, is required to poll the button. The bottom loop is not required to poll.

Data Acquisition Example

Figure 121:
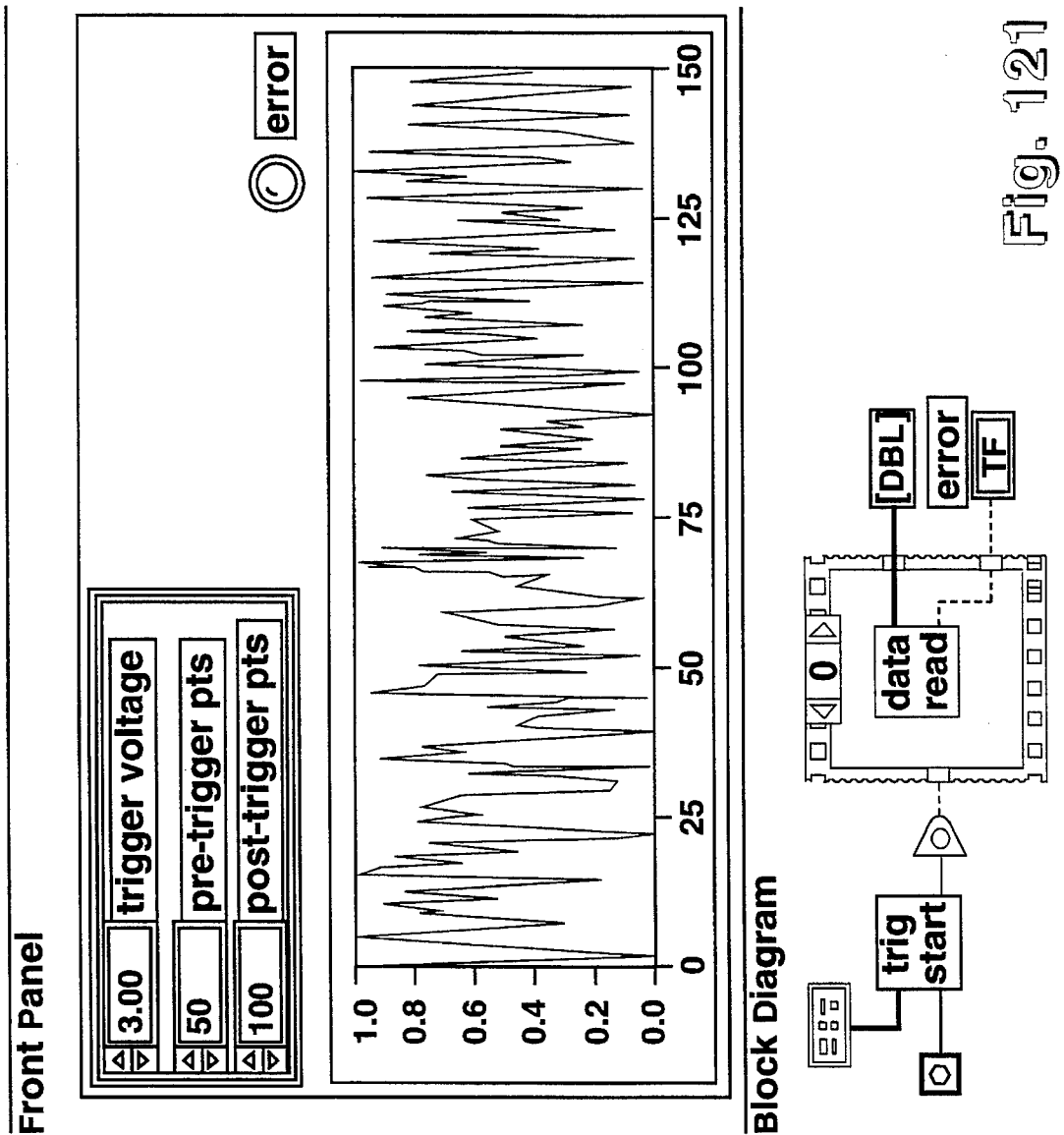

Referring now to FIG. 121, a block diagram of a data acquisition VI is shown. The VI includes a front panel control having "trigger voltage", "pre-trigger pts", and "post-trigger pts" as inputs. The front panel also includes a waveform chart, as shown. The block diagram is comprised of three parts: set up for acquisition, wait for acquisition to finish, and read data.

The setup is accomplished by the "trig start" VI. The trig start VI receives an occurrence output from a Generate Occurrence node. The Generate Occurrence node is typically connected to a respective Set Occurrence node, although in this example the occurrence is preferably set by a code interface node generated by data acquisition software. The trig start VI also receives setup information as input from the control on the front panel. The setup information in this example is a trigger voltage and the number of pre- and post-trigger points to acquire. The trig start VI produces the occurrence received from the Generate Occurrence node as an output. This output is connected to a Wait on Occurrence node which in turn has an output connected to the sequence structure frame, as shown.

The wait for the acquisition to finish portion of the block diagram is accomplished by the Wait for Occurrence primitive. This node suspends operation until the occurrence is set. When the acquisition is finished, the occurrence is set by data acquisition software embodied in a code interface node. After the occurrence is set the data is available and can be read. The data is read by the "data read" VI and sent out to be used by other logic.

Producer Consumer Example

Figure 122:
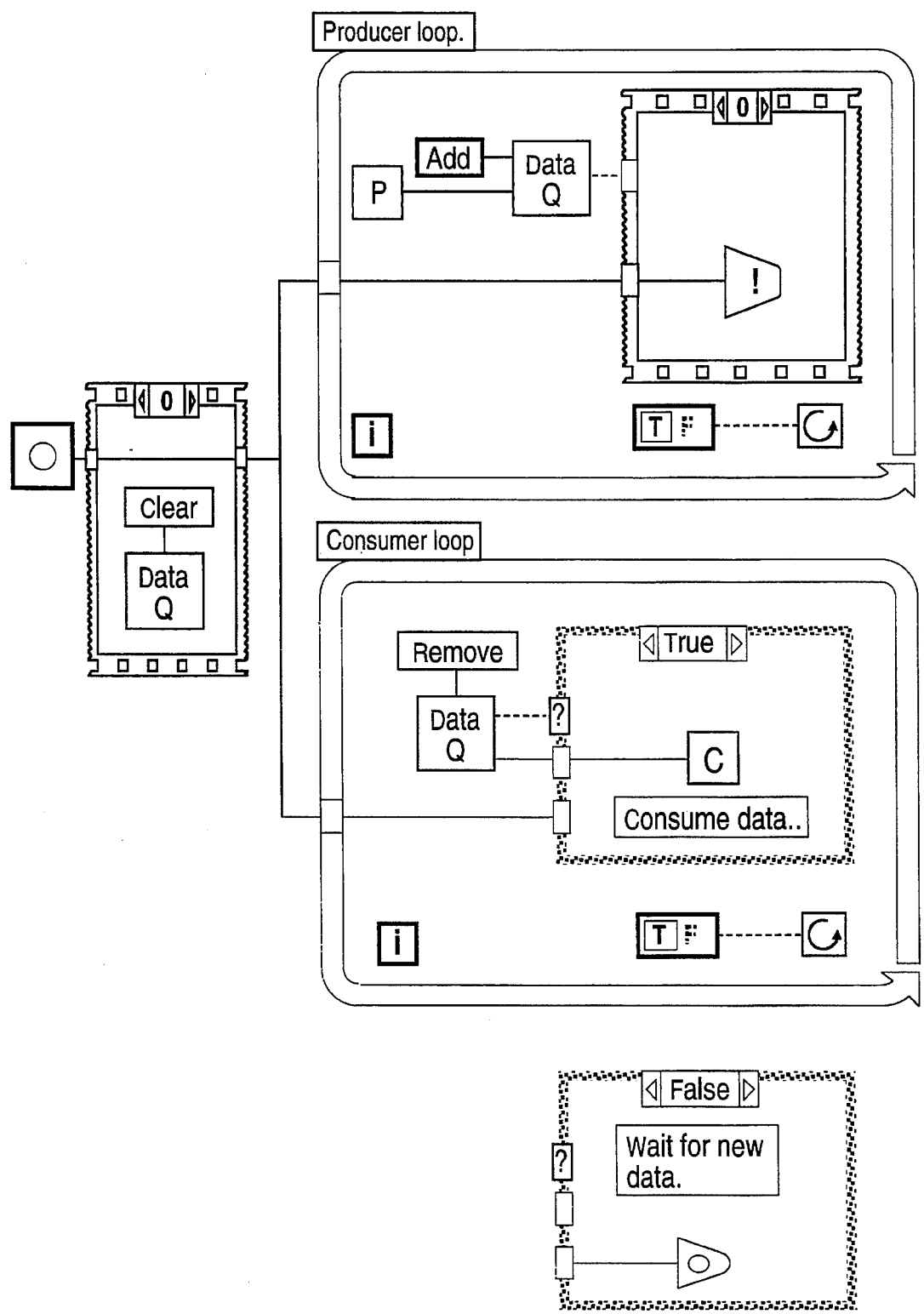

Referring now to FIG. 122, a block diagram having two independent while loops is shown. The top loop, referred to as the Producer loop, produces data, and the bottom loop, referred to as the consumer loop, consumes data. The Producer loop includes a producer VI, referred to as P, connected to a Data Q (queue) VI. An Add node also connects to the Data Q VI. The output of the Data Q VI connects to frame 0 of a sequence structure within the Producer loop. The sequence structure includes a Set Occurrence node, as shown. The Consumer loop includes a copy of the Data Q VI which is connected to a Remove node. The Data Q VI also connects to the True frame of a case structure. The True frame includes a Consumer VI referred to as "C".

The Producer and Consumer loops are connected by a queue that holds produced data that has not yet been consumed. This queue is initialized by a sequence structure having frame 0 which is positioned outside of the Producer and Consumer loops. The sequence structure includes a Clear node connected to a copy of the Data Q VI, as shown. A Generate Occurrence node is connected to the left side of the sequence structure. This wire passes through the sequence structure out the right side of the structure and connects to each of the loops, as shown. The wire connects to the Set Occurrence node in the Producer loop. The wire connects to a Wait on Occurrence node in the False frame of the case structure.

This VI begins with the data queue being cleared before the two loops begin. The data queue is accessed by the Data Q VI. The caller can clear, add, or remove data from the queue. The Data Q VI enforces synchronous access to the data queue.

The producer loop creates data for the consumer loop to use. Data is produced by the producer VI, referred to as P, and is added to the data queue. Then the occurrence given to the loop is set. The reason for this is given below.

The consumer loop uses data created by the producer loop. First, the consumer loop attempts to remove a piece of data from the data queue. If successful, the consumer VI (C) then operates on the data. If the queue is empty, the loop suspends, waiting for the given occurrence to be set. The producer loop sets the occurrence every time it adds a piece of data to the data queue. The consumer loop resumes operation after new data is placed on the data queue.

We claim:

1. A method for programming a computer system including a CPU which executes functions, a video display screen and means for creating a data flow diagram, the method comprising the computer-implemented steps of:

displaying on the screen a first input terminal icon, wherein said first input terminal icon references a first input variable;

displaying on the screen a first output terminal icon, wherein said first output terminal icon references a first output variable;

displaying on the screen a first function icon, wherein said first function icon controls a first function, wherein said first function icon generates first data;

displaying on the screen a second input terminal icon, wherein said second input terminal icon references a second input variable;

displaying on the screen a second output terminal icon, wherein said second output terminal icon references a second output variable;

displaying on the screen a second function icon, wherein said second function icon controls a second function, wherein said second function icon requires said first data from said first function icon before beginning operation;

displaying on the screen a set occurrence icon, wherein said set occurrence icon is associated with said first function icon;

displaying on the screen a wait on occurrence icon, wherein said wait on occurrence icon is associated with said second function icon;

assembling on the screen a first data flow diagram including said first input terminal icon, said first output terminal icon, said first function icon, and said set occurrence icon, wherein the first data flow diagram displays a procedure for producing at least one value for said first output terminal icon from at least one value for said first input terminal icon;

assembling on the screen a second data flow diagram including said second input terminal icon, said second output terminal icon, said second function icon, and said wait on occurrence icon, wherein said wait on occurrence icon includes an output coupled to said second function icon, wherein the second data flow diagram displays a procedure for producing at least one value for said second output terminal icon from at least one value for said second input terminal icon;

wherein said set occurrence icon in said first data flow diagram triggers an occurrence when said first function icon generates said first data;

wherein said wait on occurrence icon in said second data flow diagram generates said output to said second function icon when said first data is generated and said occurrence is triggered;

wherein said second function icon in said second data flow diagram begins operation when said wait on occurrence icon output is received; and wherein said second function icon in said second data flow diagram does not require any CPU time until said first function icon in said first data flow diagram generates said first data.

2. The method of claim 1, further comprising: executing said first and second data flow diagrams, wherein said executing comprises:

propagating inputs to said wait on occurrence icon;

beginning execution of said wait on occurrence icon after said propagating;

halting execution of said wait on occurrence icon after said beginning execution;

said first function icon generating said first data after said halting execution;

completing execution of said wait on occurrence icon after said generating said first data, wherein said wait on occurrence icon provides said wait on occurrence output to said second function icon; and beginning execution of said second function icon after completing execution of said wait on occurrence icon.

3. The method of claim 2, wherein said beginning execution of said wait on occurrence icon includes generating an occurrence handler which restarts execution of said wait on occurrence icon when said first function icon generates said first data.

4. The method of claim 2, wherein said wait on occurrence icon includes a timeout control means which counts a preset period of time, the method further comprising:

said wait on occurrence icon beginning said timeout control means during said beginning execution of said wait on occurrence icon;

said timeout control means counting out said preset period of time;

completing execution of said wait on occurrence icon after said timeout control means counts out said preset period of time, wherein said wait on occurrence icon provides said wait on occurrence output to said second function icon;

beginning execution of said second function icon after completing execution of said wait on occurrence icon.

5. The method of claim 4, wherein said wait on occurrence icon includes an input receiving a timeout value; and wherein said timeout control means counts out said timeout value.

6. The method of claim 1, further comprising:

displaying on the screen a generate occurrence icon including an output which provides an occurrence identifier value to an input of said set occurrence icon and provides said occurrence identifier value to an input of said wait on occurrence icon, wherein said occurrence identifier value is used to activate said wait on occurrence icon when said occurrence is triggered.

7. The method of claim 1, further comprising: executing said first and second data flow diagrams, wherein said executing comprises:

propagating inputs to said wait on occurrence icon;

beginning execution of said wait on occurrence icon after said propagating;

halting execution of said wait on occurrence icon after said beginning execution;

said first function icon generating said first data after said halting execution;

said set occurrence icon triggering said occurrence after said generating said first data;

completing execution of said wait on occurrence icon after said triggering said occurrence, wherein said wait on occurrence icon provides said wait on occurrence output to said second function icon; and beginning execution of said second function icon after said completing execution of said wait on occurrence icon.

8. The method of claim 7, wherein said wait on occurrence icon includes an ignore previous input which receives a value directing said wait on occurrence icon to ignore an occurrence, the method further comprising:

a third function icon setting an occurrence prior to said propagating inputs to said wait on occurrence icon;

said wait on occurrence icon ignoring said prior occurrence.

9. The method of claim 1, wherein said wait on occurrence icon is comprised within said second function icon.

10. The method of claim 1, wherein said set occurrence icon is comprised within said first function icon.

11. The method of claim 1, wherein said first and second function icons comprise loop function icons.

12. A system which provides increased efficiency in synchronizing separate activities in a data flow diagram, comprising:

a video screen;

means for displaying on the screen a first input terminal icon, wherein said first input terminal icon references a first input variable;

means for displaying on the screen a first output terminal icon, wherein said first output terminal references a first output variable;

means for displaying on the screen a first function icon, wherein said first function icon controls a first function, wherein said first function icon generates first data;

means for displaying on the screen a second input terminal icon, wherein said second input terminal icon references a second input variable;

means for displaying on the screen a second output terminal icon, wherein said second output terminal references a second output variable;

means for displaying on the screen a second function icon, wherein said second function icon controls a second function, wherein said second function icon requires said first data from said first function icon before beginning operation;

means for displaying on the screen a set occurrence icon, wherein said set occurrence icon is associated with said first function icon that triggers an occurrence when said first data is generated;

means for displaying on the screen a wait on occurrence icon, wherein said wait on occurrence icon is associated with said second function icon, wherein said wait on occurrence icon activates said second function icon when said first function icon generates said first data; and means for assembling on the screen a first data flow diagram including said first input terminal icon, said first output terminal icon, said first function icon, and said set occurrence icon, wherein the first data flow diagram displays a procedure for producing at least one value for said first output terminal icon from at least one value for said first input terminal icon;

means for assembling on the screen a second data flow diagram including said second input terminal icon, said second output terminal icon, said second function icon, and said wait on occurrence icon, wherein said wait on occurrence icon includes an output coupled to said second function icon, wherein the second data flow diagram displays a procedure for producing at least one value for said second output terminal icon from at least one value for said second input terminal icon;

wherein said set occurrence icon in said first data flow diagram triggers an occurrence when said first function icon generates said first data;

wherein said wait on occurrence icon in said second data flow diagram generates said output to said second function icon when said first data is generated and said occurrence is triggered;

wherein said second function icon begins operation when said wait on occurrence icon output is received; and wherein said second function icon does not require any CPU time until said first function icon generates said first data.

13. The system of claim 12, wherein said first function icon is not connected to said second function icon.

* * * * *